United States Patent
Hunter et al.

(10) Patent No.: US 10,564,668 B2
(45) Date of Patent: *Feb. 18, 2020

(54) SYSTEMS AND METHODS FOR SCREEN COLOR TEMPERATURE CONTROL USING RGBW FRONT LIGHT

(71) Applicant: RAKUTEN KOBO, INC., Toronto (CA)

(72) Inventors: Trevor Hunter, Toronto (CA); Matt Clements, Oshawa (CA); George Talusan, Toronto (CA); Paul McDougall, Toronto (CA); William Chaban, Toronto (CA); Zheng Xu, Thornhill (CA); Steve Li, Richmond Hill (CA); Jeffrey Ng Thow Hing, Toronto (CA)

(73) Assignee: RAKUTEN KOBO, INC., Toronto (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/678,734

(22) Filed: Aug. 16, 2017

(65) Prior Publication Data

US 2018/0053486 A1 Feb. 22, 2018

Related U.S. Application Data

(60) Provisional application No. 62/375,745, filed on Aug. 16, 2016.

(51) Int. Cl.
*G06F 1/16* (2006.01)
*H04M 1/18* (2006.01)
(Continued)

(52) U.S. Cl.
CPC ............ *G06F 1/1626* (2013.01); *A45C 11/00* (2013.01); *A45C 13/1069* (2013.01); *A45F 5/00* (2013.01);
(Continued)

(58) Field of Classification Search
CPC ...... G09G 5/02; G09G 5/10; G09G 2360/144; G09G 2380/14; G09G 2320/0666; G09G 2354/00

See application file for complete search history.

(56) References Cited

U.S. PATENT DOCUMENTS 6,337,675 B1   1/2002 Toffolo et al.
6,445,505 B1 * 9/2002 Morgan .................. G09G 3/34
                                                     348/742

(Continued)

OTHER PUBLICATIONS

Apple, "Adjust the Display Settings on Your iPhone, iPad, or iPod Touch", URL: https://support.apple.com/en-in/HT202613, 2 Pages total, (May 10, 2016).

(Continued)

*Primary Examiner* — Shaheda A Abdin
(74) *Attorney, Agent, or Firm* — Xsensus LLP

(57) ABSTRACT

An electronic reading device includes an adjustable RGBW front light and an ambient light sensor. Additionally, the electronic reading device includes circuitry configured to receive a signal corresponding to a brightness level from the ambient light sensor, receive a signal corresponding to a current screen color temperature, calculate a predetermined mixture of light based on at least one of the brightness level or the current screen color temperature, Wherein the calculation allows the current screen color temperature to remain the same regardless of the brightness level, and display the predetermined mixture of light via the adjustable RGBW front light.

16 Claims, 39 Drawing Sheets

(51) Int. Cl.
| | |
|---|---|
| H05B 33/08 | (2006.01) |
| G09G 5/02 | (2006.01) |
| H05B 37/02 | (2006.01) |
| G09G 5/10 | (2006.01) |
| F21V 3/00 | (2015.01) |
| H05K 5/00 | (2006.01) |
| H05K 7/18 | (2006.01) |
| G09G 3/34 | (2006.01) |
| A45C 11/00 | (2006.01) |
| A45C 13/10 | (2006.01) |
| A45F 5/00 | (2006.01) |
| G06F 1/3296 | (2019.01) |
| F21V 23/00 | (2015.01) |
| F21V 33/00 | (2006.01) |
| G02F 1/1333 | (2006.01) |
| G06F 1/20 | (2006.01) |
| H01H 13/83 | (2006.01) |
| H01Q 1/22 | (2006.01) |
| H04M 1/02 | (2006.01) |
| H04M 1/04 | (2006.01) |
| H05K 7/14 | (2006.01) |
| F21Y 115/10 | (2016.01) |
| G06F 3/041 | (2006.01) |
| G06F 3/0484 | (2013.01) |
| G06F 3/0488 | (2013.01) |
| F21W 111/10 | (2006.01) |

(52) U.S. Cl.
CPC .............. *F21V 3/00* (2013.01); *F21V 23/003* (2013.01); *F21V 33/0056* (2013.01); *G02F 1/133308* (2013.01); *G06F 1/1632* (2013.01); *G06F 1/1698* (2013.01); *G06F 1/203* (2013.01); *G06F 1/3296* (2013.01); *G09G 3/3413* (2013.01); *G09G 5/02* (2013.01); *G09G 5/10* (2013.01); *H01H 13/83* (2013.01); *H01Q 1/22* (2013.01); *H04M 1/0279* (2013.01); *H04M 1/04* (2013.01); *H04M 1/185* (2013.01); *H05B 33/0857* (2013.01); *H05B 33/0863* (2013.01); *H05B 33/0866* (2013.01); *H05B 33/0872* (2013.01); *H05B 37/0218* (2013.01); *H05B 37/0281* (2013.01); *H05K 5/0017* (2013.01); *H05K 7/1417* (2013.01); *H05K 7/18* (2013.01); *A45C 2011/002* (2013.01); *A45C 2011/003* (2013.01); *A45C 2200/15* (2013.01); *A45F 2200/0516* (2013.01); *F21W 2111/10* (2013.01); *F21Y 2115/10* (2016.08); *G06F 3/041* (2013.01); *G06F 3/0488* (2013.01); *G06F 3/04847* (2013.01); *G06F 2200/1633* (2013.01); *G06F 2200/1634* (2013.01); *G09G 2320/0626* (2013.01); *G09G 2320/0666* (2013.01); *G09G 2320/08* (2013.01); *G09G 2354/00* (2013.01); *G09G 2360/141* (2013.01); *G09G 2360/144* (2013.01); *G09G 2360/145* (2013.01); *G09G 2360/16* (2013.01); *G09G 2380/14* (2013.01); *H04M 1/0214* (2013.01); *H04M 1/0245* (2013.01)

(56) References Cited

U.S. PATENT DOCUMENTS

| | | |
|---|---|---|
| 8,749,478 B1 | 6/2014 | Bowen |
| 2010/0103200 A1* | 4/2010 | Langendijk ............... G09G 5/02 345/690 |
| 2011/0205259 A1* | 8/2011 | Hagood, IV ......... G09G 3/2003 345/690 |
| 2011/0206280 A1 | 8/2011 | Lee |
| 2015/0070337 A1 | 3/2015 | Bell et al. |
| 2015/0282277 A1 | 10/2015 | Lewis |

OTHER PUBLICATIONS

Twilight Application, "4 Apps to Manage Brightness and Save Your Eyes on Android", URL: http://www.makeuseof.com/tag/4-apps-to-manage-brightness-and-save-your-eyes-on-android/, 1 Page total, (Jun. 4, 2013).

Twilight Application, "Get a Good Night's Sleep by Filtering Your Phone's Blue Light", URL: http://www.makeuseof.com/tag/get-good-nights-sleep-filtering-phones-blue-light/, 1 Page total, (Oct. 5, 2015).

* cited by examiner

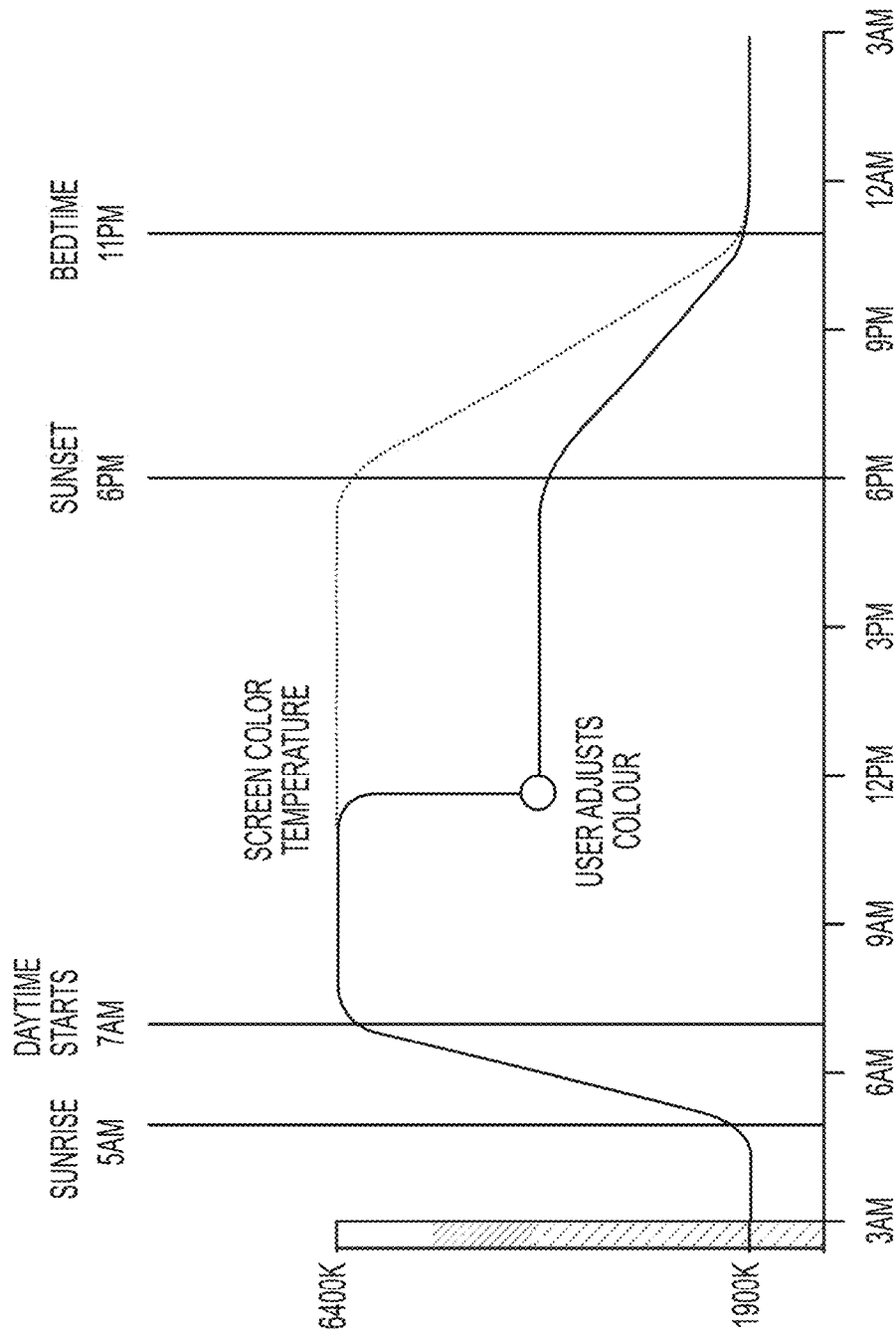

| BRIGHTNESS (%) / COLOUR TEMPERATURE | 1700K | 2000K | 2500K | 3000K | 4500K | 6500K |
|---|---|---|---|---|---|---|
| 100% | 90,30,0,0 | 80,30,0,20 | 70,30,0,50 | 40,40,0,65 | 20,20,0,80 | 0,0,0,100 |
| 90% | 80,25,0,0 | 75,25,0,18 | 65,28,0,45 | 37,35,0,60 | 15,8,0,75 | 0,0,0,90 |
| ... | ... | ... | ... | ... | ... | ... |

FIG. 20

SYSTEMS AND METHODS FOR SCREEN COLOR TEMPERATURE CONTROL USING RGBW FRONT LIGHT

CROSS-REFERENCE TO RELATED APPLICATION

This application claims the benefit of U.S. Provisional Application No. 62/375,745, filed Aug. 16, 2016. Related applications, U.S. application Ser. No. 14/231,143, U.S. application Ser. No. 14/231,396, U.S. Pat. Nos. 475,276, 475,274, 475,275, 475,280, 475,282, and 475,283 are herein incorporated by reference in their entirety.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

An electronic reader, also known as an e-reader device, is an electronic personal display that is used for reading electronic books (eBooks), electronic magazines, and other digital content. For example, digital content of an e-book is displayed as alphanumeric characters and/or graphic images on a display of an e-reader such that a user may read the digital content much in the same way as reading the analog content of a printed page in a paper-based book. An e-reader device provides a convenient format to store, transport, and view a large collection of digital content that would otherwise potentially take up a large volume of space in traditional paper format.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

According to aspects of the disclosed subject matter, an electronic reading device can include an adjustable RGBW front light, an ambient light sensor, and circuitry configured to receive a signal corresponding to a brightness level from the ambient light sensor, receive a signal corresponding to a current screen color temperature, calculate a predetermined mixture of light based on at least one of the brightness level or the current screen color temperature, wherein the calculation allows the current screen color temperature to remain the same regardless of the brightness level, and display the predetermined mixture of light via the adjustable RGBW front light.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 5A, 5B, and 5C depict exemplary bedtime selection GUIs and an energy saving GUI according to one or more aspects of the disclosed subject matter.

FIG. 15A depicts automated screen color temperature control in response to a user manually adjusting a screen color temperature during a daytime phase according to one or more aspects of the disclosed subject matter.

FIG. 20 depicts an exemplary table where a range of brightness levels can have corresponding RBGW values for a specific screen color temperature to display the screen color temperature consistently at any brightness level according to one or more aspects of the disclosed subject matter.

DETAILED DESCRIPTION

Figure 1A:
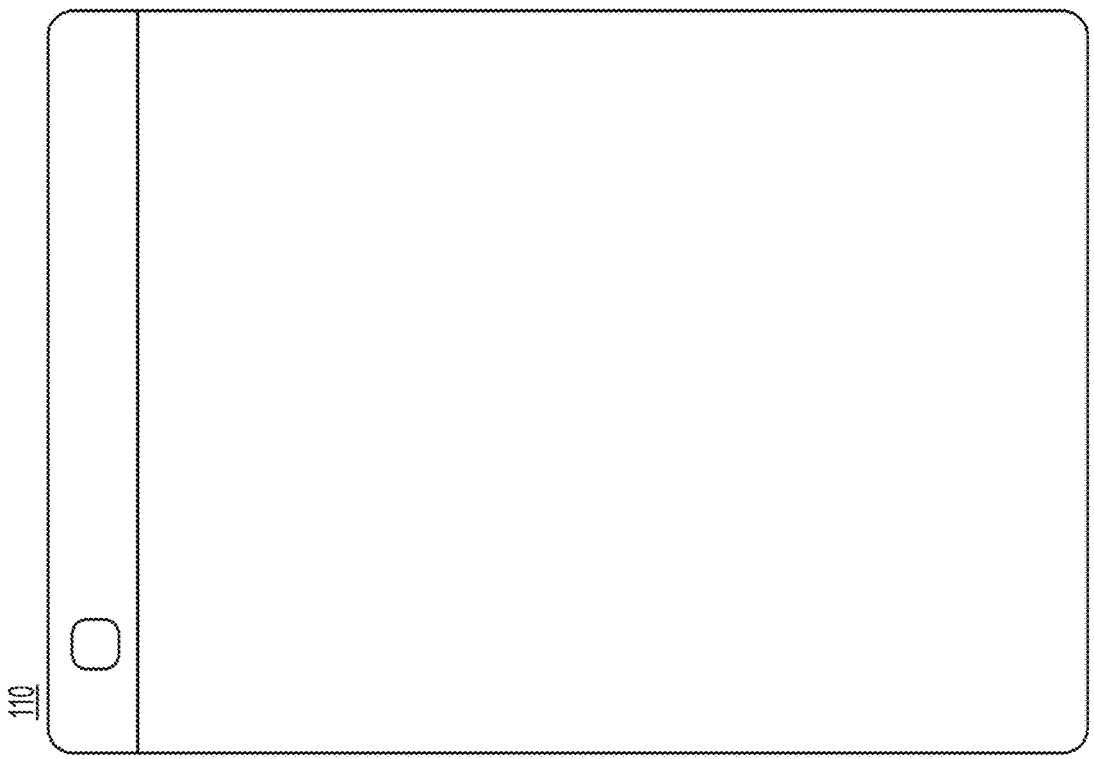
FIG. 1A and FIG. 1B depicts a perspective view of an electronic reading device including a view of the front of the electronic reading device, and a view of the back of the electronic reading device according to one or more aspects of the disclosed subject matter.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Referring now to the drawings, wherein like reference numerals designate identical or corresponding parts throughout the several views.

Figure 1B:
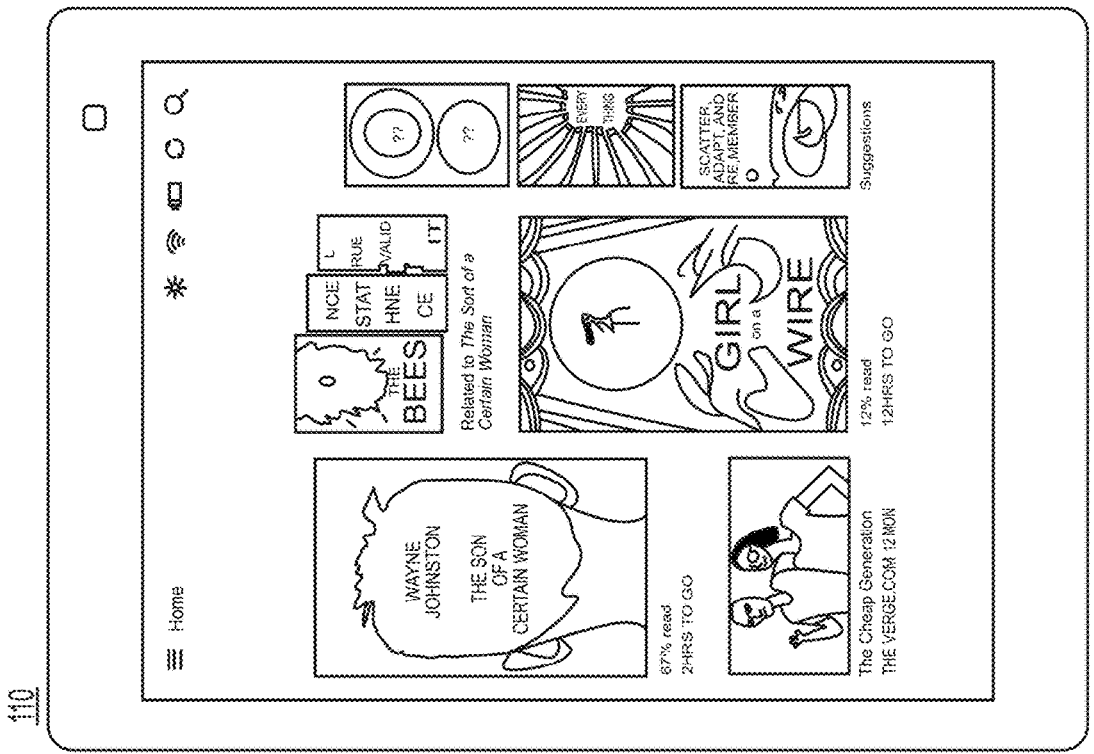

FIG. 1A-FIG. 1B depicts a perspective view of an electronic reading device 110 including a view of the front of the electronic reading device 110, and a view of the back of the electronic reading device 110 according to one or more aspects of the disclosed subject matter. The electronic reading device 110 (also known as an e-reader, electronic reader, etc.), is an electronic personal display that is used for reading electronic books (eBooks), electronic magazines, and other digital content. For example, digital content of an eBook is displayed as alphanumeric characters and/or graphic images on a display of an e-reader such that a user may read the digital content much in the same way as reading the analog content of a printed page in a paper-based book. An e-reader provides a convenient format to store, transport, and view a large collection of digital content that would otherwise potentially take up a large volume of space in traditional paper format.

In some instances, e-readers are purpose built devices designed especially to perform especially well at displaying readable content. For example, a purpose built e-reader may include a display that reduces glare, performs well in high light conditions, and/or mimics the look of text on actual paper. While such purpose built e-readers may excel at displaying content for a user to read, they may also perform other functions, such as displaying images, emitting audio, recording audio, and web surfing, among others.

Additionally, numerous kinds of consumer devices can receive services and resources from a network service. Such devices can operate applications or provide other functionality that links the device to a particular account of a specific service. For example, e-reader devices typically link to an online bookstore, and media playback devices often include applications which enable the user to access an online media library. In this context, the user accounts can enable the user to receive the full benefit and functionality of the device.

The electronic reading device 110 can enhance electronic reading activity, according to an embodiment. The electronic reading device 110 can include an electronic display device and a network service as further described herein. The network service may include multiple servers and other computing resources that provide various services in connection with one or more applications that are installed on the e-reader device. By way of example, in one implementation, the network service can provide e-book services which communicate with the e-reader device. The e-book services provided through network service can, for example, include services in which e-books are sold, shared, downloaded and/or stored. More generally, the network service can provide various other content services, including content rendering services (e.g., streaming media) or other network-application environments or services.

The e-reader device 110 can correspond to any electronic personal display device on which applications and application resources (e.g., e-books, media files, documents) can be rendered and consumed. For example, the e-reader device 110 can correspond to a tablet or a telephony/messaging device (e.g., smart phone). In one implementation, for example, e-reader device 110 can run an e-reader application that links the device to the network service and enables e-books provided through the service to be viewed and consumed. In another implementation, the e-reader device 110 can run a media playback or streaming application which receives files or streaming data from the network service. By way of example, the e-reader device 110 can be equipped with hardware and software to optimize certain application activities, such as rendering of electronic content (e.g., e-books). For example, the e-reader device 110 can have a tablet like form factor, although variations are possible. In some cases, the e-reader device 110 can also have an E-ink display.

In additional detail, the network service can include a device interface, a resource store and a user account store. The user account store can associate the e-reader device with a user and with an account. The account can also be associated with one or more application resources (e.g., e-books), which can be stored in the resource store. As described further, the user account store can retain metadata for individual accounts to identify resources that have been purchased or made available for consumption for a given account. The e-reader device 110 may be associated with the user account, and multiple devices may be associated with the same account. As described in greater detail below, the e-reader device 110 can store resources (e.g., e-books) that are purchased or otherwise made available to the user of the e-reader device 110, as well as to archive e-books and other digital content items that have been purchased for the user account, but are not stored on the particular computing device.

Figure 2:
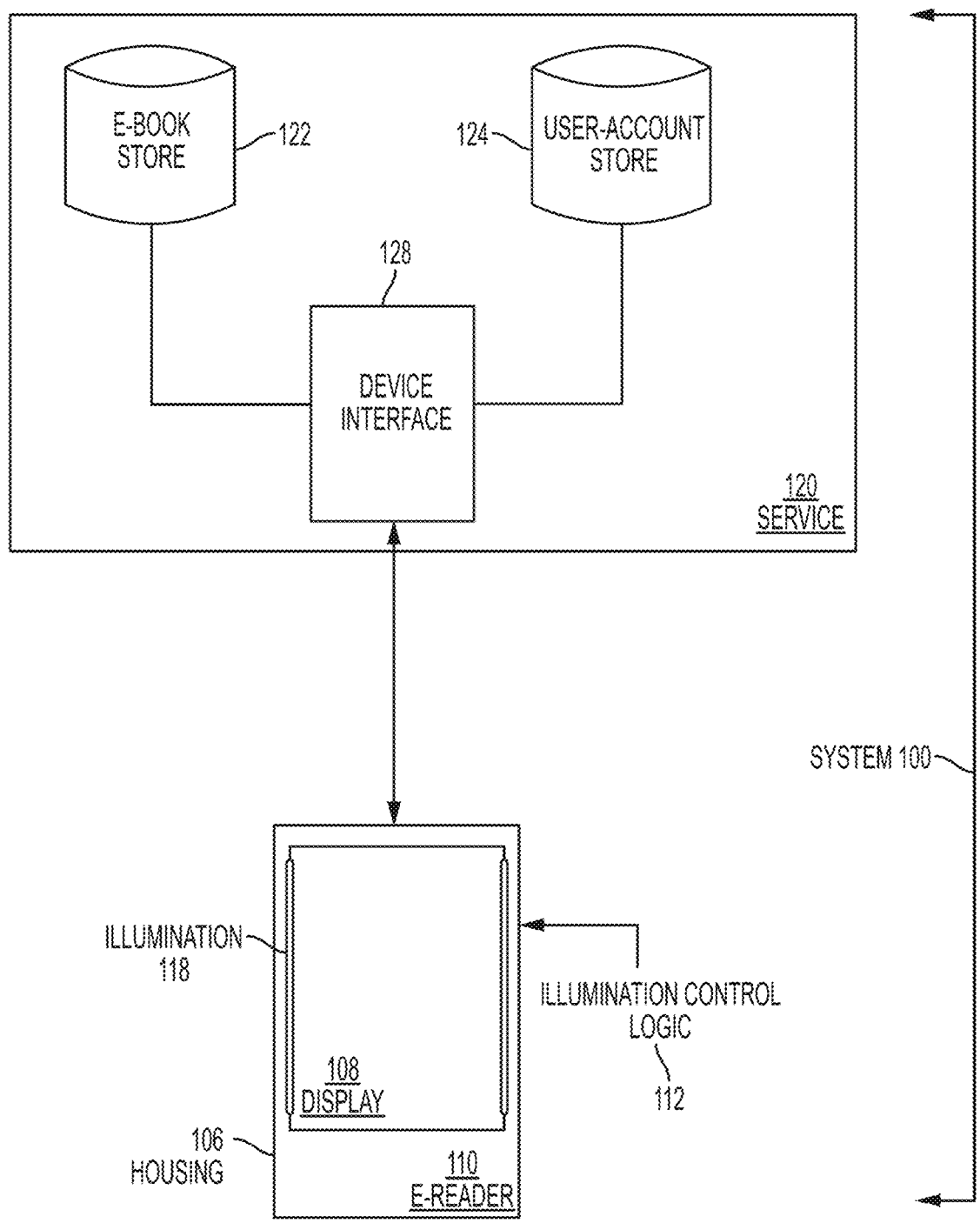
FIG. 2 illustrates a system for operating a computing device to enhance electronic reading activity according to one or more aspects of the disclosed subject matter.

FIG. 2 illustrates a system for operating a computing device (e.g., e-reading device 110) to enhance electronic reading activity according to one or more aspects of the disclosed subject matter. The e-reader device 110 includes a housing 106 that includes a display screen 108 on which text content from selected e-books can be rendered. The e-reader device 110 also includes a separate or independent illumination component 118 for the display screen 108. In some examples provided herein, the illumination component 118 is provided as a front light (e.g. adjustable RGBW front light), which directs light onto the display surface 108 from a housing bezel or thickness. It should be appreciated that the illumination 118 is not limited to the sides of the screen. For example, the illumination 118 can be positioned at the bottom of the screen, as may be seen for the adjustable RBGW front light as further described herein.

The display area 108 can be configured as a touch sensitive component of a display assembly on which input features are provided or are otherwise enabled. By way of example, the input features can include soft buttons or hidden touch regions where the user can transition pages from an e-book, looking words up (using a dictionary function), and the like.

According to some examples, the illumination component 118 independently illuminates the display screen 108 in order to create a visual effect. The visual effect can correspond to, for example, illuminating an otherwise non-illuminated screen (such as provided by electronic paper type displays). The illumination can further be provided with characteristics, such as luminosity, color, and and/or other lighting effects.

The e-reader device 110 can include illumination control logic 112 that controls one or more illumination aspects of the front light 118. As described with examples, the control logic 112 can control one or more of the color, the luminosity, lighting affect (e.g., blinking or modulation), or other illumination characteristic. Furthermore, in some variations, the control logic 112 controls the illumination component 118 in a manner that is responsive to triggers. As described with various examples, the illumination component 118 can be responsive to software-implemented triggers, sensor implemented triggers, and/or hardware component related triggers. Additionally, the illumination component 118 can be responsive to settings and/or input provided by a user through interaction with the-reader device 110. As described with examples, the control logic 112 controls the lighting aspects of the illumination component 118 while the display screen 108 is used to render content, such as pages of an e-book. In this way, the illumination component 118 can generate ambience, illumination environment, and/or status information independently of content displayed on the display screen 108.

In one implementation, the illumination component 118 is provided in the form of light emitting diodes (LEDs) or other discrete light sources that are disposed in a housing 106 of the e-reader device 110. The front light 118 can be programmatically controllable to modulate in color, luminosity and/ or affect. The orientation of the illumination component 118 directs light onto the display screen 108 independent of content rendered through the display screen. As shown with examples of FIG. 3A and FIG. 3B, the light sources that comprise the illumination component 118 can be disposed in a bezel of the housing 106 so as to cast light on to the display screen 108.

The electronic reading device can include a front light, and more specifically an adjustable RGBW front light. Additionally, the electronic reading device can have a range of dimensions. However, the depth of the electronic reading device can be less than seven millimeters. More specifically, the depth of the electronic reading device can be 6.99 millimeters due at least in part to the structural design as further described in U.S. Pat. No. 475,280, which has been incorporated by reference herein.

Figure 3A:
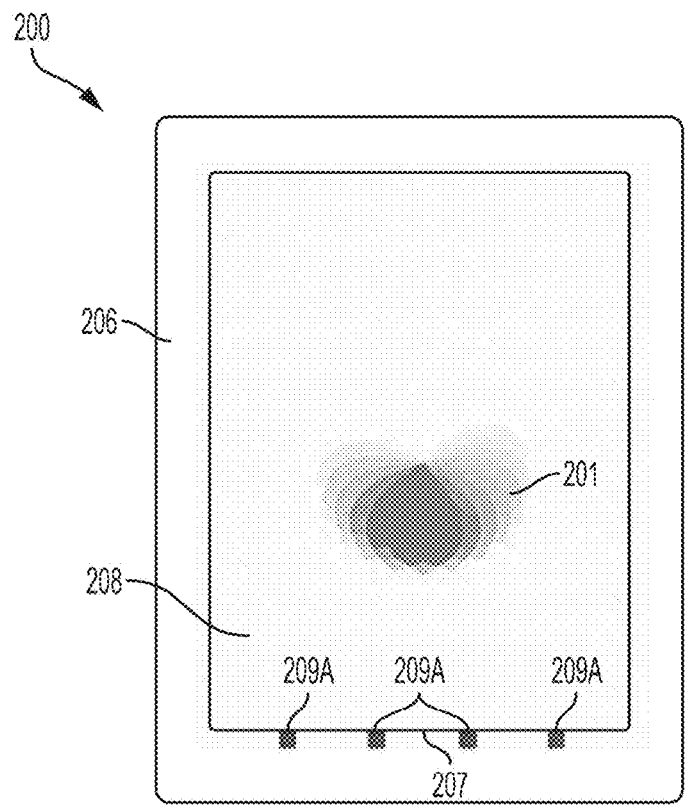
FIG. 3A and FIG. 3B illustrate alternative examples of an e-reader device having a front light according to one or more aspects of the disclosed subject matter.
Figure 3B:
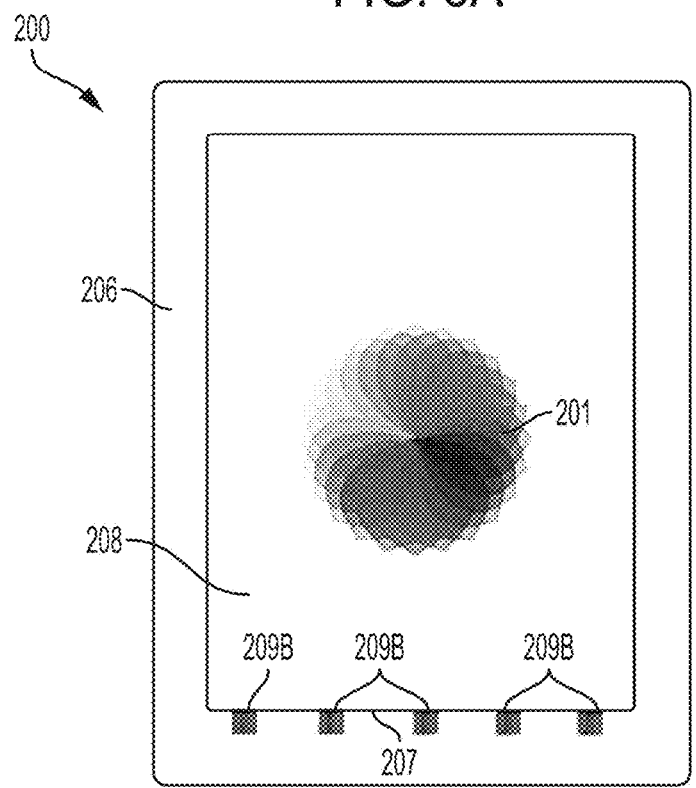

FIG. 3A and FIG. 3B illustrate alternative examples of the e-reader device 110 having a front light according to one or more aspects of the disclosed subject matter. In more detail, the e-reader device 200 of FIG. 3A and FIG. 3B can include housing 206 for supporting the display screen 208. The display screen 208 can form the exterior surface of the display. For example, in the context of e-paper type displays, the display screen 208 can provide a visual interface for the reader, and content provided through the display surface 208 can be non-illuminated.

The housing 206 provides a bezel 207 which surrounds the display screen 208 and provides a thickness relative to the display screen 208. The bezel 207 can provide structure for supporting discrete light sources. For example, a set of LEDs 209A (FIG. 3A), 209B (FIG. 3B) can be at least partially disposed within the bezel 207 to direct light 201 onto the display screen 208.

In examples of FIG. 3A and FIG. 3B, the LEDs 209A, 209B can be operable in multiple states (e.g., on/off, blinking, patterned blinking), and/or multiple luminosity states (e.g., dim/bright). Additionally, in an example of FIG. 3B, the LEDs 209B are multicolored, so as to be illuminatable in multiple colors. For example, the LEDs 209B can correspond to RGBW LEDs that generate illumination for the display screen 208 in one of multiple colors. The state and/or color of the LEDs 209A (FIG. 3A), 209B (FIG. 3B) can be determined by control of the processor. In particular, as described with some examples, the processor can identify events and/or conditions would trigger changes in the state of the LEDs 209A, 209B.

Figure 4C:
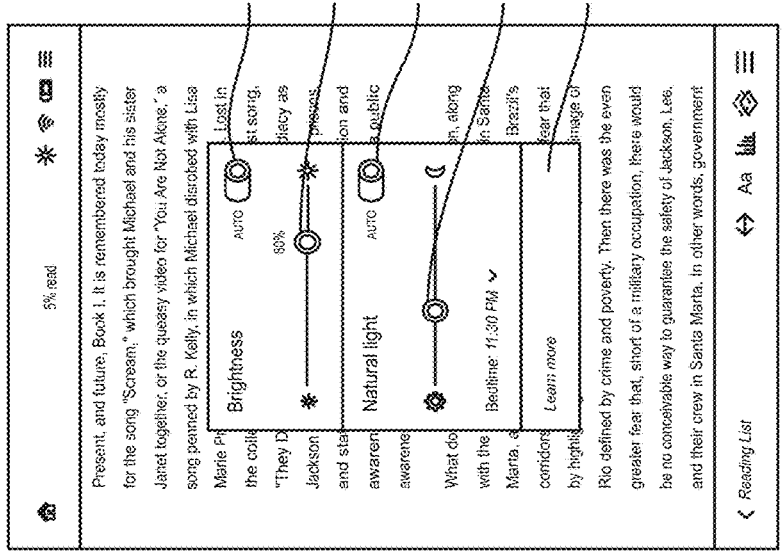
FIGS. 4A, 4B, and 4C depict exemplary brightness and natural light graphical user interfaces (GUI) relating to brightness control and natural light control according to one or more aspects of the disclosed subject matter.
Figure 4B:
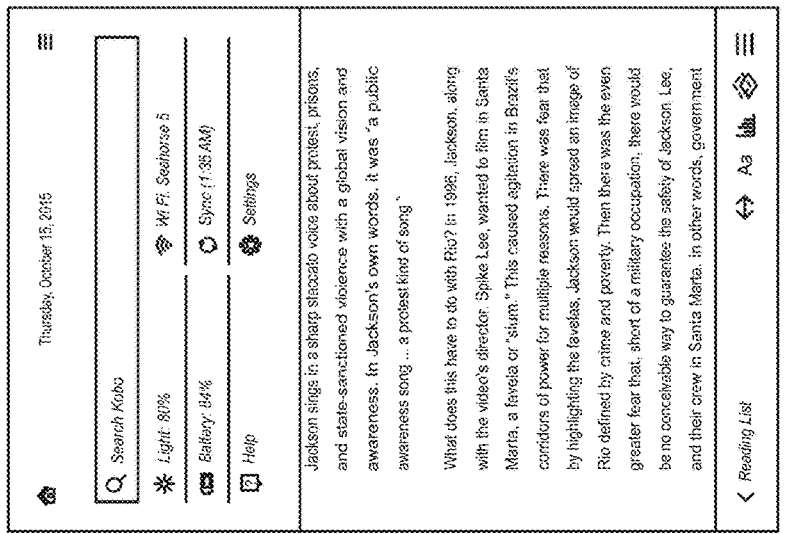
Figure 4A:
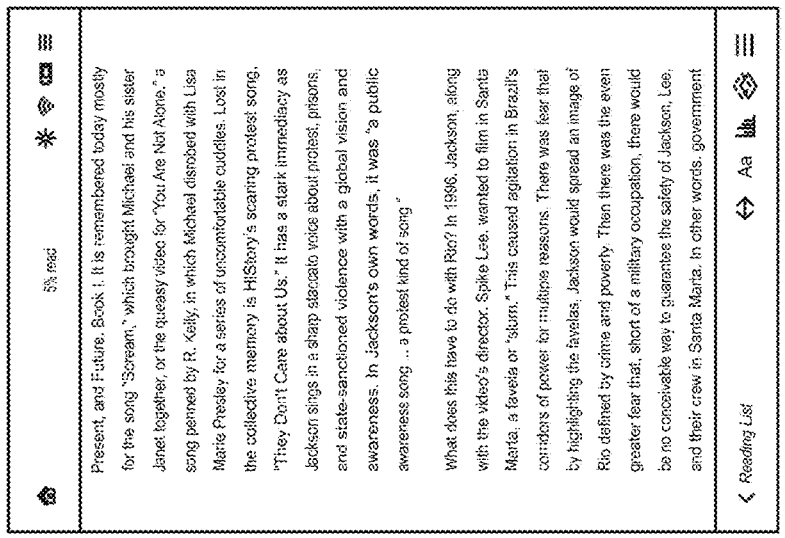

FIGS. 4A-4C depict exemplary brightness and natural light graphical user interfaces (GUI) relating to brightness control and natural light control according to one or more aspects of the disclosed subject matter. More specifically, in FIG. 4C the brightness control can include an auto brightness switch 405 to turn automatic brightness adjustments on and off. Additionally, a brightness slider 410 can adjust the brightness level within a range of brightness levels (e.g., zero percent to one hundred percent). The natural light graphical user interface can include an auto natural light switch 415 to turn automatic natural light on and off. Additionally, a natural light slider 420 can adjust the natural light level within a range of natural light levels (e.g., 1500K to 6400K). The brightness and natural light GUI also includes a "Learn More" section 425 which causes a dialogue to appear with additional information regarding the natural light settings.

Figures 5A, 5B, 5C:
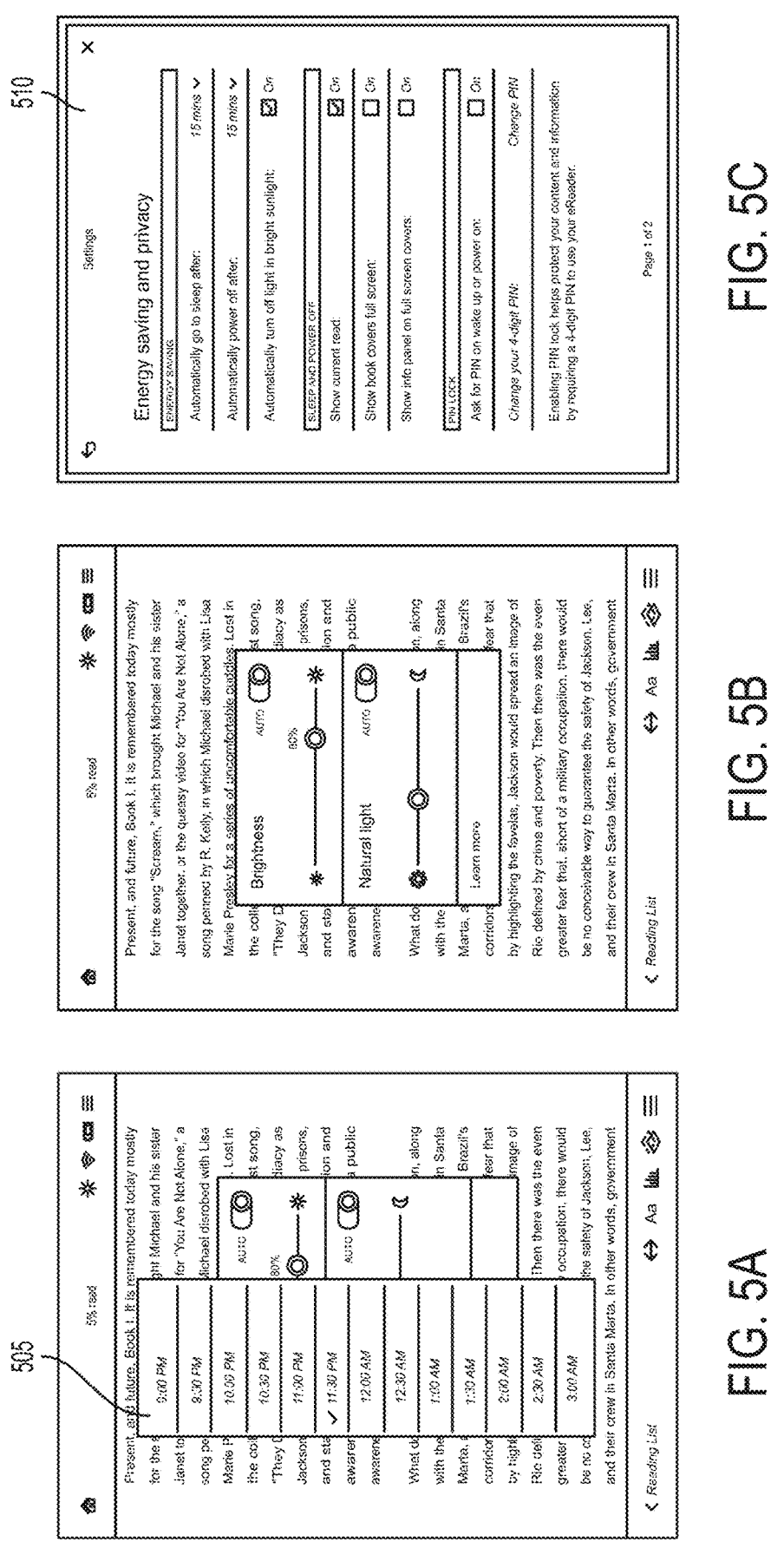

FIGS. 5A-5C depict exemplary bedtime selection GUIs and an energy saving GUI according to one or more aspects of the disclosed subject matter. More specifically, in FIG. 5A the bedtime selection GUI can display a bedtime dropdown list 505 to select a bedtime between 9:00 PM and 3:00 AM in half hour intervals. Shorter or longer time intervals may be available. Alternatively, or additionally, a 24 hour based clock can be used. When the auto natural light switch 415 (see FIG. 4C) is in an off position, the bedtime dropdown list can be hidden as depicted in FIG. 5B. In FIG. 5C an energy saving GUI 510 can include various energy saving options including a sleep timer, a power off timer, an automatically turn off light in bright sunlight selection option, and the like.

Figure 6C:
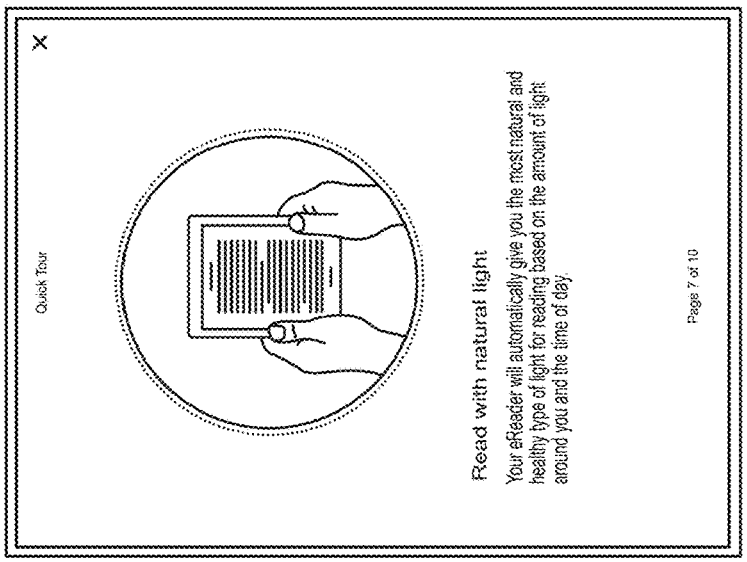
FIG. 6C depicts an exemplary quick tour page according to one or more aspects of the disclosed subject matter.
Figure 6B:
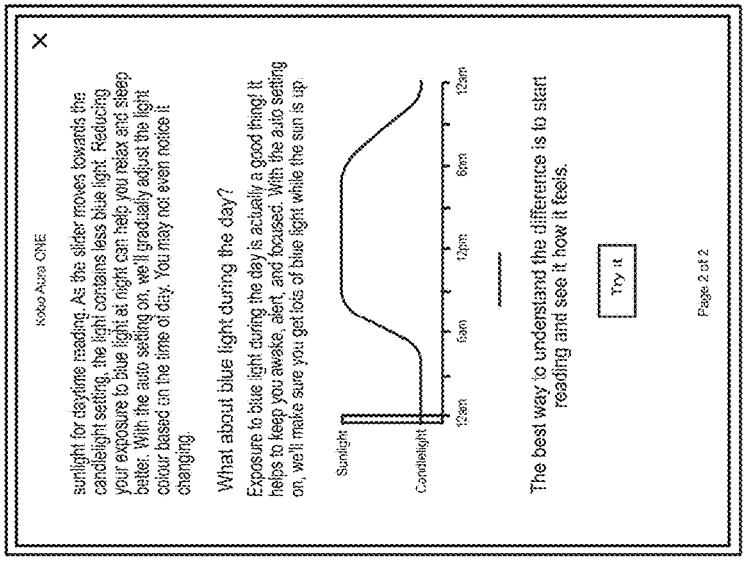
FIG. 6A and FIG. 6B depict the result of interaction with a "Learn More" section of FIG. 4C according to one or more aspects of the disclosed subject matter.
Figure 6A:
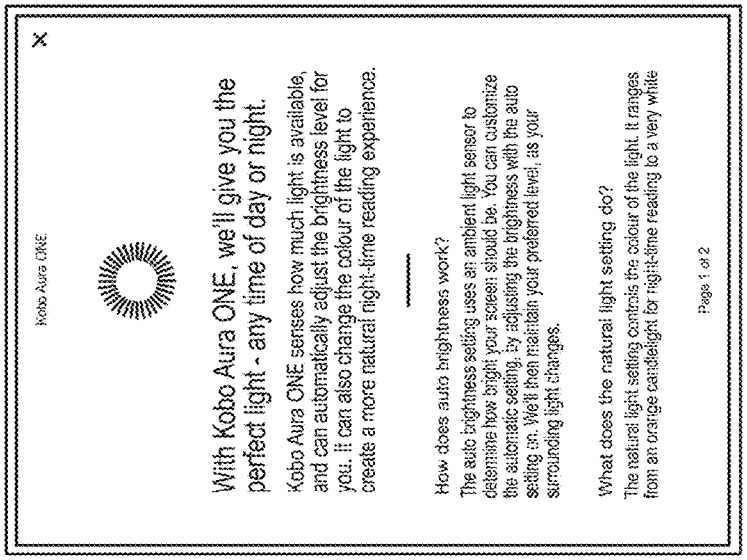

FIG. 6A and FIG. 6B depict the result of interaction with the "Learn More" section 425 of FIG. 4C according to one or more aspects of the disclosed subject matter. The dialogue of FIG. 6A and FIG. 6B includes information relating to the natural light settings.

FIG. 6C depicts an exemplary quick tour page according to one or more aspects of the disclosed subject matter. The dialogue of FIG. 6C includes information relating to the natural light settings.

Figure 7B:
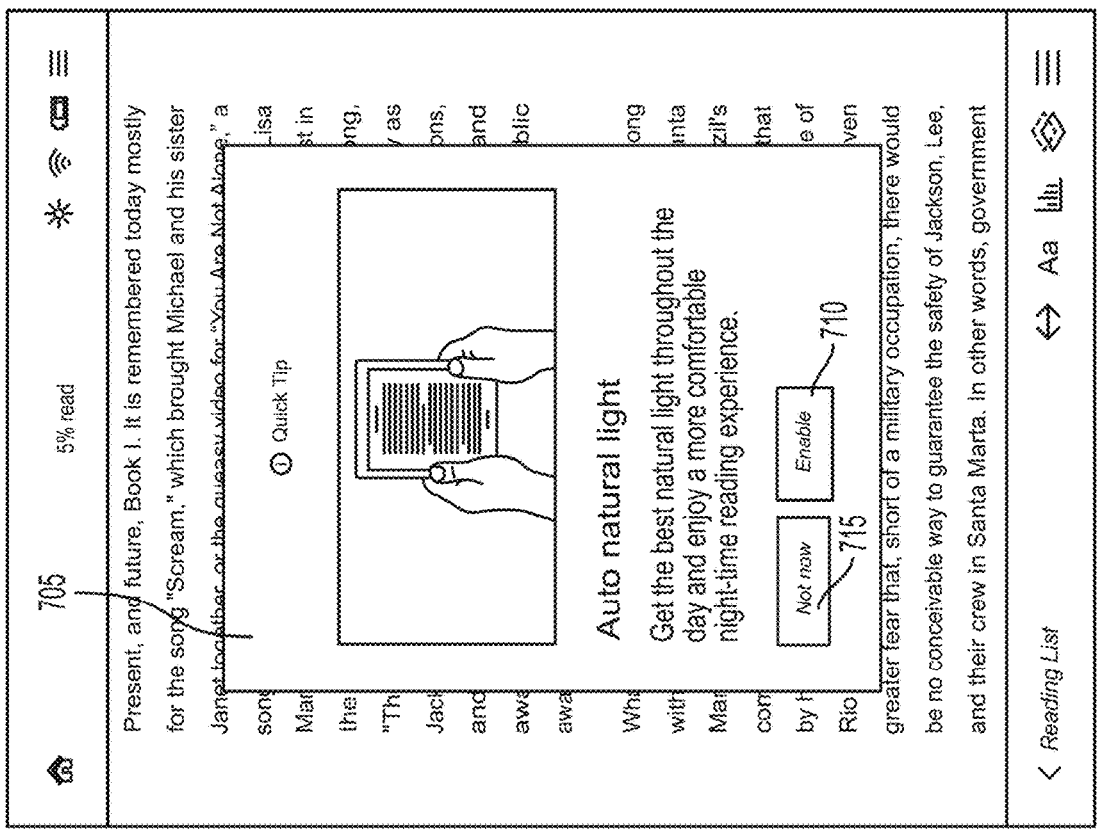
FIG. 7B depicts an exemplary home screen according to one or more aspects of the disclosed subject matter.
Figure 7A:
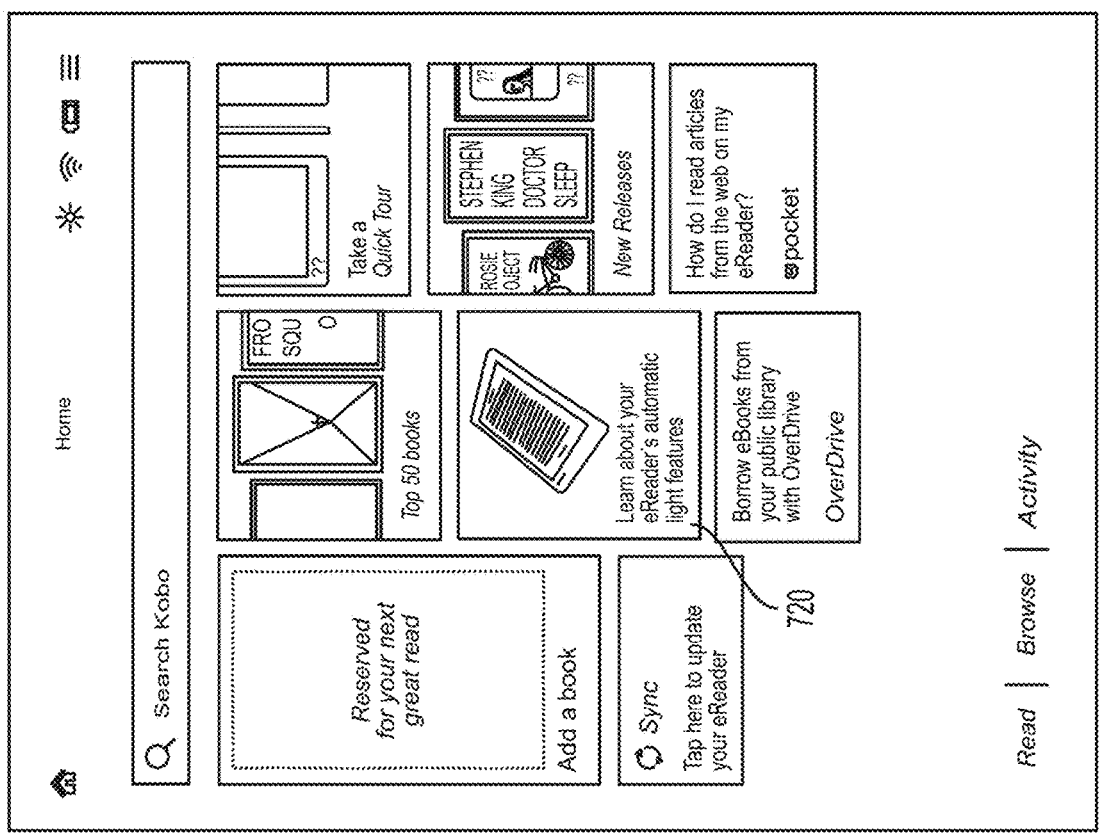
FIG. 7A depicts an exemplary automated message displayed to a user according to one or more aspects of the disclosed subject matter.

FIG. 7A depicts an exemplary automated message 705 displayed to a user according to one or more aspects of the disclosed subject matter. The automated message provides an option to enable to the auto natural light feature by selecting the enable section 710. The automated message can be shown again when the user closes the automated message, auto natural light has been off for over one week, or if the user has adjusted the natural light setting three times with auto natural light off. Selecting to enable the auto natural light feature turns on the auto natural light feature and closes the automated message. Choosing a not now section 715 or tapping the display outside of the automate message closes the automated message with no change.

FIG. 7B depicts an exemplary home screen according to one or more aspects of the disclosed subject matter. The exemplary home screen includes a light information tile 720 relating to the natural light feature.

Figure 8A:
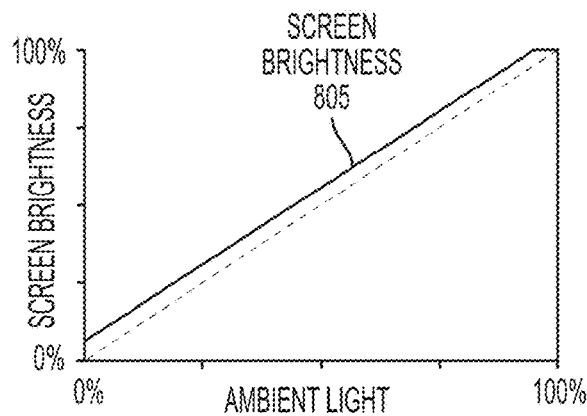
FIGS. 8A, 8B, and 8C depict examples of an auto-brightness feature in response to one user input according to one or more aspects of the disclosed subject matter.
Figure 8B:
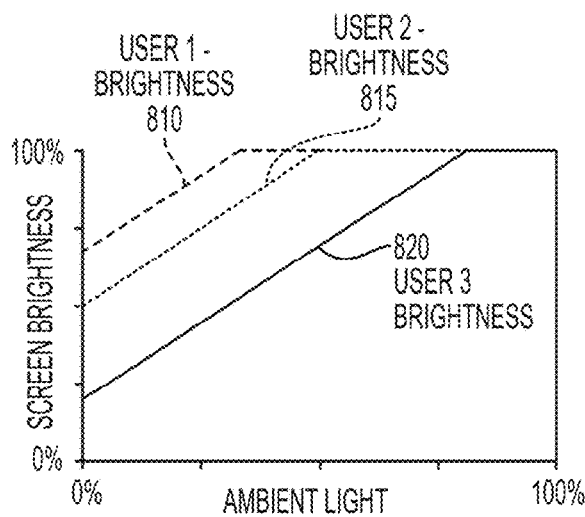
Figure 8C:
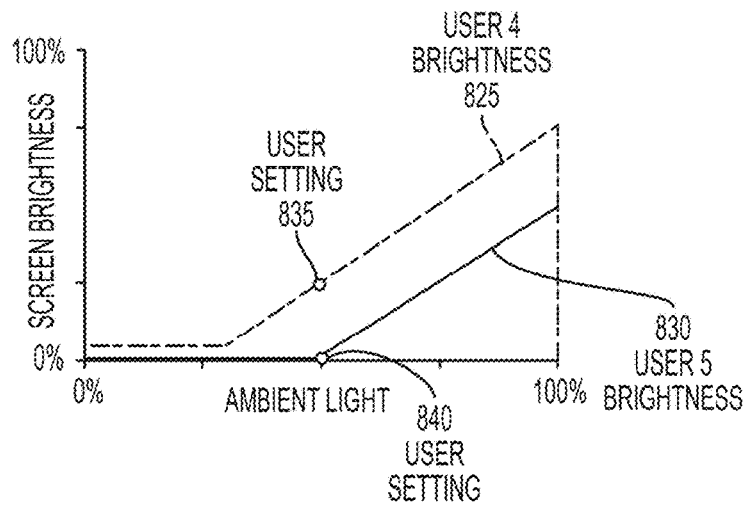

FIGS. 8A-8C depict examples of an auto-brightness feature in response to one user input according to one or more aspects of the disclosed subject matter. In particular, some examples provide for a computing device that includes a programmatically controlled front light. The front light cast light onto a display surface and/or other region of the computing device, for purpose of providing illumination and/or lighting effect. Examples described herein provide for a computing device that can programmatically control changes in the state of a front light component, including control of changes to color, luminosity, and/or lighting effect.

Still further, in some embodiments, a computing device is operable to detect one or more pre-determined illumination triggers for a front light of the computing device. A state for the front light is selected based on the detected one or more pre-determined illumination triggers, and the front light is controlled to change into the selected state.

FIG. 8A depicts a default automated brightness mode in which the automated brightness switch 405 (see FIG. 4C) is on and no user input has been received. Screen brightness 805 is set to 5% more than an ambient light level detected by an ambient light sensor. If the ambient light level reaches 100%, the front light (as described in FIG. 9, for example) can turn off automatically, which can provide various advantages including energy saving. The transition can be smooth regardless of how quickly the ambient light level reaches 100%, as further described herein. In other words, FIG. 8A can show the default relationship between measured ambient light level and light brightness setting applied at that level.

FIG. 8B depicts examples of a user having set the brightness level to a preferred brightness level (e.g., User 1—brightness 810, User 2—brightness 815, and User 3—brightness 820) above the default brightness level as shown in FIG. 8A. If the ambient light changes, the screen brightness of the electronic reading device, is adjusted automatically to match the relative ambient light level. When the user adjusts brightness to a preferred brightness level, the preferred relative setting can be updated and stored as the user's preferred brightness level. In other words, FIG. 8B can show that if a user increases their brightness manually (810, 815), the linear relationship between ambient light and brightness remains, but can be shifted by a corresponding amount, to the point where brightness reaches 100%, for example.

FIG. 8C depicts examples of a user having set the brightness level to a preferred brightness level (e.g., User 4—brightness 825, User 5—brightness 830) below the default brightness level as shown in FIG. 8A. For example, a first user setting 835 can correspond to User 4—brightness 825 and a second user setting 840 can correspond to User 5—brightness 830. If a user setting is lower than the available amount of ambient light (e.g., user setting 835), then the relative setting can be automatically matched to a minimum of 5% brightness. However, as an exception, if the ambient light is less than 5% and the user sets their brightness to less than 5% (e.g., user setting 840), then the user setting 840 becomes the minimum setting. In other words, FIG. 8C can show that if a user decreases their brightness manually to 0% when ambient light is at 50% (840), the linear relationship between ambient light and brightness remains, but is shifted by a corresponding amount, but brightness only begins increasing from 0% upward starting from the 50% ambient light level.

Figure 9:
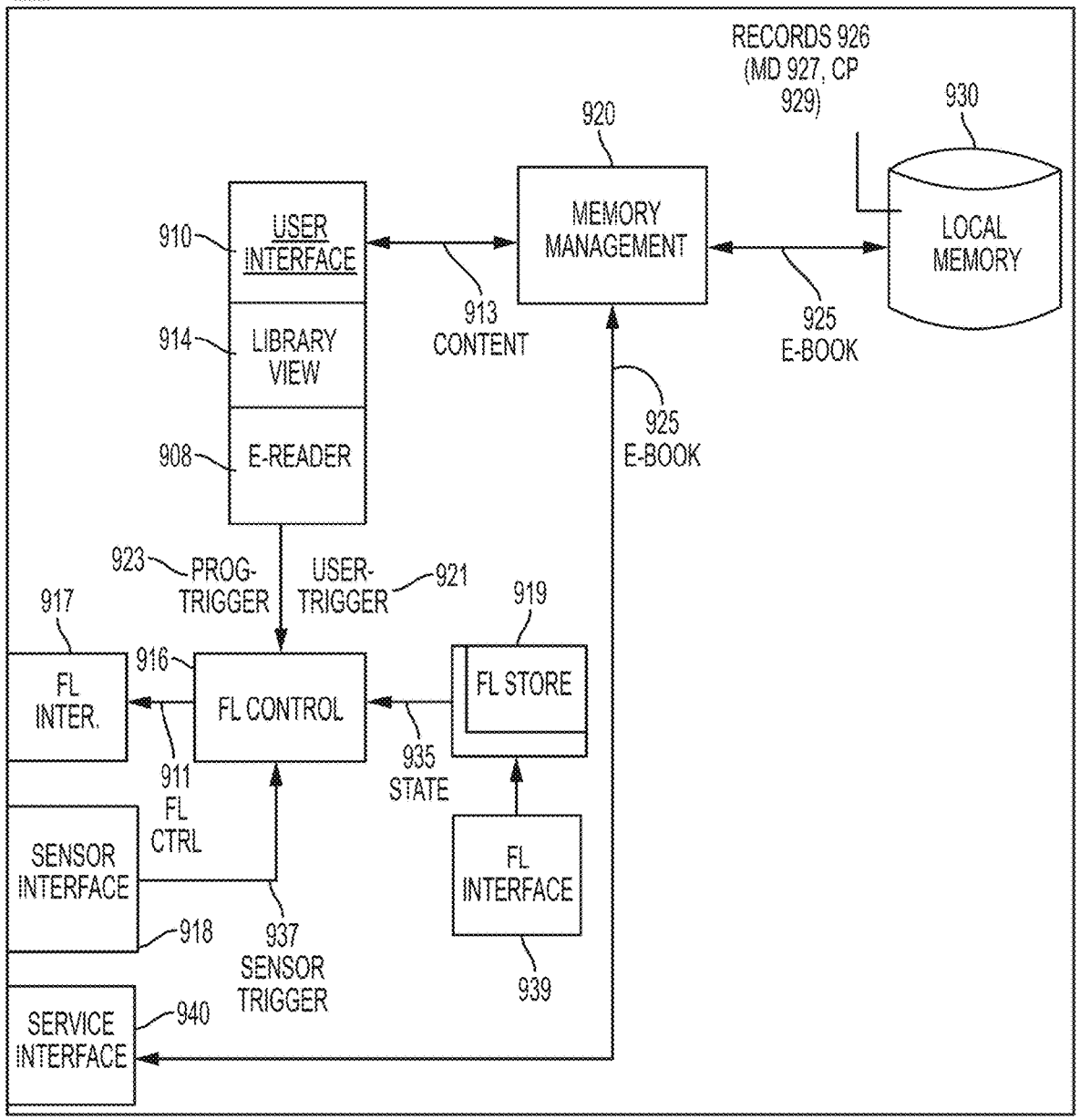
FIG. 9 illustrates an example device system for providing illumination onto a display screen of an e-book device according to one or more aspects of the disclosed subject matter.

FIG. 9 illustrates an example device system 900 for providing illumination onto a display screen of an e-book device 110 according to one or more aspects of the disclosed subject matter. A device system 900 implements programmatic components for communicating with an e-book service (such as network service 120, shown in FIG. 1B), as well as for enabling functionality for viewing and accessing e-books utilized by an account associated with the e-reader device 110 (as in FIG. 1B, for example). In some embodiments, the device system 900 can be implemented as an application that runs on the e-reader device 110, for example.

In an example of FIG. 9, system 900 includes a user interface 910, a memory management module 920, a local memory 930, and a service interface 940. Some or all of the programmatic components shown with the computing system 900 can be provided in part as operating system-level components. Alternatively, the programmatic components shown with the device system 900 can be provided as part of an application that runs on, for example, the e-reader device 110. For example, the user can download an application onto the device that is operated as the e-reader device 110, in order to obtain functionality such as described with an example of FIG. 9. Alternatively, an application can be embedded or otherwise preinstalled with other programmatic elements for providing functionality such as described with system 900.

The service interface 940 includes application logic which enables the e-reader device 110 to use, for example, a wireless Internet connection, to connect to the network service 120 (see FIG. 1B). In connecting with the service, the service interface 940 can transmit data that enables the network service 120 to identify the e-reader device 110 on which system 900 is implemented, so that the network service 120 can determine the account that is associated with the particular e-reader device. The service interface 940 can be used to retrieve e-books 925 from the network service 120. For example, in identifying the e-reader device 110 of system 900 to the network service 120, the network service may be able to procure payment information (e.g., stored credit card information) that can be used to charge the users account when the user purchases a new e-book from the service. Each e-book can correspond to a literary work having a pagination format. Optionally, some e-books may have chapter designations, as well as content that corresponds to graphics or images (e.g., such as in the case of magazines or comic books). Individual e-books 925 can also include metadata 927, such as imagery provided as a cover for the e-book when the e-book is marketed (e.g. similar to the manner in which a conventional hardbound book would be marketed in a retail store). In one implementation, the network service 120 can retrieve or otherwise identify the imagery and other metadata 927 of individual e-books from publisher sources.

In identifying the e-reader device of system 900, the network service 120 can identify what e-books belong to the account associated with the particular device. The e-books that are transmitted to the e-reader device of system 900 include those e-books that are purchased from the device, or those e-books that the user requested to download. In variations, e-books can be automatically downloaded to the device in response to occurrence of certain conditions. For example, the user can purchase an e-book on another device, and then subsequently connect to the network service 120 via the e-reader device 110 to automatically receive their previously purchased e-book. Alternatively, as another example, network service 120 can be configured to push e-books to the e-reader device 110 of system 900, based on, for example, user account settings, subscription plans and rules, and various other business logic considerations.

Additionally, the service interface 940 can include processes for automatically receiving updates from a network service 120. The update can include programmatic updates, including updates to software components on the e-book device 110, as well as updates to lists, download of e-books that the user may have purchased on another device of the same account, recommendations from the network as to what a given user may want to purchase or view, and/or various other data that can be either generally provided to the user of the network service or specifically provided for to the particular account or user.

According to some embodiments, the local memory 930 stores each e-book as a record 926 that includes metadata 927 and content 929 (e.g., page content). The management module 920 can retrieve portions of individual e-books for purpose of rendering e-books via the user interface 910.

In an example of FIG. 9, the user interface 910 of device system 900 includes an e-reader component 908 and a library view component 914. The e-reader component 908 displays content from a given e-book of the user selection via the memory management 920 and/or local memory 930. For example, the e-reader component 908 can display content 913 (e.g., one or more pages of) content portion 929 of a given e-book 925. The e-reader component 908 can include features to enable the user to perform actions such as the page turning, chapter turning, page turning by clusters, scanning, and/or searching. As additional examples, the e-reader component 908 can provide features for enabling the user to adjust settings (e.g., brighten or dim display), annotate or highlight, perform a dictionary lookup or translation, and/or share or perform social networking activities. In response to input provided by the user, the e-reader component 908 can update the content 913 that is displayed. For example, in response to a page or chapter turn input, the e-reader component 908 can retrieve and update content 913

(via the memory management 920) from the memory 930, and further output the updated content for display on the device for system 900.

The library view 914 can display objects representing e-books and other content items for the user. In one implementation, the library view 914 displays metadata content, corresponding to images and/or text associated with the metadata 927 of the e-book 925 that is being displayed. For example, the library view 914 can display book cover images and author information for the e-books that are in the user library. The library view 914 can also display metadata for e-books that are provided from network service 120 and/or which are in the user library, but not stored locally (e.g., archived e-books).

The user interface 910 can be coupled to a front light control component 916. The front light control component 916 includes instructions and other logic for controlling the front light of the device on which system 900 is implemented. In the example provided, the front light control 916 is coupled to an interface 917 for front lights. By way of example, the interface 917 can be used to signal front lights 209A or 209B, as shown with examples of FIG. 3A and FIG. 3B. The interface 917 can be used to signal changes to the state of front lights of the device for system 900. In one implementation, the front light component 916 signals control 911 to the front light interface 917. The front light control 911 can cause the interface 917 to change an existing state (e.g., illumination level, color etc.) of the front light, and further to specify one or more future states of the front lights.

In some variations, front light control component 916 can include user-interface features that are displayed via the user interface 910. For example, the front light control component 916 can include features that are displayed via the e-reader component 908 and/or library view 914. One or more such features can enable the user to provide input that signals a user-trigger 921 to the front light control component 916. The user-trigger 921 can be signaled to the front light control component 916 to change the state of the front lights while, for example, the user is viewing content 913 that is provided through the e-reader component 908. The user-trigger 921 can specify a state for the front light. More specifically, input corresponding to user-trigger 921 can specify the state for the front light. For example, the user-trigger 921 can specify that illumination level, color and/or lighting pattern of the front light. By way of example, the user can view a page of an e-book 925 via the e-reader device 110, then select a front light feature that enables the user to specify a color (e.g., blue) and/or brightness for the front light.

In variations, a programmatic trigger 923 can be generated from functionality provided through user interface 910, for example. In one implementation, the e-reader component 908 pre-associates triggers with aspects of the e-book that is being rendered. The programmatic trigger 923 can correlate to events or conditions, such as (i) a particular page being rendered, (ii) a proportion of the e-book that has been completed (e.g., viewed), (iii) an e-book activity that has been performed by the user (e.g., hold page while transitioning pages), (iv) a particular word or phrase that has been selected, and/or (iv) a subject matter (as identified by words or phrases) in the content 913 being displayed. Still further, in variations, the e-reader component 908 can detect an event or condition corresponding to the programmatic trigger 923, such as (i) the user selecting a particular e-book that is designated for a particular front light affect (e.g., by user input or default), (ii) the user providing input for turning a page (e.g., the user completes 50% of the e-book with the page turn), (iii) the user providing input for highlighting a word, or (iv) the e-reader component 908 being operated to render a particular page that is designated to have a specific or different front lighting affect (e.g., by user-specified input or by default). In this way, the programmatically generated trigger 923 can be signaled from the user interface 910 to the front light control component 916 when an underlying event or condition of the trigger occurs.

Likewise, the library view 914 can provide sources for generating programmatic trigger 923. For example, input provided by the user to view a particular library (e.g., archive library, displaying e-books which are stored on the network service 120) can be associated with a corresponding programmatic trigger 923. When, for example, the user views an archive library, the front light component 916 can be controlled to illuminate in a particular color. The color selection can, for example, indirectly inform the user that the e-books being shown are stored on the network, and not on the device at the particular instance.

In some implementations, each of the user-trigger 921 and programmatic trigger 923 can be provided or otherwise associated with characteristics such as identifiers or other data elements. The characteristics of the triggers 921, 923 can define the state of the front light components. For example, the user-trigger 921 or programmatic trigger 923 can include data that identifies, or is correlative to, a particular color, illumination state, effect (e.g., blinking) or other lighting characteristic.

As an alternative or addition, one implementation provides that the front light control component 916 includes a front light data store 919 that correlates triggers 921, 923 (or data elements provided with the triggers 921, 923) with specific lighting characteristics that the define the state 935 of the front lights (e.g., as provided with LEDs 209A, 209B shown by FIG. 3A and FIG. 3B). The front light data store 919 can be based on rules or other logic that are provided with the control component 916.

In some variations, at least some of the data provided with the front light data store 919 can be user-specified. In one implementation, for example, a control interface 929 can be provided for the front light data store 919 to enable the user to provide input corresponding to settings or configurations which identify the programmatic trigger 923, as well as the resulting state (or change in state) of the front lights. The identifiers and/or other data elements provided with the user-trigger 921 and/or programmatic trigger 923 can be correlated to the front light data store 919 to identify the particular state or change in state of the front lights.

In some variations, the front light data store 919 includes settings that are specified by the user and implemented independently of programmatic triggers 923. For example, the user may specify conditions during which front light component 916 is to control the front light components (e.g., LEDs 209A, 209B of FIG. 3A or FIG. 3B) to illuminate with one or more specific characteristics. As a first example, the user may specify by default that the front light is to always illuminate in a particular color. As another example, the user may specify a schedule that determines the default state of the front light, based on time of day.

The front light control component 916 signal front light control 911 to interface 917 in order to implement the change in state for the front lights. The front light interface 917 can signal the output state to the front light components, such as provided by LEDs 209A, 209B (see FIG. 3A and FIG. 3B).

In some variations, the front light component 916 can receive sensor readings 927, which can correspond to or be interpreted as triggers based on predetermined threshold values. The sensor readings 927 can be provided by a sensor interface 918. The sensor interface 918 can include logic that interfaces with hardware sensors provided on, for example, an exterior of the housing for the device of system 900. By way of example, hardware sensors can correspond to ambient light sensors and/or temperature sensors. Thus, the temperature sensor can obtain the temperature of the environment for the e-book device used by system 900. Likewise, a light sensor can determine the illumination level in the environment of the device for system 900. The front light control component 916 can interpret sensor triggers from values provided in the sensor readings 927, such as values for temperature and/or ambient luminosity.

In one implementation, sensor readings 927 can cause the front light control component 916 to signal control 911 to the front light interface 917, in order to alter the state of the front light components (e.g., LEDs 209A, 209B as shown by FIG. 3A and FIG. 3B). The front light control component 916 can correlate information provided in the sensor readings 927 with the state of the front light components, using, for example, front light data store 919. For example, the front light data store 919 can correlate specific sensor readings to a particular state of illumination.

In some variations, the user can define what the state of the front light should be in response to certain sensor values provided in the sensor readings 927. The user defined responses can be provided through the front light interface 929. The user can specify, for example, the ambient light value or temperature value that is to trigger a particular illumination state.

Referring again to FIGS. 8A-8C, the examples in FIGS. 8A-8C include a default setting in which the screen brightness is set to five percent more than the ambient light level. As the ambient light level increases, the screen brightness increases proportionally such that the screen brightness remains at five percent more than the ambient light level as the ambient light level changes. However, because the screen brightness is five percent more than the ambient light level, the screen brightness will reach maximum screen brightness before the ambient light level reaches a maximum ambient light level. For example, a user (see FIG. 8B) may select a brightness preference higher than the available ambient light. If the ambient light changes, the brightness can be adjusted to match the relative light level. Each of User 1, 2, and 3 (see FIG. 8B) may reach maximum brightness prior to the ambient light level reaching a maximum ambient light level, and as a result, the brightness level can remain at 100% even if the ambient light level continues to increase after the brightness level has reached 100%. If a user (e.g., User 4 from FIG. 8C) selects a brightness preference lower than the available ambient light, the brightness level is automatically matched to a minimum of 5%. An exception can be User 5 (see FIG. 8C) in the event that the user has an ambient light level lower than 5% and sets a brightness preference lower than 5%. As a result, the brightness preference set below 5% is updated to be the minimum setting. Additionally, when the ambient light level reaches 100%, the adjustable RBGW front light turns off. The adjustable RGBW front light can turn off to save energy, for example, because an ambient light level of 100% can correspond to a situation where the RBGW front light has little to no effect on the visibility of the screen due to the amount of light in the area around the electronic reading device.

Figure 10B:
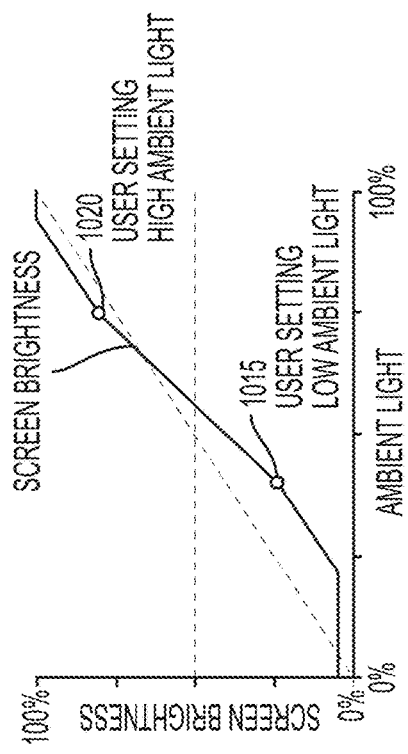
FIGS. 10A, 10B, and 10C depict examples of an auto-brightness feature in response to two user inputs according to one or more aspects of the disclosed subject matter.
Figure 10C:
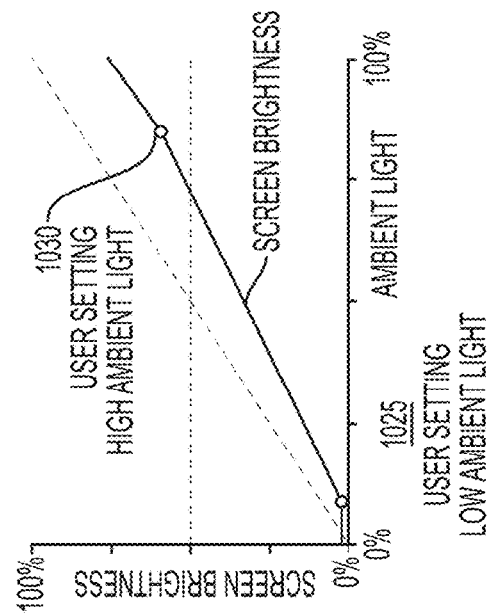
Figure 10A:
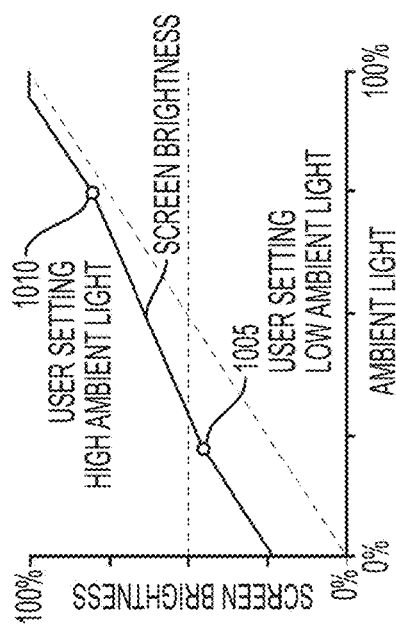

FIGS. 10A-10C depict examples of an auto-brightness feature in response to two user inputs according to one or more aspects of the disclosed subject matter. The two inputs can include a low ambient light preference 1005 and a high ambient light preference 1010, the low ambient light preference 1005 being less than 50% ambient light and the high ambient light preference 1010 being greater than 50% ambient light. In one aspect, the high ambient light level can be greater than or equal to 50% ambient light. For example, if a brightness adjustment is received via the device in high ambient light, the preferred relative setting for high ambient light can be updated. Similarly, if the user adjusts brightness in low ambient light, the preferred relative light setting for low ambient light can be updated. When a user adjusts brightness in either high ambient light or low ambient light, the preferred relative setting can be updated and stored as the preferred relative setting for high ambient light and low ambient light, respectively. Additionally, a predetermined rate can be set at which the brightness level transitions between the low ambient light preferred brightness level and the high ambient light preferred brightness level as the ambient light changes. Further, when the ambient light level is lower than the low ambient light preferred brightness level, the brightness level can automatically adjust proportionally relative to any change (i.e., increase and/or decrease) in ambient light level. Similarly, when the ambient light is higher than the high ambient light preferred brightness, the brightness level can automatically adjust (i.e., increase and/or decrease) proportionally with any change in ambient light level.

FIG. 10A depicts the low ambient light preference 1005 and the high ambient light preference 1010 such that each selected preference is higher than the available ambient light.

FIG. 10B depicts the user selection of low ambient light preference 1015 lower than the available ambient light and the selection of high ambient light preference 1020 higher than the available ambient light.

FIG. 10C depicts an example of the user selecting a low ambient light preference 1025 lower than 5% of screen brightness and a high ambient light preference 1030 higher than the available ambient light. In other words, FIGS. 10A-10C can show that the user can provide 1 or 2 custom inputs. For example, the user can make a manual light brightness change while the ambient light detected is in the 0-50% range. Alternatively, or additionally, the user can make a manual light brightness change while the ambient light detected is in the 50-100% range. After one of both of these user inputs is provided, future automatic brightness adjustments can be based on ambient light. For example, if the default system behavior is to set light brightness to 25% when ambient light is 25%, but the user manually adjusted light brightness to 45% when ambient light was 25%, then in the future, automatic light brightness will be set to 45% when ambient light is 25%. An alternate, and/or additional, user input on light brightness could be provided while ambient light is in the 50-100% range. In order to maintain a visually smooth transition between all light brightness and ambient light combinations, the rate of brightness change increases or decreases accordingly to intersect the points representing the user inputs. This can be represented by the angles of the segments of the solid line between 0%, the first user input (1005, 1015, 1025), the second user input (1010, 1020, 1030), and 100%. The dotted diagonal line can represent the default system behavior when no custom user inputs were provided.

Figure 11B:
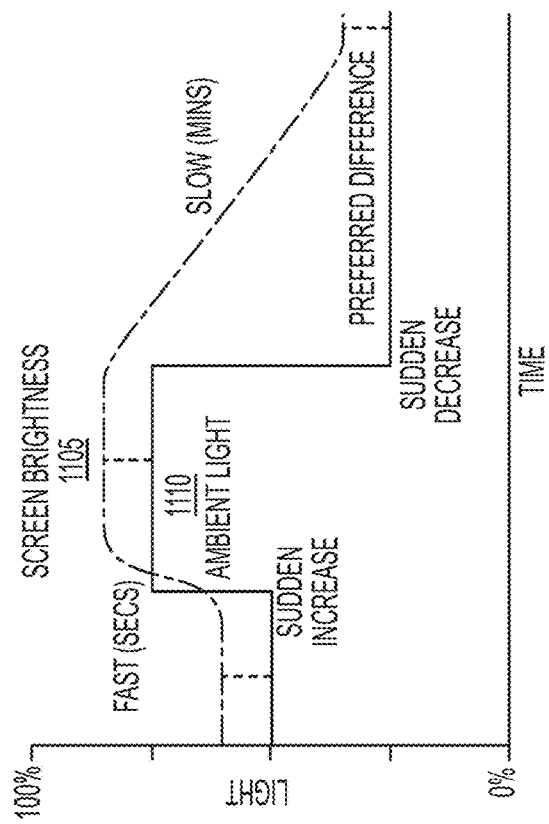
FIG. 11A and FIG. 11B depict examples of an auto-brightness feature in response to slow or sudden changes in ambient light level according to one or more aspects of the disclosed subject matter.
Figure 11A:
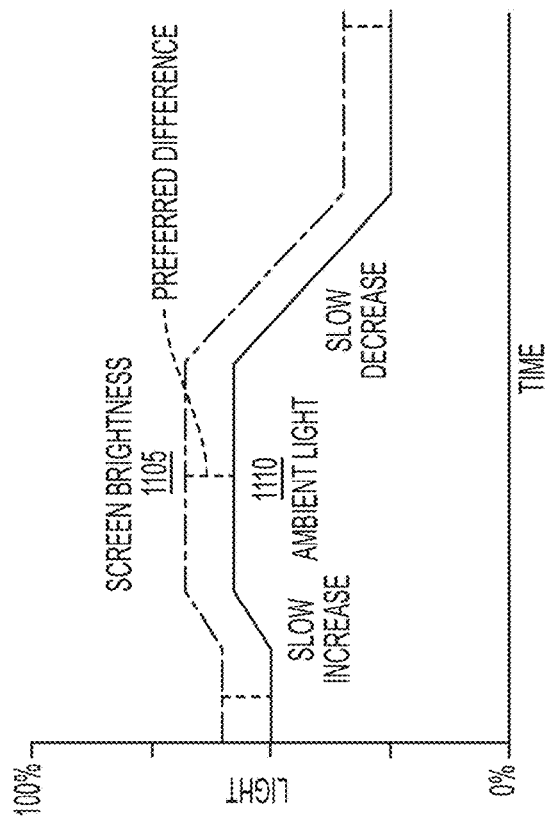

FIG. 11A and FIG. 11B depict examples of an auto-brightness feature in response to slow or sudden changes in ambient light level according to one or more aspects of the disclosed subject matter. When the change in ambient light is slow, either increasing or decreasing, the relative screen brightness 1105 can be adjusted automatically relative to the change in ambient light 1110. However, in an event where the change in ambient light 1110 is sudden and greater than a predetermined amount of change in less than a predetermined amount of time, one or more samples from the ambient light sensor can be averaged for a smooth brightness transition. For example, if the change in ambient light 1110 is an increase greater than a predetermined amount, the brightness can be increased in response. The brightness increase can occur over a number of seconds. Alternatively, if the change in ambient light is a sudden decrease greater than a predetermined amount, the change in brightness can be slower, such as minutes rather than seconds. For example, the increase can be 10% per second, whereas the decrease can be 10% per minute.

FIG. 11A depicts a slow increase and decrease in ambient light 1110.

FIG. 11B depicts a sudden increase and decrease in ambient light 1110.

Figure 12A:
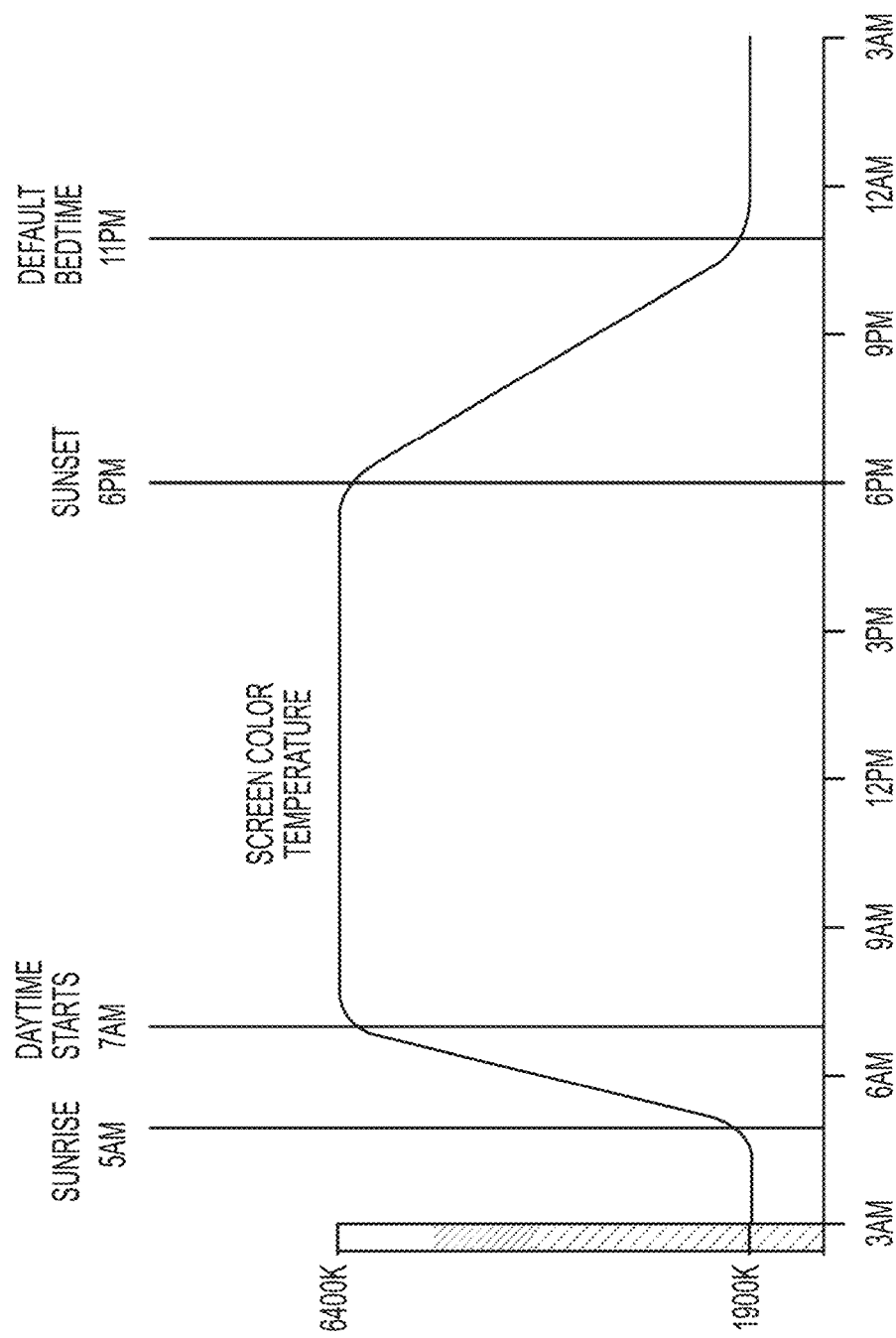
FIGS. 12A, 12B, and 12C depict examples of automated screen color temperature control based on a time of day according to one or more aspects of the disclosed subject matter.
Figure 12B:
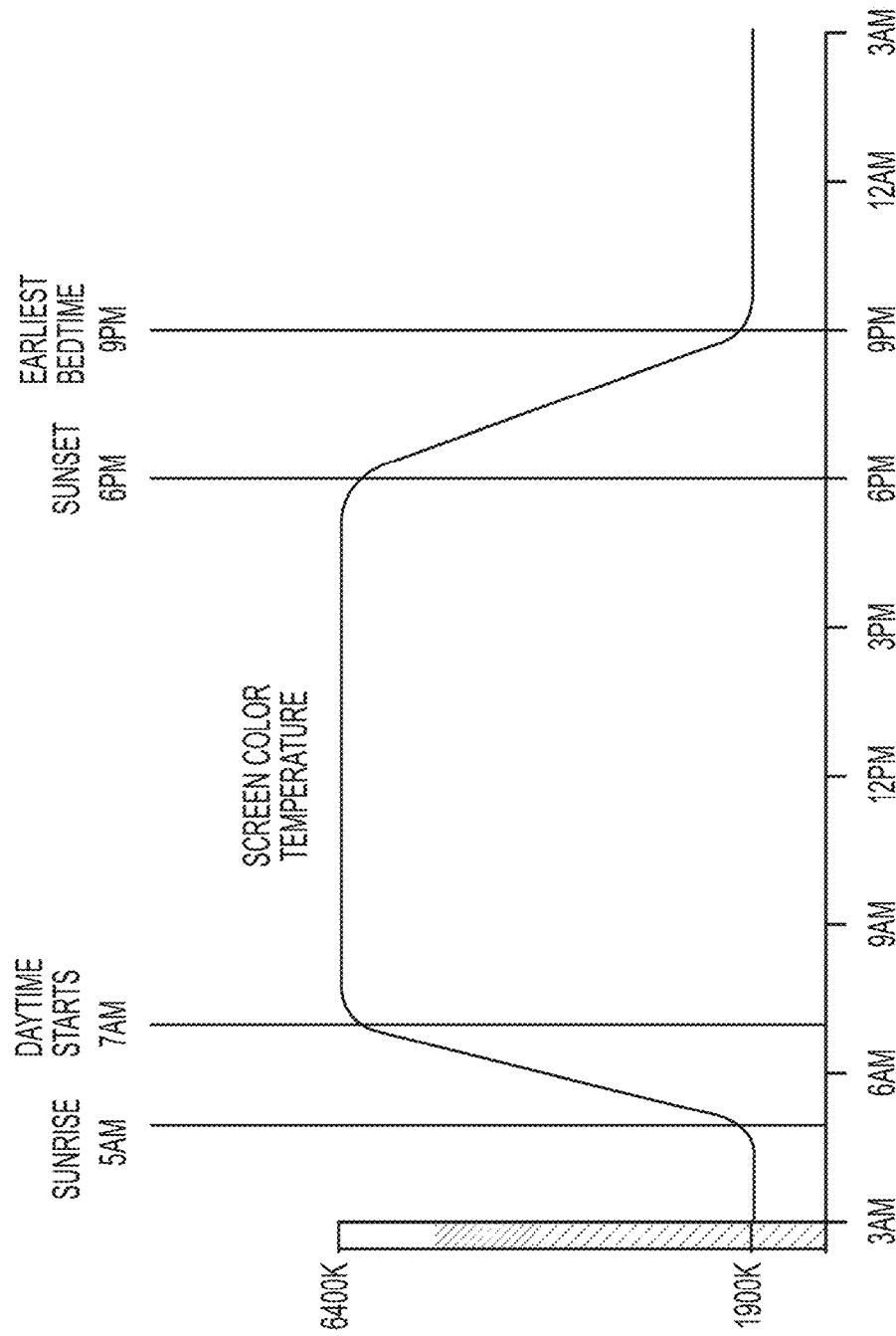
Figure 12C:
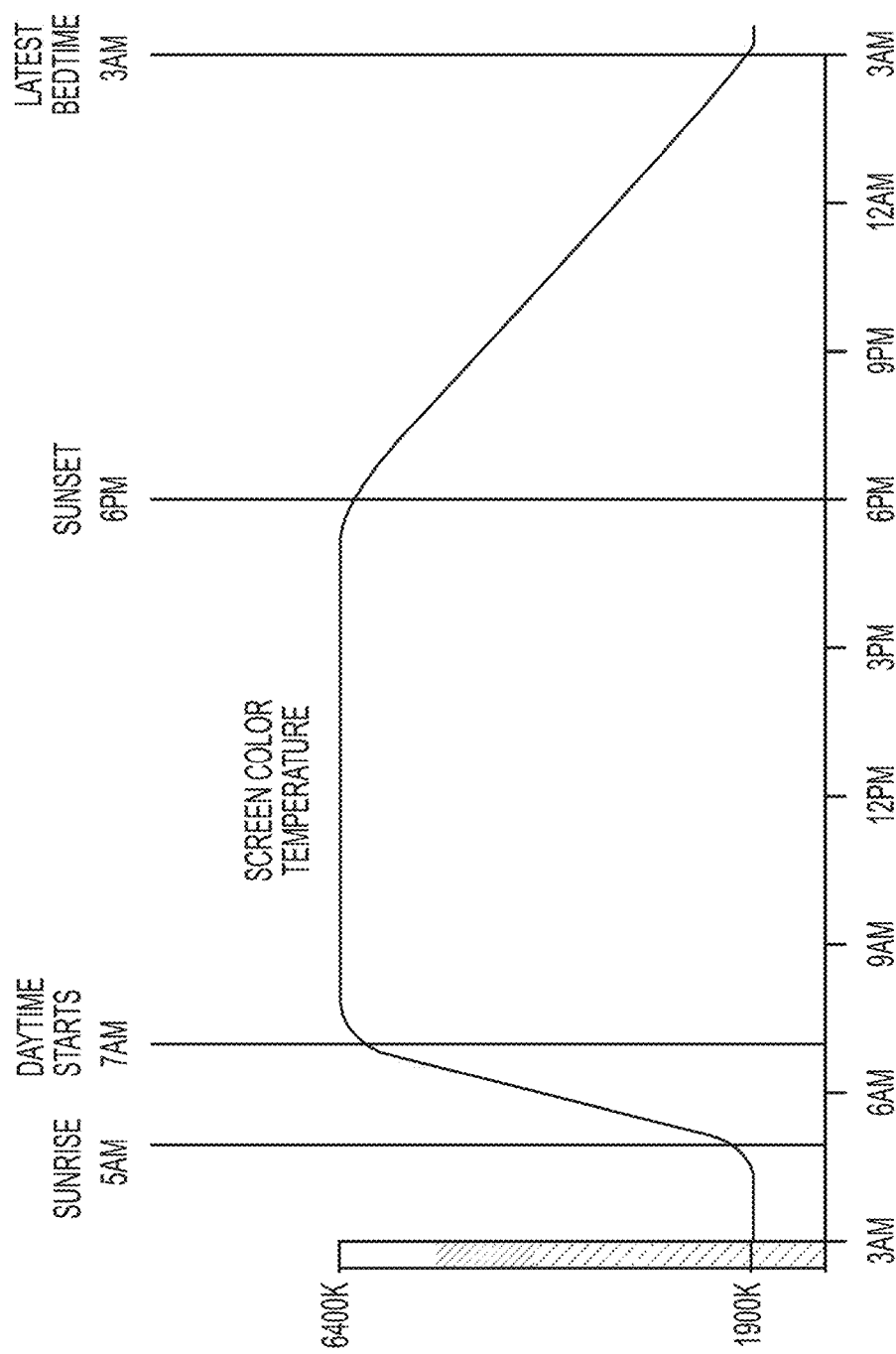

FIGS. 12A-12C depict examples of automated screen color temperature control based on a time of day according to one or more aspects of the disclosed subject matter. The automated screen color temperature control can include phases. The phases can include a night phase, a sunrise transition phase, a daytime phase, and a sunset transition phase. The night phase can range from a selected bedtime to the beginning of the sunrise transition phase (e.g., 5:00 AM) and can have a default screen color temperature of 1900K. A screen color temperature of 1900K can correspond to candlelight, for example. The sunrise transition phase can range from 5:00 AM to 7:00 AM, for example, and can transition the screen color temperature from 1900K to 6400K at a predetermined rate of change. The daytime phase can range from 7:00 AM to 6:00 PM and can have a default screen color temperature of 6400K. A screen color temperature of 6400K can correspond to sunlight, for example. The sunset transition phase can range from 6:00 PM to the selected bedtime, wherein a default bedtime is 11:00 PM, and can transition the screen color temperature from 6400K (sunlight) to 1900K (candlelight). Although, a screen color temperature of 1500K is available to be selected on the slider from FIG. 14, the automated screen color temperature can be configured to not display a screen color temperature below 1900K automatically. In one aspect, the times of the sunrise transition and the sunset transition can change as the sunrise and sunset changes through the year based on the user's location. Alternatively, or additionally, the default times for the sunrise transition and the sunset transition can remain the same throughout the year regardless of when the sun rises and sets at the user's location. Additionally, another example of the automated screen color temperature control includes a user adjusting the default bedtime. For example, if the user selects an earlier bedtime (e.g., adjusts from 11:00 PM to 9:00 PM), the speed of the sunset transition phase can increase. Alternatively, if the user selects a later bedtime (e.g., adjusts from 11:00 PM to 3:00 AM), the speed of the sunset transition phase can decrease.

FIG. 12A depicts a default scenario for automated screen color temperature control. For example, the default bedtime can be 11:00 PM.

FIG. 12B depicts a scenario in which the user adjusts the bedtime from the previous bedtime (e.g., 11:00 PM) to an earlier bedtime (e.g., 9:00 PM), which corresponds to an increase in the transition from sunlight (6400K) to candlelight (1900K).

FIG. 12C depicts a scenario in which the user adjusts the bedtime from the previous bedtime (e.g., 9:00 PM, 11:00 PM) to a later bedtime (e.g., 3:00 AM), which corresponds to a decrease in the speed of the transition from sunlight (6400K) to candlelight (1900K).

Figure 13A:
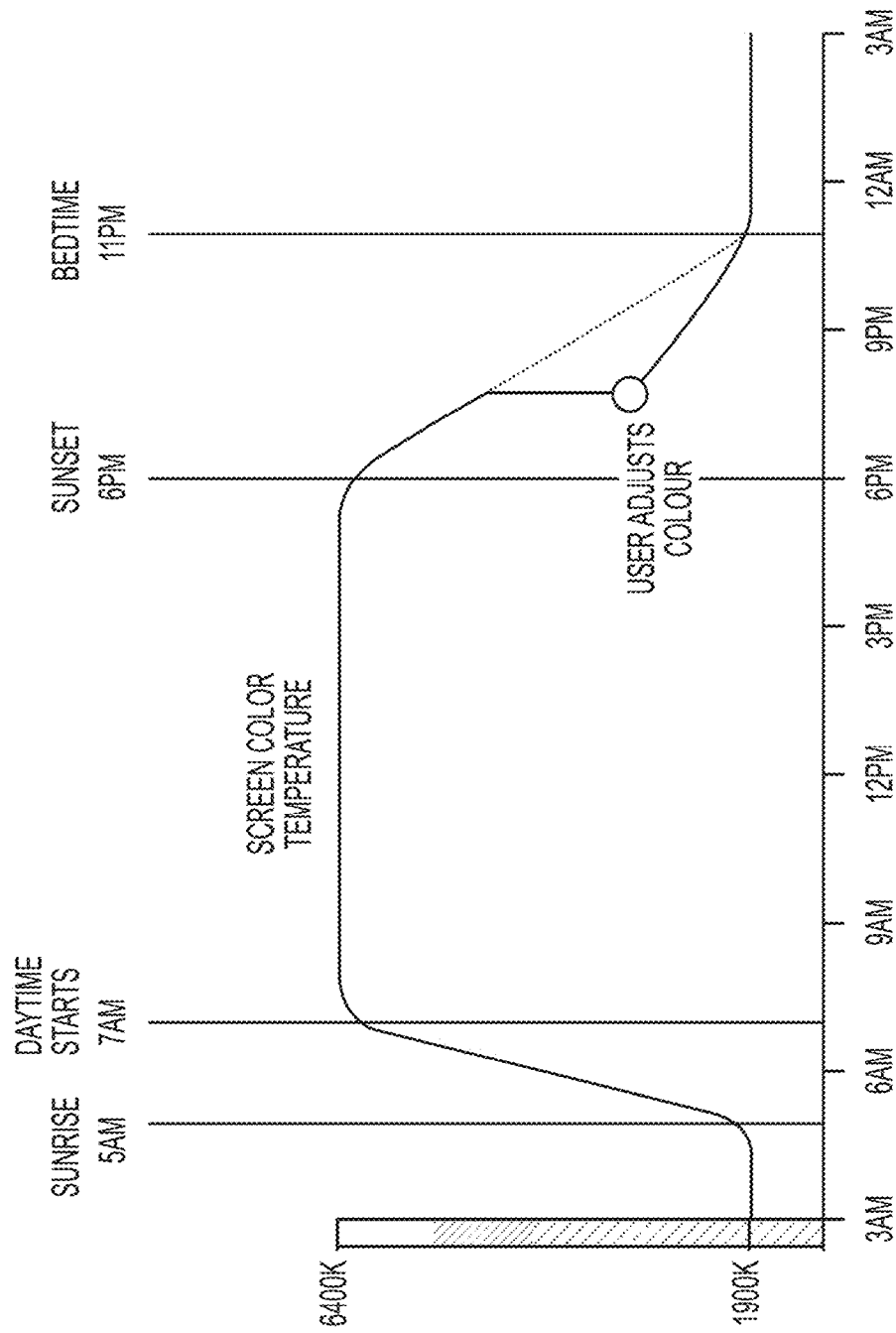
FIGS. 13A, 13B, and 13C depict examples of automated screen color temperature control in response to a user manually adjusting a screen color temperature during a sunset transition phase according to one or more aspects of the disclosed subject matter.
Figure 13B:
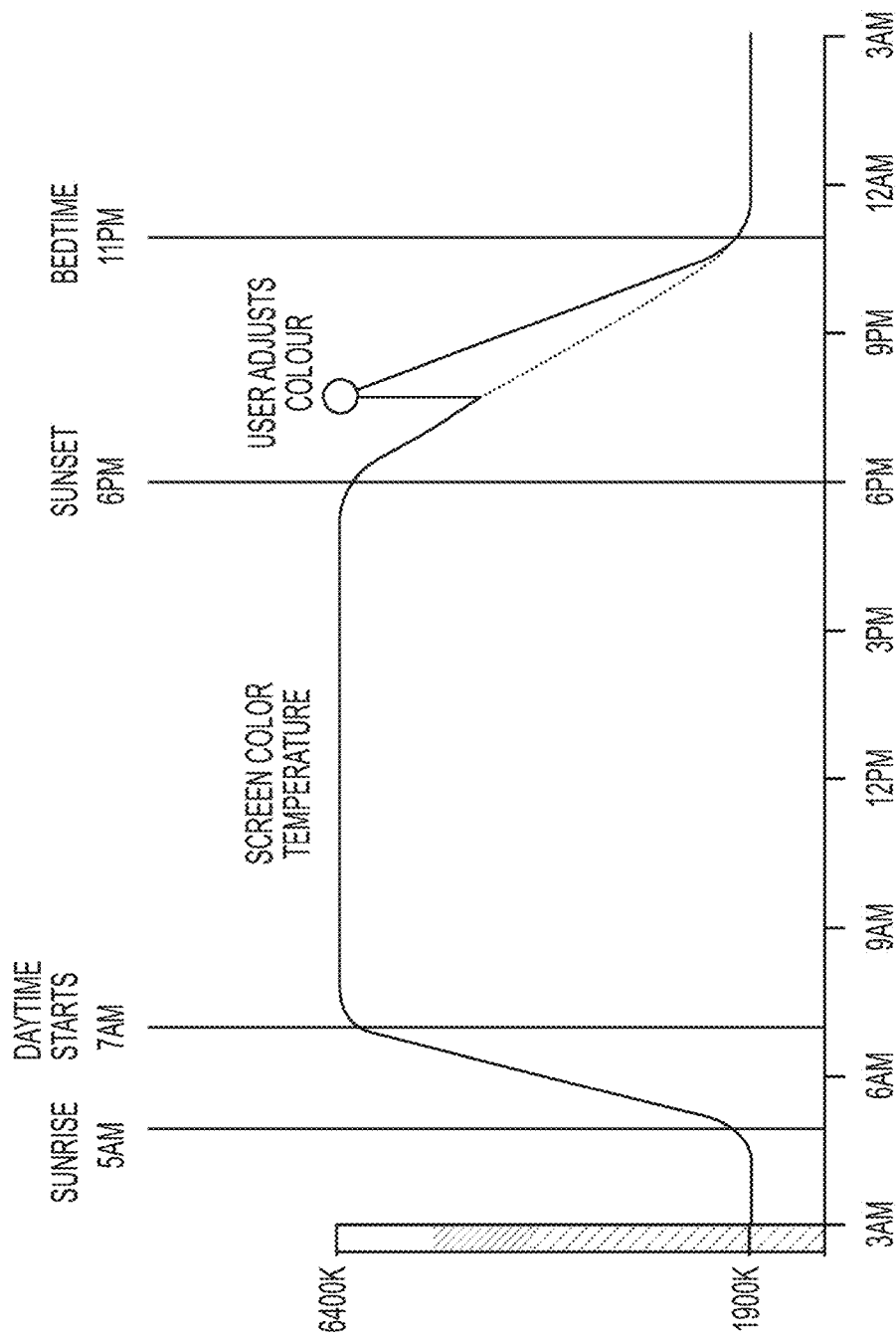
Figure 13C:
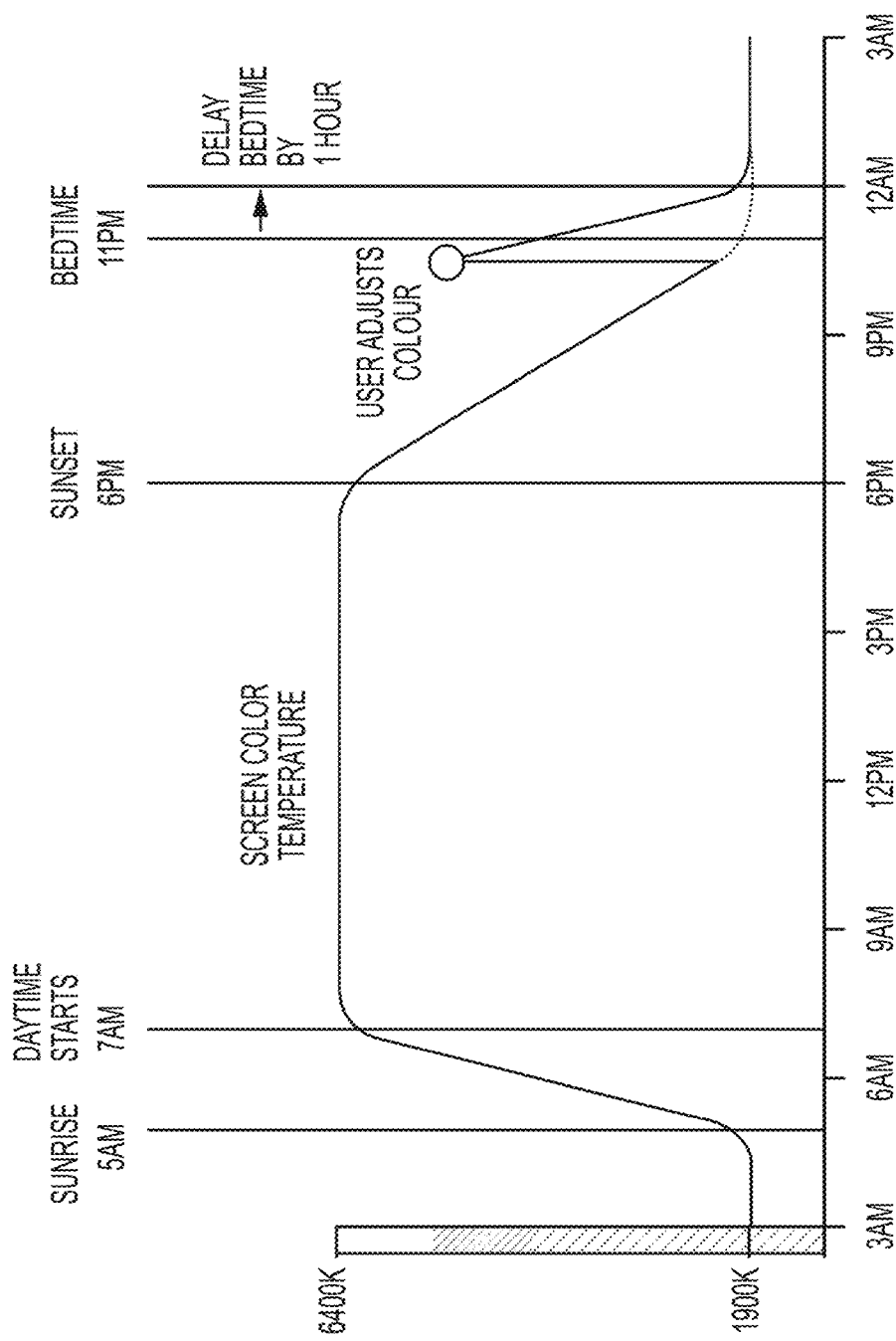

FIGS. 13A-13C depict examples of automated screen color temperature control in response to a user manually adjusting a screen color temperature during a sunset transition phase according to one or more aspects of the disclosed subject matter. When the user manually adjusts the screen color temperature to a higher screen color temperature or a lower screen color temperature during the sunset transition phase, the sunset transition can continue from the manually adjusted screen color temperature. Additionally, when the user manually adjusts the screen color temperature during the sunset transition phase within an hour of the bedtime (default or selected), the bedtime can be delayed by one hour, and the sunset transition can continue from the manually adjusted screen color temperature.

FIG. 13A depicts a scenario in which the user has the bedtime set to 11:00 PM and the user adjusts the screen color temperature down at 7:30 PM (or any time earlier than within one hour of the bedtime), which corresponds to the sunset transition phase continuing to candlelight (1900K) from the user's adjusted screen color temperature. The user's adjusted screen color temperature may not be stored as a preferred setting. In other words, the adjusted screen color temperature will not be remembered by the device 110 the next day.

FIG. 13B depicts a scenario in which the user has the bedtime set to 11:00 PM and the user adjusts the screen color temperature up at 7:30 PM (or any time earlier than within one hour of the bedtime), which corresponds to the sunset transition phase continuing to candlelight (1900K) from the user's adjusted screen color temperature. The user's adjusted screen color temperature may not be stored as a preferred setting. In other words, the adjusted screen color temperature will not be remembered by the device 110 the next day.

FIG. 13C depicts a scenario in which the user has the bedtime set to 11:00 PM and the user adjusts the screen color temperature up at 10:30 PM (or any time within one hour of the selected bedtime), which corresponds to delaying the bedtime for one hour (e.g., from 11:00 PM to 12:00 AM) and continuing the transition to candlelight (1900K) from the user's selected screen color temperature. The user's adjusted screen color temperature and delayed bedtime may not be stored as a preferred setting. In other words, the adjusted screen color temperature and delayed bedtime will not be remembered by the device 110 the next day.

Figure 14A:
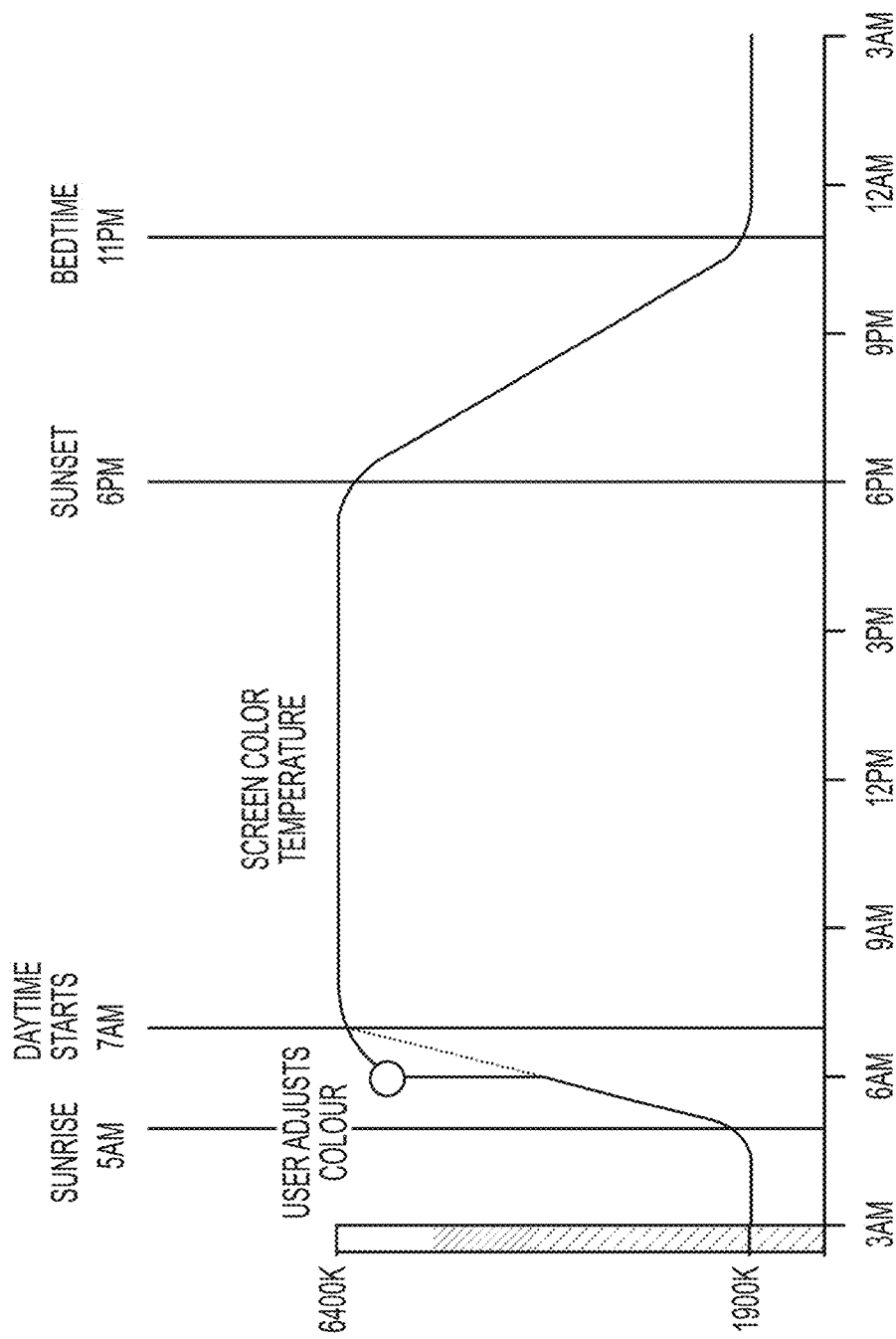
FIG. 14A and FIG. 14B depict examples of automated screen color temperature control in response to a user manually adjusting a screen color temperature during a sunrise transition phase according to one or more aspects of the disclosed subject matter.
Figure 14B:
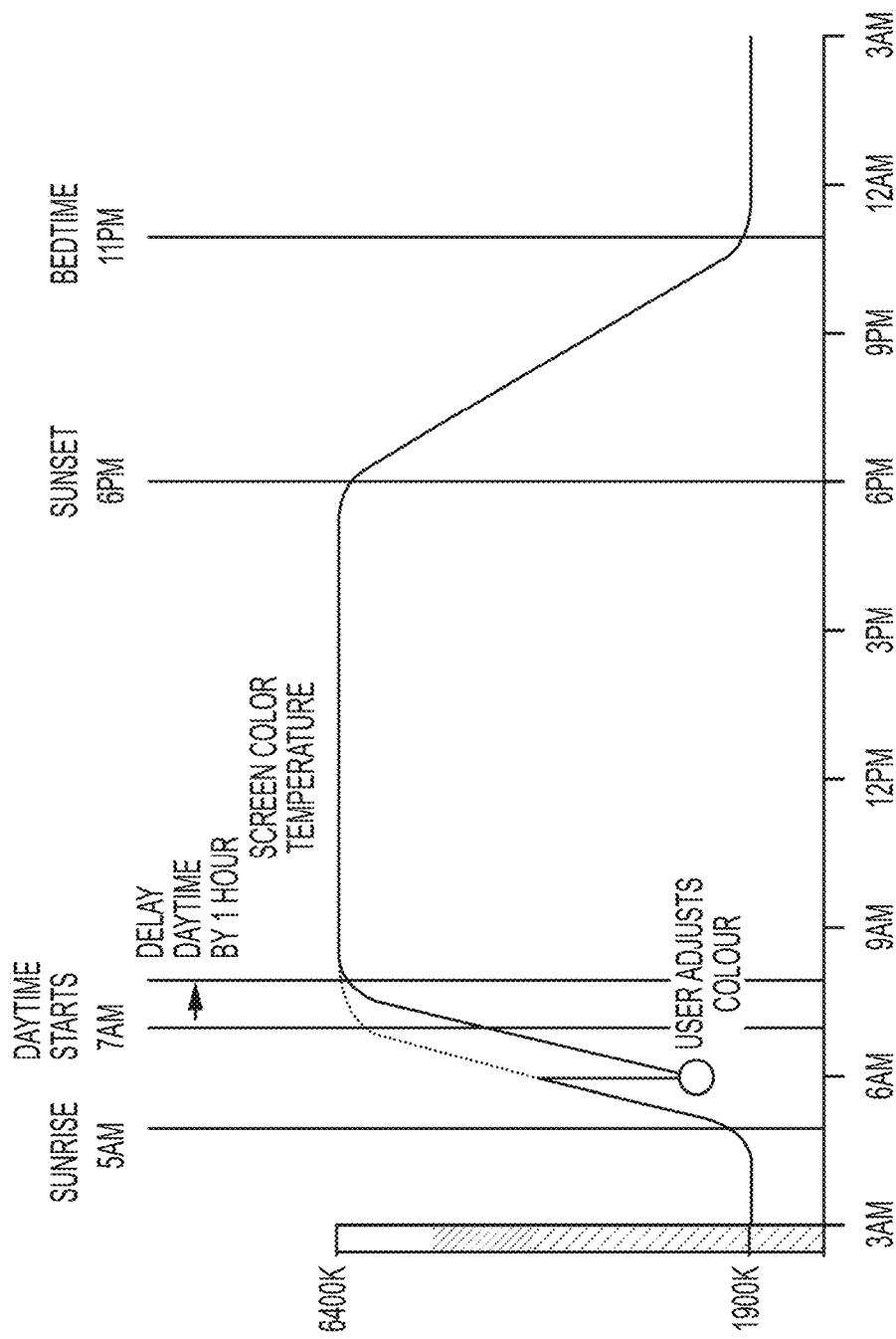

FIG. 14A and FIG. 14B depict examples of automated screen color temperature control in response to a user manually adjusting a screen color temperature during a sunrise transition phase according to one or more aspects of the disclosed subject matter. When the user manually adjusts the screen color temperature to a higher screen color temperature during the sunrise transition phase, the sunrise transition can continue from the manually adjusted screen color temperature. When the user manually adjusts the screen color temperature to a lower screen color temperature any time during the sunrise transition phase, the beginning of the daytime phase can be delayed for one hour, and the sunrise transition can continue from the manually adjusted screen color temperature.

FIG. 14A depicts a scenario in which the user adjusts the screen color temperature up at 6 AM (or any time during the sunrise transition), which corresponds to the sunrise transition continuing to daylight (6400K) from the user's adjusted screen color temperature. The user's adjusted screen color temperature may not be stored as a preferred setting. In other words, the adjusted screen color temperature will not be remembered by the device 110 the next day.

FIG. 14B depicts a scenario in which the user adjusts the screen color temperature down at 6 AM (or any time during the sunrise transition), which corresponds to delaying the daytime phase for one hour (e.g., from 7:00 AM to 8:00 AM) and continuing the sunrise transition to daylight (6400K) from the user's adjusted screen color temperature. The user's adjusted screen color temperature and delayed start of the daytime phase may not be stored as a preferred setting. In other words, the adjusted screen color temperature and the delayed start of the daytime phase will not be remembered by the device 110 the next day.

FIG. 15A depicts automated screen color temperature control in response to a user manually adjusting a screen color temperature during a daytime phase according to one or more aspects of the disclosed subject matter. When the user manually adjusts the screen color temperature during the daytime phase, the manually adjusted screen color temperature is maintained through the rest of the daytime phase. Additionally, the starting point of the screen color temperature for the sunset transition phase is the manually adjusted screen color temperature from the daytime phase. The user's adjusted screen color temperature may not be stored as a preferred setting. In other words, the adjusted screen color temperature will not be remembered by the device 110 the next day.

Figure 15B:
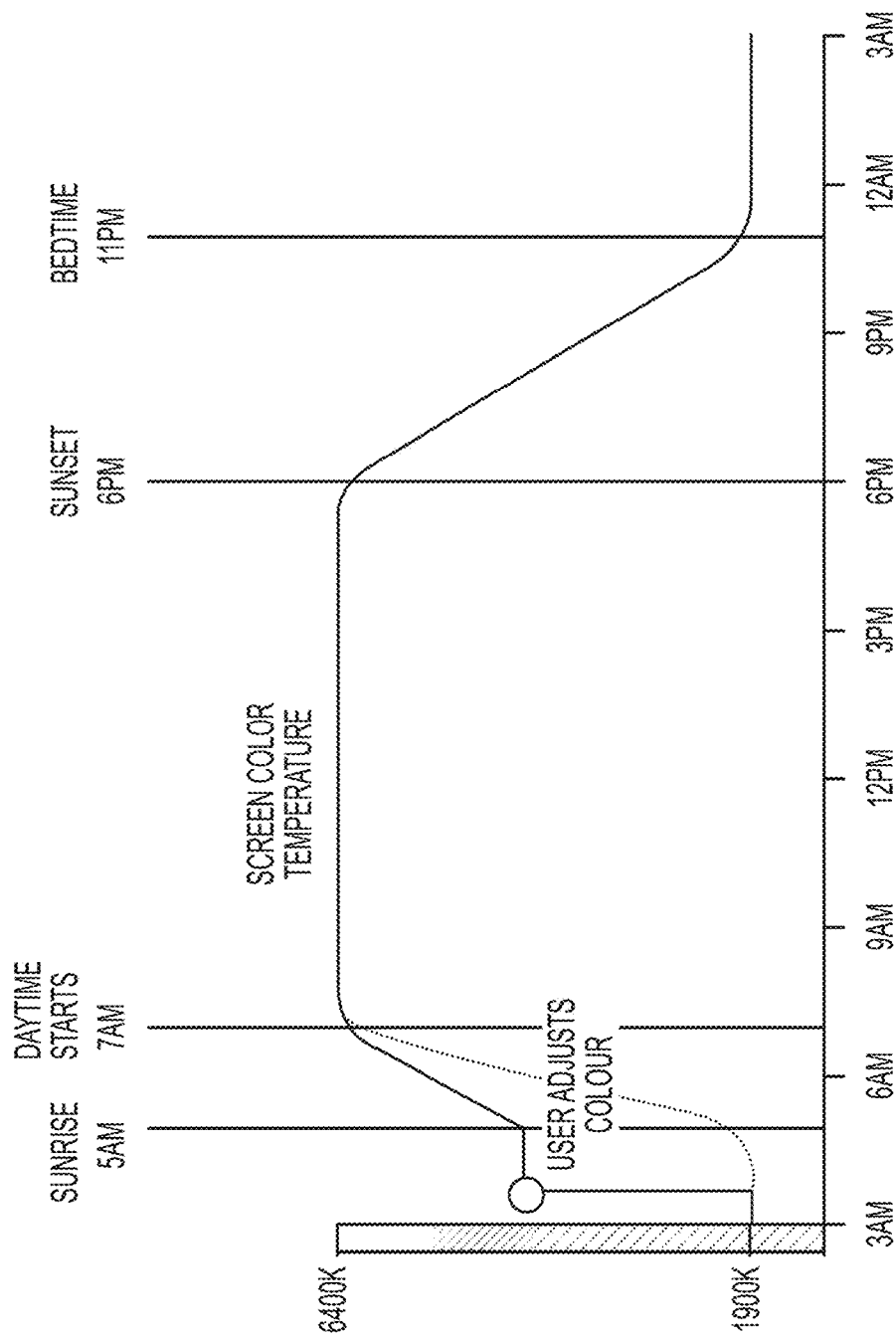
FIG. 15B depicts automated screen color temperature control in response to the user manually adjusting the screen color temperature during the night phase according to one or more aspects of the disclosed subject matter.

FIG. 15B depicts automated screen color temperature control in response to the user manually adjusting the screen color temperature during the night phase according to one or more aspects of the disclosed subject matter. When the user manually adjusts the screen color temperature during the night phase, the manually adjusted screen color temperature is maintained until the sunrise transition, for which the starting point of the sunrise transition can be the manually adjusted screen color temperature. The user's adjusted screen color temperature may not be stored as a preferred setting. In other words, the adjusted screen color temperature will not be remembered by the device 110 the next day.

Figure 16:
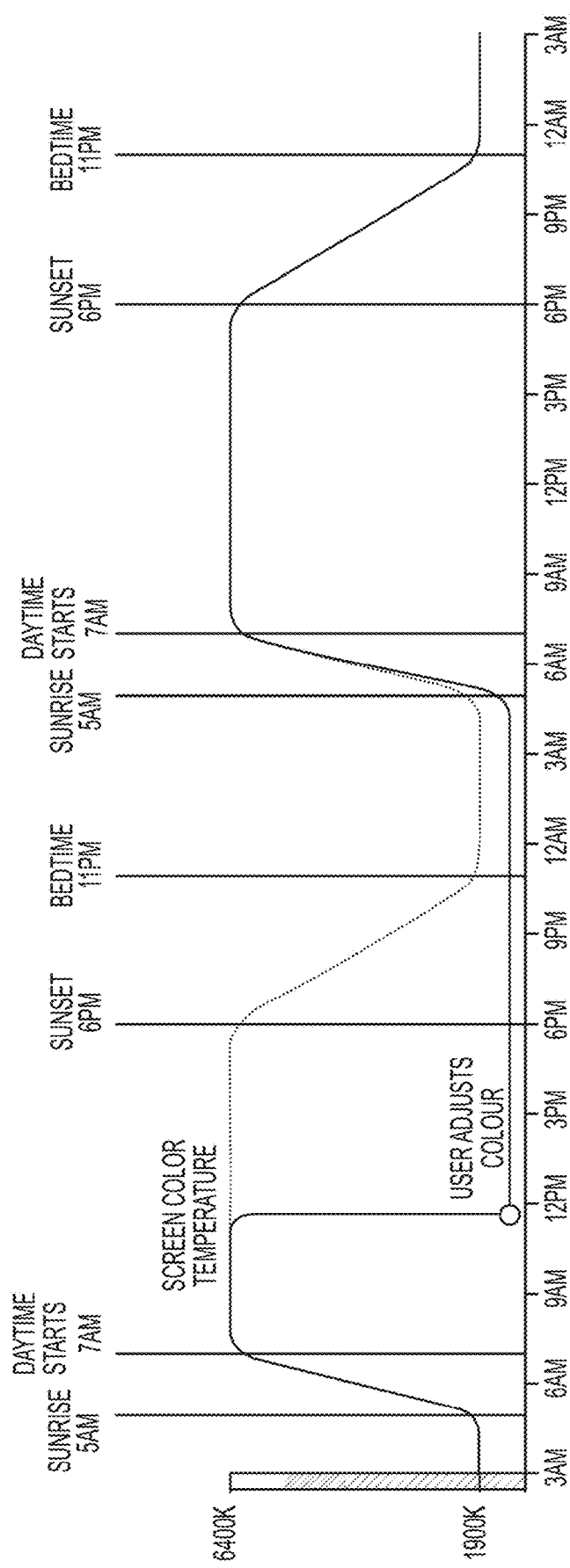
FIG. 16 depicts an example of automated screen color temperature control in response to a user manually adjusting a screen color temperature to less than 1900K any time of day according to one or more aspects of the disclosed subject matter.

FIG. 16 depicts an example of automated screen color temperature control in response to a user manually adjusting a screen color temperature to less than 1900K any time of day according to one or more aspects of the disclosed subject matter. When the user manually adjusts the screen color temperature to less than 1900K, the manually adjusted screen color temperature is maintained until the next sunrise transition regardless of the time of day that the user manually adjusts the screen color temperature to less than 1900K.

Figure 17:
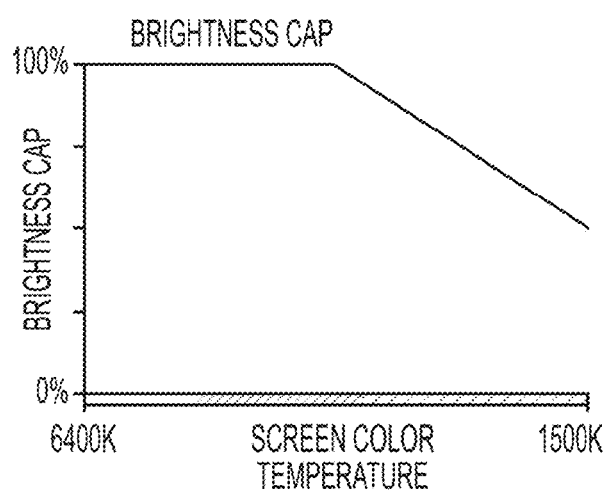
FIG. 17 depicts capping brightness for lower screen color temperatures than 1900K any time of day according to one or more aspects of the disclosed subject matter.

FIG. 17 depicts capping brightness for lower screen color temperatures any time of day according to one or more aspects of the disclosed subject matter. As the screen color temperature is shifted toward 1500K, the available brightness range can be reduced to conserve battery. For example, lower screen color temperatures require less low-power white light to be displayed. In one aspect, the brightness range can remain full until the midpoint between 6400K and 1500K. When the screen color temperature is shifted below the midpoint between 6400K and 1500K, the brightness cap can decrease at a predetermine rate of change.

Figure 18:
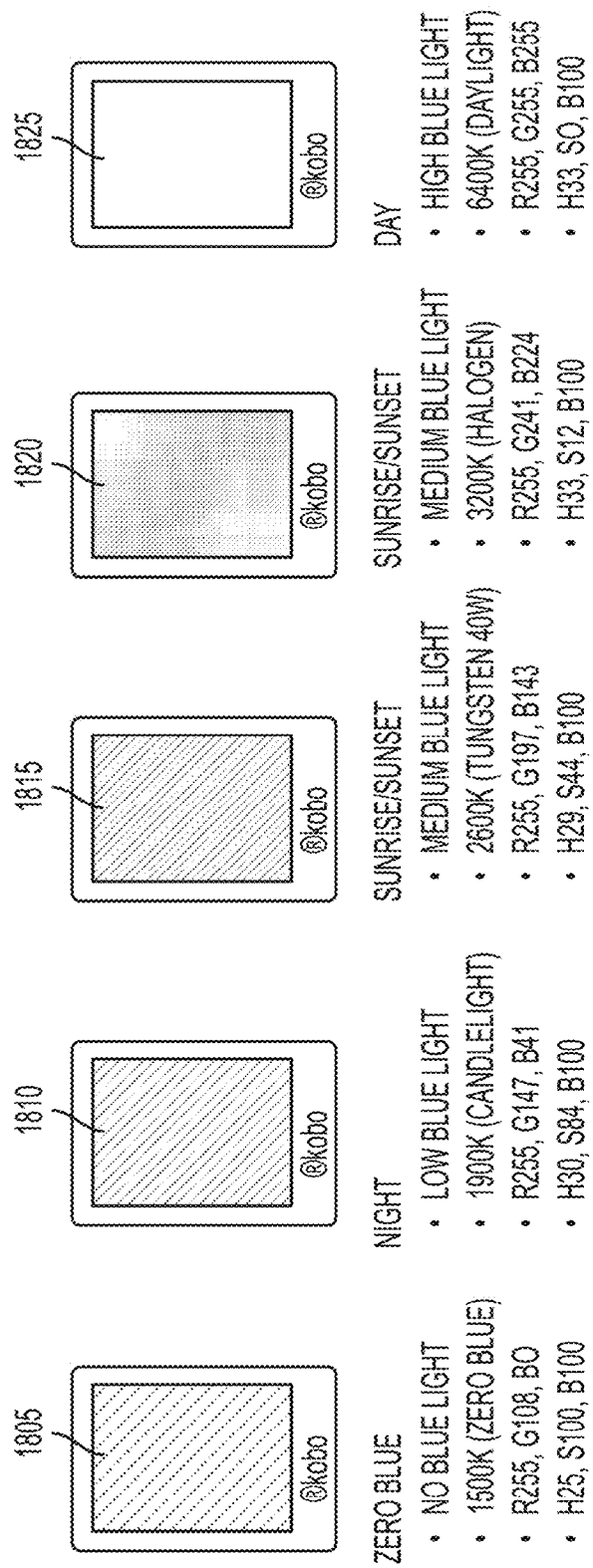
FIG. 18 depicts exemplary screen color temperatures and corresponding RGBW values to be displayed via an adjustable RGBW front light according to one or more aspects of the disclosed subject matter.

FIG. 18 depicts exemplary screen color temperatures and corresponding RGBW values to be displayed via an adjustable RGBW front light according to one or more aspects of the disclosed subject matter. Display 1805 can correspond to no blue light. Display 1810 can correspond to low blue light. Display 1815 can correspond to a first medium blue light. Display 1820 can correspond to a second medium blue light. Display 1825 can correspond to high blue light.

FIG. 19A-FIG. 19D illustrates examples of an e-book device that can vary a state of illumination for light that is cast on its display screen according to one or more aspects of the disclosed subject matter. In particular, FIG. 19A through FIG. 19D illustrate an e-book device 1900, in accordance with examples such as provided by FIG. 2, FIG. 3A, FIG. 3B, FIG. 9, and FIG. 33 having a display screen 1910 on which illumination from an independent source such as a front light is provided.

Figure 19A:
FIGS. 19A, 19B, 19C, and 19D illustrates examples of an e-book device that can vary a state of illumination for light that is cast on its display screen according to one or more aspects of the disclosed subject matter.
Figure 19B:
Figure 19C:
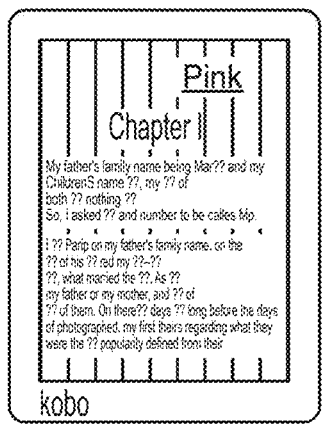
Figure 19D:
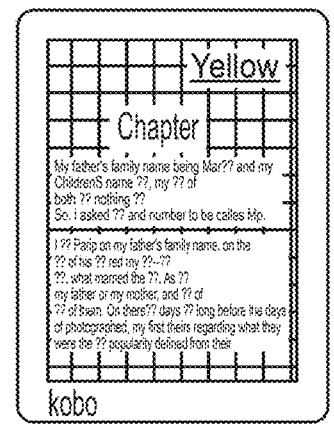

In examples of FIG. 19A through FIG. 19D, the state of illumination provided by, for example, the front light as described herein is changed to reflect different colors. Thus, the color state of the illumination can vary, for example, between green (FIG. 19A), blue (FIG. 19B), pink (FIG. 19C), and yellow (FIG. 19D). In one example, the front light can be illuminated in response to a first event or condition. As an alternative or variation, the front light can be illuminated and then changed in color or other appearance. By way of illustration, the change in color to the front light can reflect (i) a progress of the user in reading the e-book (e.g., the portion of the e-book that the user is completed), (ii) a preference or setting of the user, (iii) the occurrence of a particular page or portion of the e-book being rendered, (iv) a direct input from the user specifying a particular color or state for the front light, and/or (v) an environmental or exterior condition, such as time of day (e.g., nighttime may be blue etc.) or temperature of the environment.

While some examples provide for the front light to alter the color of the illumination, other implementations may change the warmth of the illumination. For example, cold illumination may refer to light that includes more white, creating a starker contrast. The illumination provided on the display 1910 can vary between cold and warm depending on, for example, temperature or time of day. Numerous examples of described herein as to triggers can alter the state of the front light, in addition to those provided with FIG. 19A through FIG. 19D.

Furthermore, numerous examples are described herein in the context of e-books and even reading activities. While such examples may employ display assemblies (e.g., electronic paper type displays) that have specific benefit from an independent or separate illumination component, other examples described herein provide for the use of illumination components for other kinds of computing devices, such as those devices was generate content through an LCD or LED type display. Still further, the use of independent illumination components that can change states can be applied to mechanical surfaces and features of competing devices, including those that employ keyboards, button sets or touch surfaces. Thus, for example, the front light components described with various examples can illuminate or cast light on to hardware features, such as keyboards.

FIG. 20 depicts an exemplary table where a range of brightness levels can have corresponding RBGW values for a specific screen color temperature to display the screen color temperature consistently at any brightness level according to one or more aspects of the disclosed subject matter. In other words, the goal can be to maintain a consistent color temperature when mixing RGBW light at different brightness settings. If only the brightness of all the RGBW lights is changed at the same time, the same color mixture could not be maintained as the different component lights behave differently at different power levels. By individually modulating the brightness of each light according to the table, the same color at different brightness levels can be maintained. The values in the cells of the table represent percentages of each channel of Red, Green, Blue, and White. For example, "50,25,0,30" can correspond to 50% red intensity, 25% green intensity, 0% blue intensity, and 25% white intensity. The table is intended to be exemplary and can include more brightness percentages (ranging from 0% to 100%), more screen color temperatures (ranging from 1500K to 6400K), and the corresponding RBGW values for each cell of the table. In another example, the screen color temperature automatically changes throughout the day based on the time of day and various user inputs, but the how the screen color temperature appears visually will not be affected by the brightness level. More specifically, when the brightness level is adjusted, the screen color temperature can remain the same visually by updating the RGBW values that correspond to the adjusted brightness level. For example, if the screen temperature color is at 1500K and the brightness level is at 50%, the RGBW values are R=201, G=137, B=0, and W=0. Then, to display the same screen color temperature of 1500K when the brightness level is adjusted to 100%, the RGBW values are R=228, G=164, B=0, and W=0.

Figure 21:
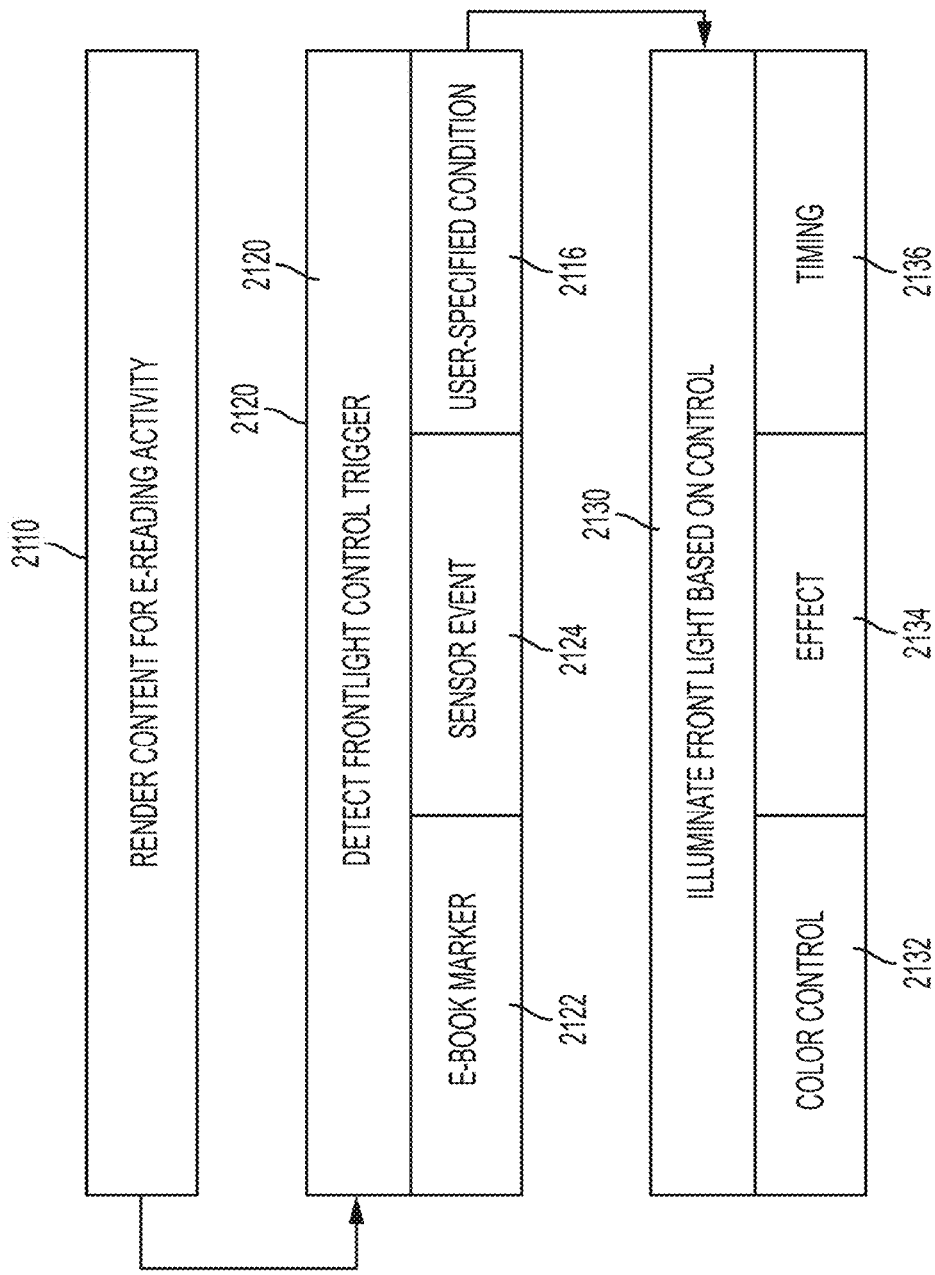
FIG. 21 illustrates an exemplary method for controlling a state of an illumination component that is provided to cast light onto a display surface of an e-reader device according to one or more aspects of the disclosed subject matter.

FIG. 21 illustrates an exemplary method for controlling a state of an illumination component that is provided to cast light onto a display surface of an e-reader device according to one or more aspects of the disclosed subject matter. An example method such as provided by FIG. 21 can be implemented using components such as described with examples of FIG. 2, FIG. 3A, FIG. 3B, FIG. 9, and FIG. 33. Accordingly, reference may be made to elements of other figures for purpose of illustrating a suitable component for performing a step or sub step being described.

With reference to FIG. 21, e-reader device 110 can render content for the reading activity (410). For example, the e-book device 110 can render content corresponding to a page (or to a set of pages) of an e-book that is in use. As another example, the rendered content can include metadata content, representing for example, graphical images of e-books or other content items (e.g., music albums) that are associated with a particular device.

While the content is rendered, a front light trigger can be detected (2120). The front light trigger can be implemented as an e-book marker, which can, for example, correspond to a programmatically generated trigger, such as a software implemented trigger that is associated with a condition or event of an e-book (or e-book activity) (2122). As such, e-book marker is a trigger that is associated with, for example, a particular e-book (e.g., a user selects a particular e-book, or starts reading a new e-book), a page of an e-book, a section of an e-book, individual words (e.g., a particular word is present on a page of an e-book), and/or activities performed by the user in connection with rendered content of the e-book (e.g., the user puts a placeholder on a particular page while searching).

As an alternative or addition, the front light trigger can correspond to a sensor event (2124). The sensor event can correspond to a particular sensor reading, such as provided by a temperature or ambient light sensor or of the e-reader device 110. The sensor interface 918 can, for example, provide sensor readings to the front light control component 916, which in turn interprets the sensor readings as triggers.

As another alternative or addition, the front light trigger can be specified by user input or settings. For example, user input can trigger the change in the front light. The user input can also specify a change in state of the front light. Still further, the user input can provide a setting which specifies a condition or event which is to generate a front light control output to alter the state of the LEDs 209A, 209B. In some implementations, the user input can specify a front light effect for a particular reading session. Still further, the user input can define one or more programmatic triggers that are to cause a particular front light effect. In an example of FIG. 9, the user input for pre-defining the triggers can be provided through the front light interface 929, and stored with the data store 919.

Once the trigger is detected or otherwise provided, the front light can be controlled in a manner that is determined by the detected trigger (2130). In an example of FIG. 9, the control component 916 outputs a control signal to change a state of the front light (e.g., illuminate the front light, and/or illuminate the front light with a particular color or other characteristic). The input trigger can be correlated to the state of the front light based on a predetermined correlation and/or data embedded in the trigger. In this way, the front light can be controlled for color (2132), effect (2134) (such as blinking, fading, blinking in a pattern, etc.), and/or timing (2136) (e.g., the duration in which the state being signaled is to last).

Figure 22:
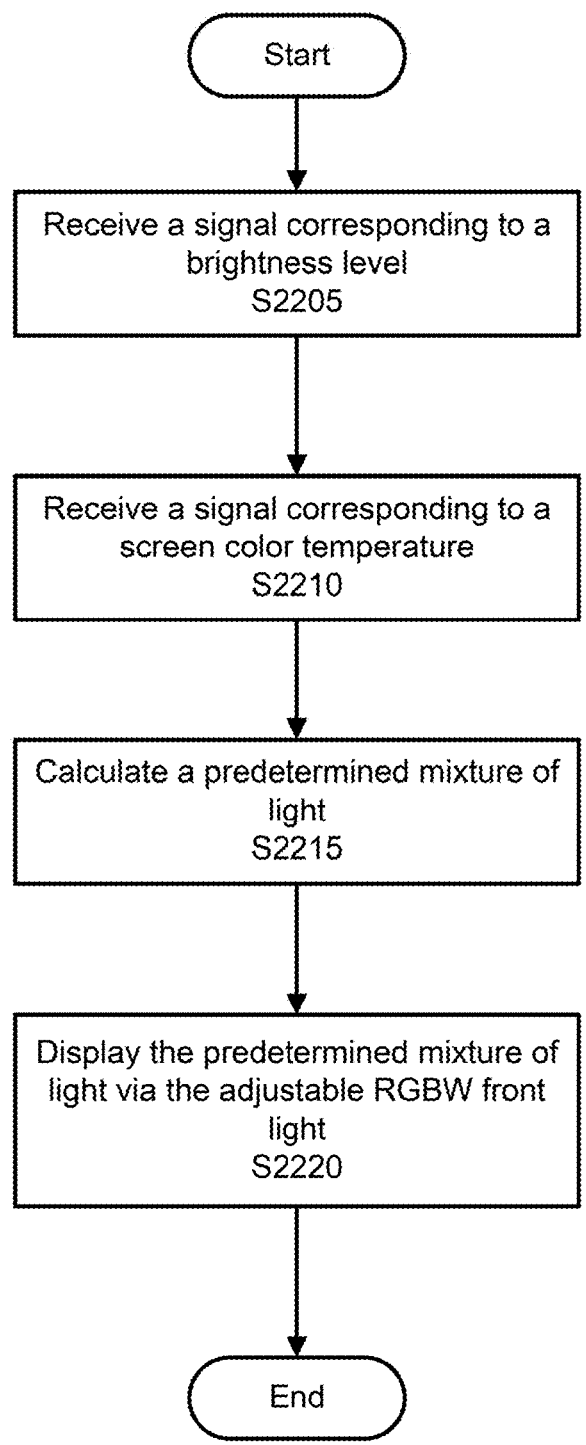
FIG. 22 is an algorithmic flow chart of a method for displaying a screen color temperature based on a brightness level according to one or more aspects of the disclosed subject matter.

FIG. 22 is an algorithmic flow chart of a method for displaying a screen color temperature based on a brightness level according to one or more aspects of the disclosed subject matter.

In S2205, a signal corresponding to a brightness level can be received in the system 900, for example. The brightness level can be based on an ambient light level determined by the ambient light sensor.

In S2210, a signal corresponding to a screen color temperature can be received in the system 900, for example. The screen color temperature can be determined based on a time of day, as well as various other factors including any manually adjusted screen color temperatures as further described herein.

In S2215, a predetermined mixture of light can be calculated. The predetermined mixture of light can be calculated using the table from FIG. 20, for example.

In S2220, the predetermined mixture of light can be displayed via the adjustable RGBW front light (e.g., front light 118, front lights 209A and/or 209B, etc.). The predetermined mixture of light can be displayed in real time via the adjustable RGBW front light such that a change in brightness is not apparent to the user as the screen color temperature remains the same. An advantage of the seamless transition is an improved user experience. When the predetermined mixture of light is displayed, the process can end.

Figure 23:
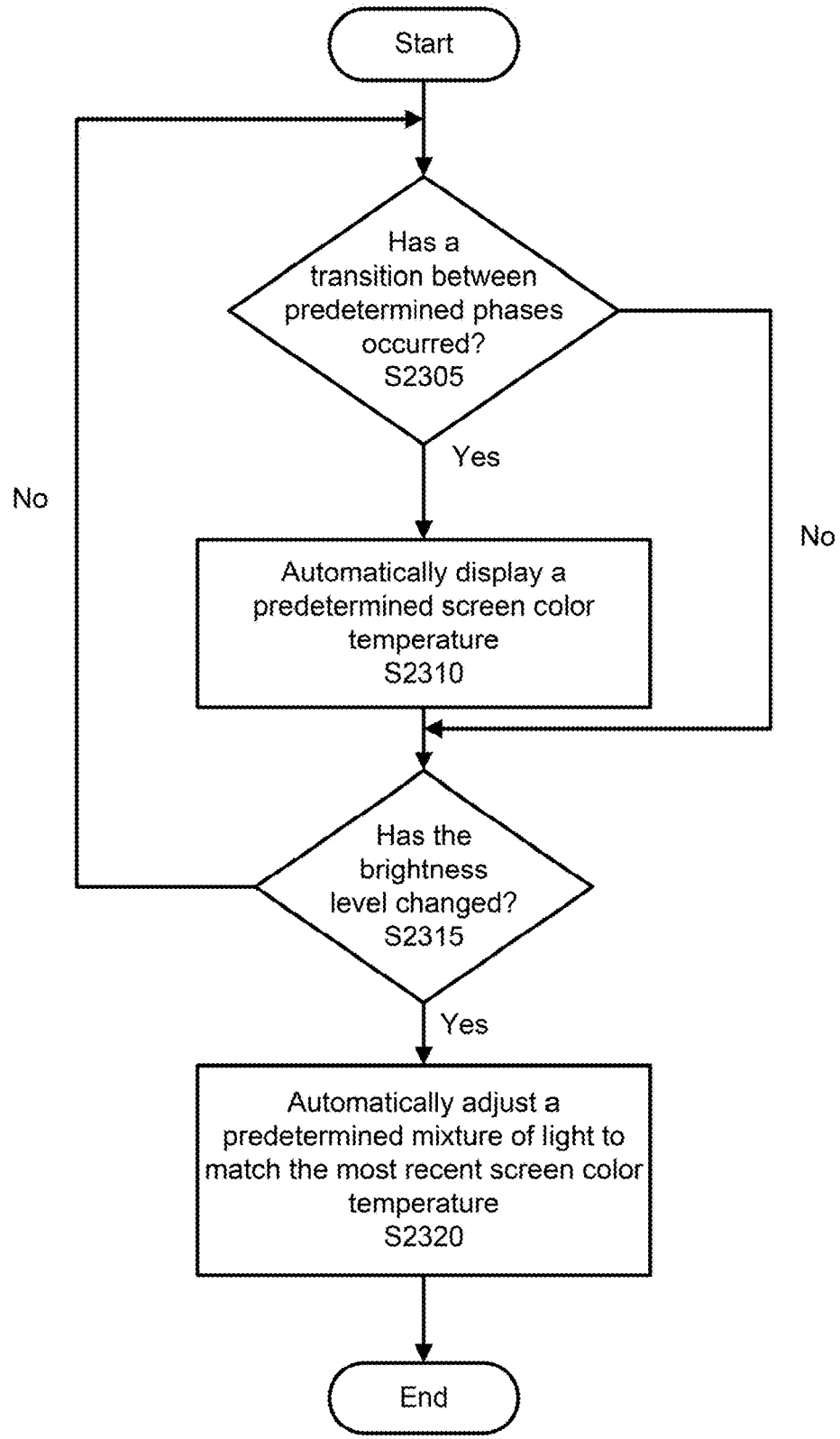
FIG. 23 is an algorithmic flow chart of a method for automatically adjusting the screen color temperature based on the time of day according to one or more aspects of the disclosed subject matter.

FIG. 23 is an algorithmic flow chart of a method for automatically adjusting the screen color temperature based on the time of day according to one or more aspects of the disclosed subject matter.

In S2305, it can be determined if a transition between phases has occurred. The phases can include the night phase, the sunrise transition phase, the daytime phase, and the sunset transition phase. If a transition between phases has occurred, then the predetermined screen color temperature corresponding to the beginning of the new phase can be displayed in S2310. However, if it is determined that a transition between phases has not occurred, it can be determined if the brightness level has changed in S2315.

In S2315, it can be determined if the brightness level has changed. If the brightness level has not changed, the process can return to determine if there has been a transition between phases in S2305. However, if it is determined that the brightness level has changed, the predetermined mixture of light can be automatically adjusted to match the most recent screen color temperature in S2320. The predetermined mixture of light can be based off of FIG. 20, for example. In other words, the screen color temperature remains the same, but because the brightness has changed, the mixture that creates the predetermined screen color temperature can be adjusted to maintain the same screen color temperature. When the predetermined light mixture is automatically adjusted, the process can end.

Figure 24:
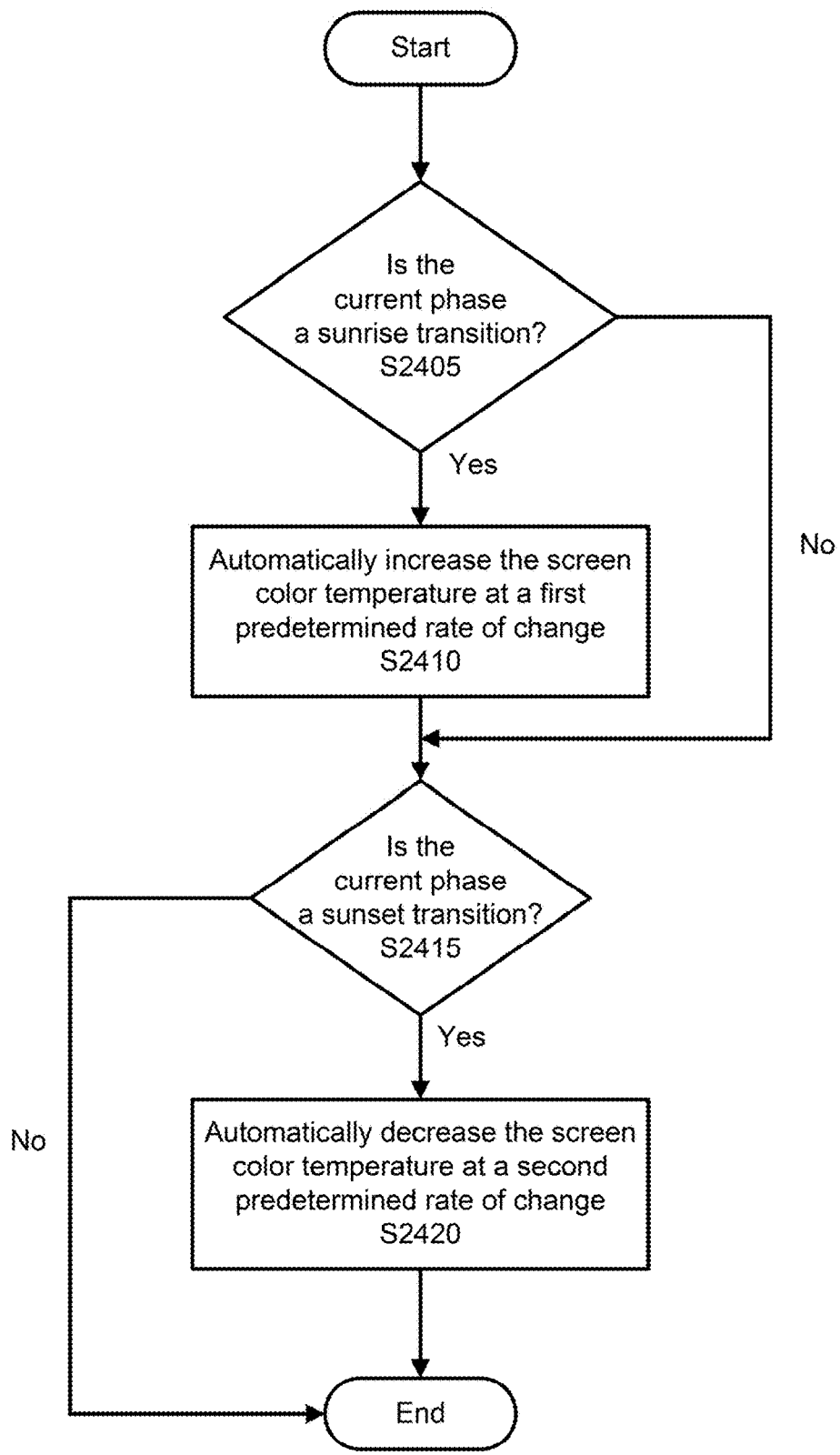
FIG. 24 is an algorithmic flow chart of a method for automated screen color temperature control during the sunrise transition according to one or more aspects of the disclosed subject matter.

FIG. 24 is an algorithmic flow chart of a method for automated screen color temperature control during the sunrise transition according to one or more aspects of the disclosed subject matter.

In S2405, it can be determined if the current phase is the sunrise transition based on the time of day, for example. If the current phase is not the sunrise transition, it can be determined if the current phase is the sunset transition in S2415 based on the time of day, for example. However, if it is determined that the current phase is the sunrise transition, the screen color temperature can be automatically increased at a first predetermined rate of change in S2410.

In S2410, the screen color temperature can be increased at a first predetermined rate of change. The first predetermined rate of change can be based on increasing the screen color temperature from 1900K at 5:00 AM to 6400K at 7:00 AM, for example. In other words, the rate of change can increase or decrease in order to allow the color temperature to reach 6400K at 7:00 AM, regardless of the starting color temperature at 5:00 AM. For example, a device starting from 1900K at 5:00 AM and ending at 6400K at 7:00 AM can change more slowly/gradually than a device starting from 3800K at 5:00 AM and ending at 6400K at 7:00 AM.

In S2415, it can be determined if the current phase is the sunset transition. If the current phase is not the sunset transition, the process can end. However, if the current phase is the sunset transition, then the screen color temperature can be automatically decreased a second predetermined rate of change in S2420.

In S2420, the screen color temperature can be decreased at a second predetermined rate of change. The second predetermined rate of change can be based on decreasing the screen color temperature from 6400K at 6:00 PM to 1900K at the most recently selected bedtime, where the bedtime can be selected by default to be 11:00 PM or selected by a user ranging from 9:00 PM to 3:00 AM. When the screen color temperature is automatically decreased at the second predetermined rate of change, the process can end.

Figure 25:
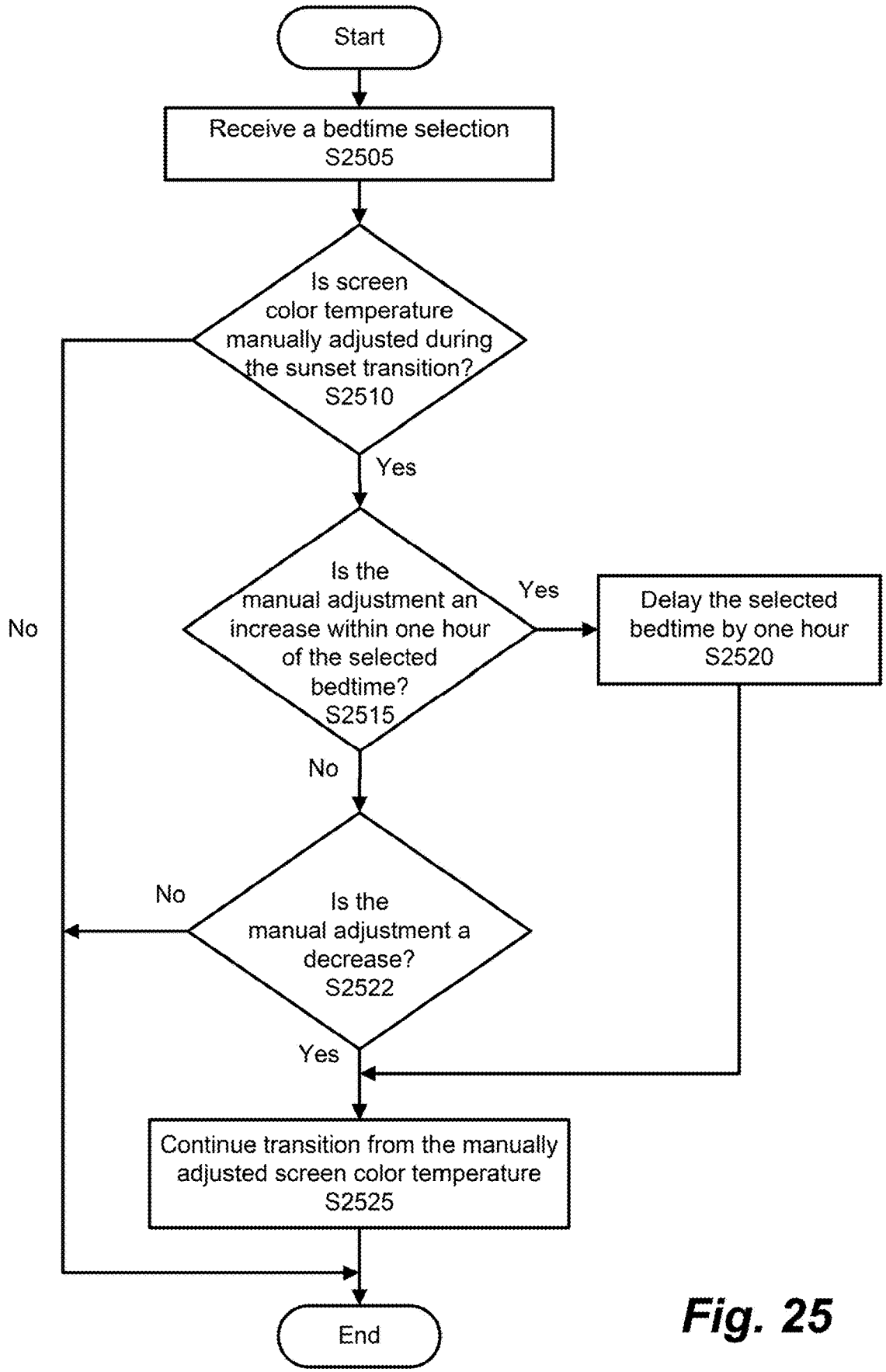
FIG. 25 is an algorithmic flow chart of a method for automated screen color temperature control in response to a manual adjustment of the screen color temperature during the sunset transition according to one or more aspects of the disclosed subject matter.

FIG. 25 is an algorithmic flow chart of a method for automated screen color temperature control in response to a manual adjustment of the screen color temperature during the sunset transition according to one or more aspects of the disclosed subject matter.

In S2505, a bedtime selection can be received. The bedtime can be selected by the user. Alternatively, or additionally, the bedtime can be selected by default.

In S2510, it can be determined if the screen color temperature is manually adjusted during the sunset transition phase based on the time of day, for example. If the screen color temperature is not manually adjusted during the sunset transition, the process can end. However, if the screen color temperature is manually adjusted during the sunset transition, it can be determined if the manual adjustment was within one hour of the selected bedtime in S2515.

In S2515, it can be determined if the screen color temperature was manually adjusted within one hour of the selected bedtime. If the screen color temperature was manually adjusted within one hour of the selected bedtime, then the selected bedtime can be delayed by one hour in S2520 before continuing the sunset transition from the manually adjusted screen color temperature in S2525. However, if the screen color temperature is not manually increased within one hour of the selected bedtime (but was still manually adjusted within the sunset transition), then it can be determined if the screen color temperature was manually decreased within one hour of the selected bedtime in S2522.

In S2522, it can be determined if the screen color temperature was manually decreased any time in the sunset transition. If the screen color temperature was not decreased, the process can end. However, if the screen color temperature was manually decreased, the sunset transition can continue from the manually adjust screen color temperature in S2525.

In S2555, the sunset transition can continue from the manually adjusted screen color temperature. For example, if the user manually adjusts the screen color temperature during the sunset transition, the adjustment causes a recalculation of the second predetermined rate of change. Now rather than continuing the transition from the original starting point (e.g., 6400K at 6:00 PM, the manual adjustment provides a new starting point from which the sunrise transition can continue. In response to the manually adjusted screen color temperature, the sunset transition decreases starting at the new manually adjusted screen temperature at the time at which the adjustment was made to the screen color temperature of 1900K, for example, by the beginning of the night phase (i.e., bedtime). Alternatively, or additionally, the bedtime can be delayed only when the manually adjusted screen color temperature is an increase in screen color temperature within one hour of the selected bedtime. This can also explain why the additional hour in delay can be advantageous to provide a smoother transition down to 1900K. When the transition has continued from the manually adjusted screen color temperature, the process can end.

Figure 26:
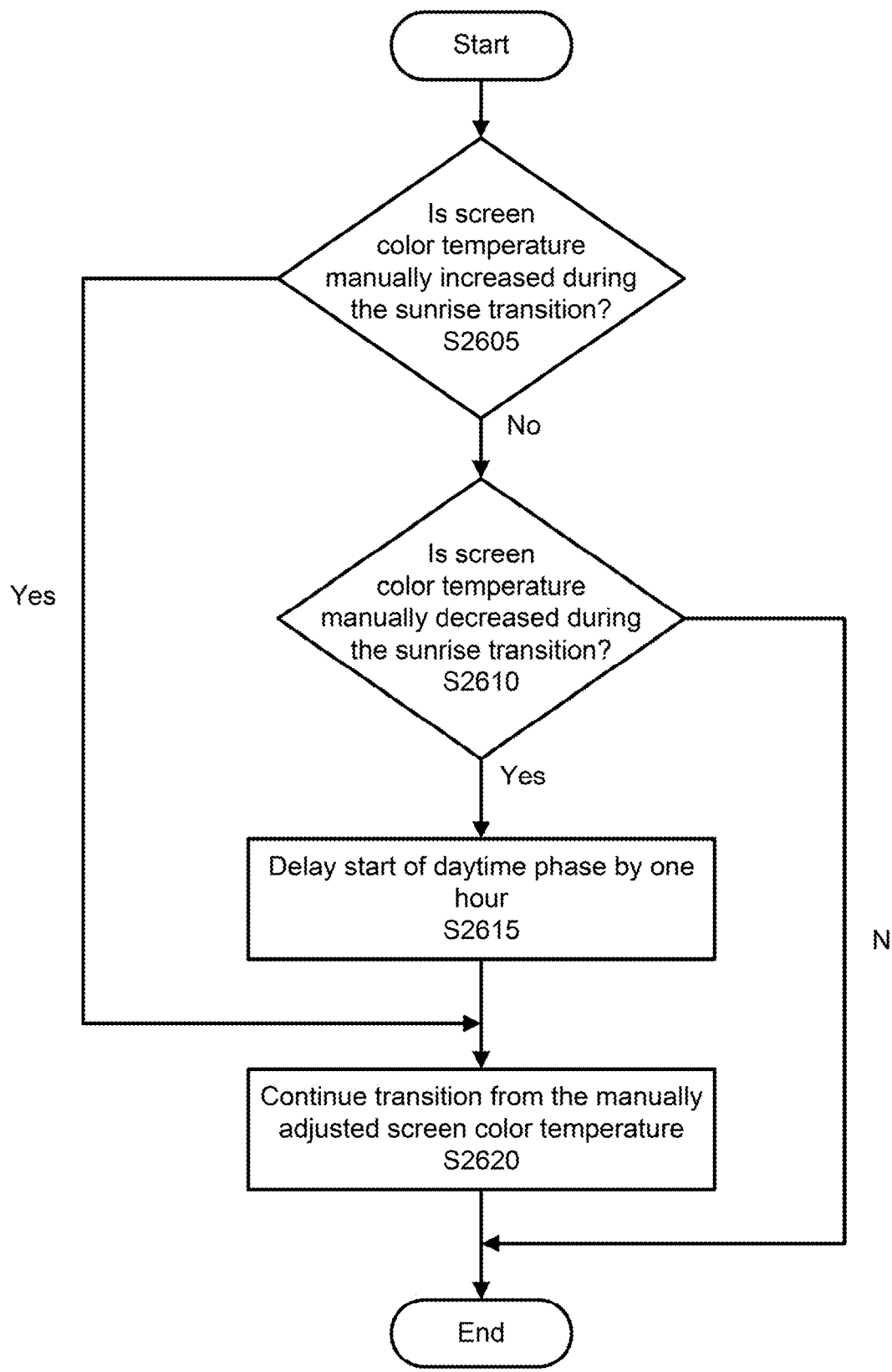
FIG. 26 is an algorithmic flow chart of a method for automated screen color temperature control during the sunrise transition according to one or more aspects of the disclosed subject matter.

FIG. 26 is an algorithmic flow chart of a method for automated screen color temperature control during the sunrise transition according to one or more aspects of the disclosed subject matter.

In S2605, it can be determined if the screen color temperature is manually increased during the sunrise transition. If the screen color temperature is increased during the sunrise transition, the transition can continue from the manually adjusted screen color temperature in S2620. However, if it is determined that the screen color temperature is not increased during the sunrise transition, then it can be determined if the screen color temperature is manually decreased during the sunrise transition in S2610.

In S2610, it can be determined if the screen color temperature is manually decreased to a lower screen color temperature during the sunrise transition. If the screen color temperature is not manually decreased during the sunrise transition, then the process can end. However, if the screen color temperature is manually decreased during the sunrise transition, the start of the daytime phase can be delayed by one hour. The manual decrease of the screen color temperature can occur any time during the sunrise transition to cause the delay to the start of the daytime phase.

In S2620, the sunrise transition can continue from the manually adjusted screen color temperature. For example, the sunrise transition can begin from the screen color temperature from the time at which the screen color temperature was adjusted and transition from that screen color temperature to 6400K, for example, by the start of the daytime phase. After the sunrise transition has continued from the manually adjusted screen color temperature, the process can end.

Figure 27:
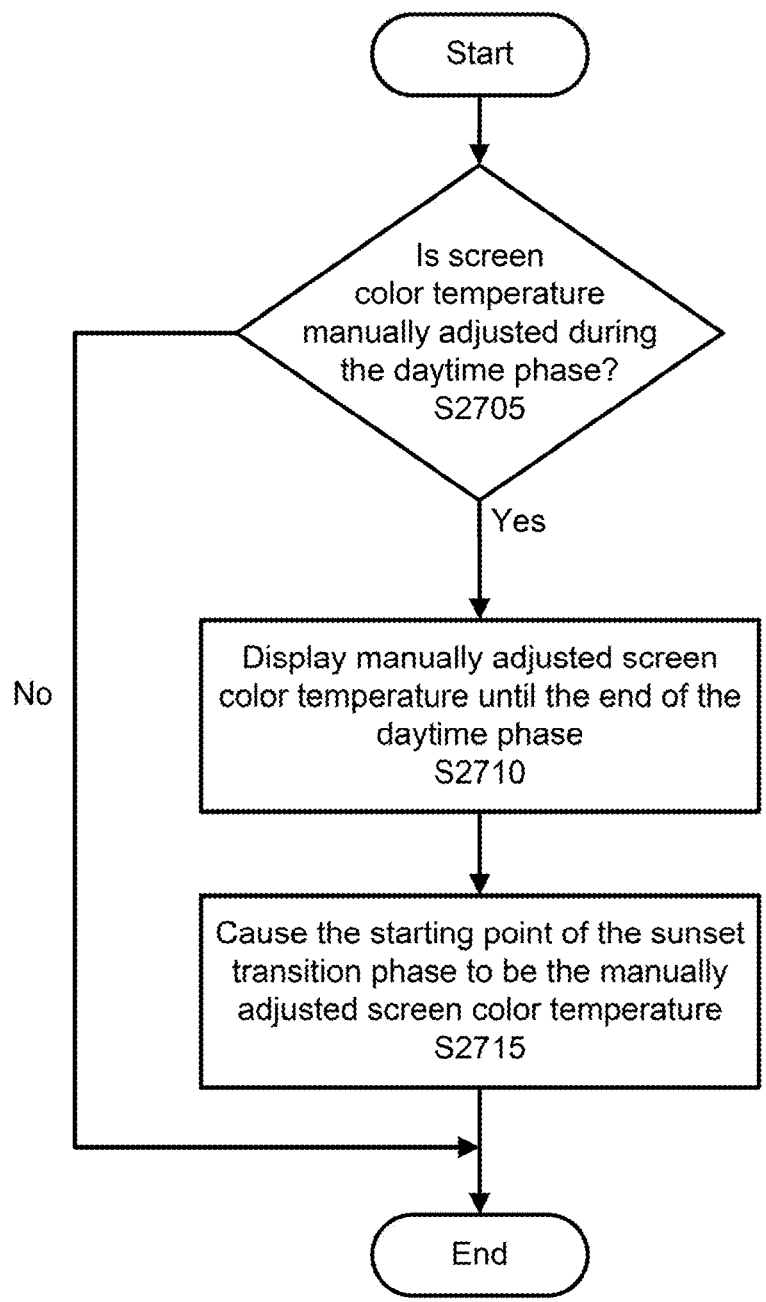
FIG. 27 is an algorithmic flow chart of a method for automated screen color temperature control during the daytime phase according to one or more aspects of the disclosed subject matter.

FIG. 27 is an algorithmic flow chart of a method for automated screen color temperature control during the daytime phase according to one or more aspects of the disclosed subject matter.

In S2705, it can be determined if the screen color temperature is manually adjusted during the daytime phase based on the time of day, for example. If the screen color temperature is not adjusted during the daytime phase, the process can end. However, if the screen color temperature is manually adjusted during the daytime phase, the manually adjusted screen color temperature can be displayed until the end of the daytime phase in S2710.

In S2710, the manually adjusted screen color temperature can be displayed until the end of the daytime phase.

In S2715, the starting point of the sunset transition can be the manually adjusted screen color temperature from the daytime phase. When the manually adjusted screen color temperature from the daylight phase is caused to be the starting point of the sunset transition, the process can end.

Figure 28:
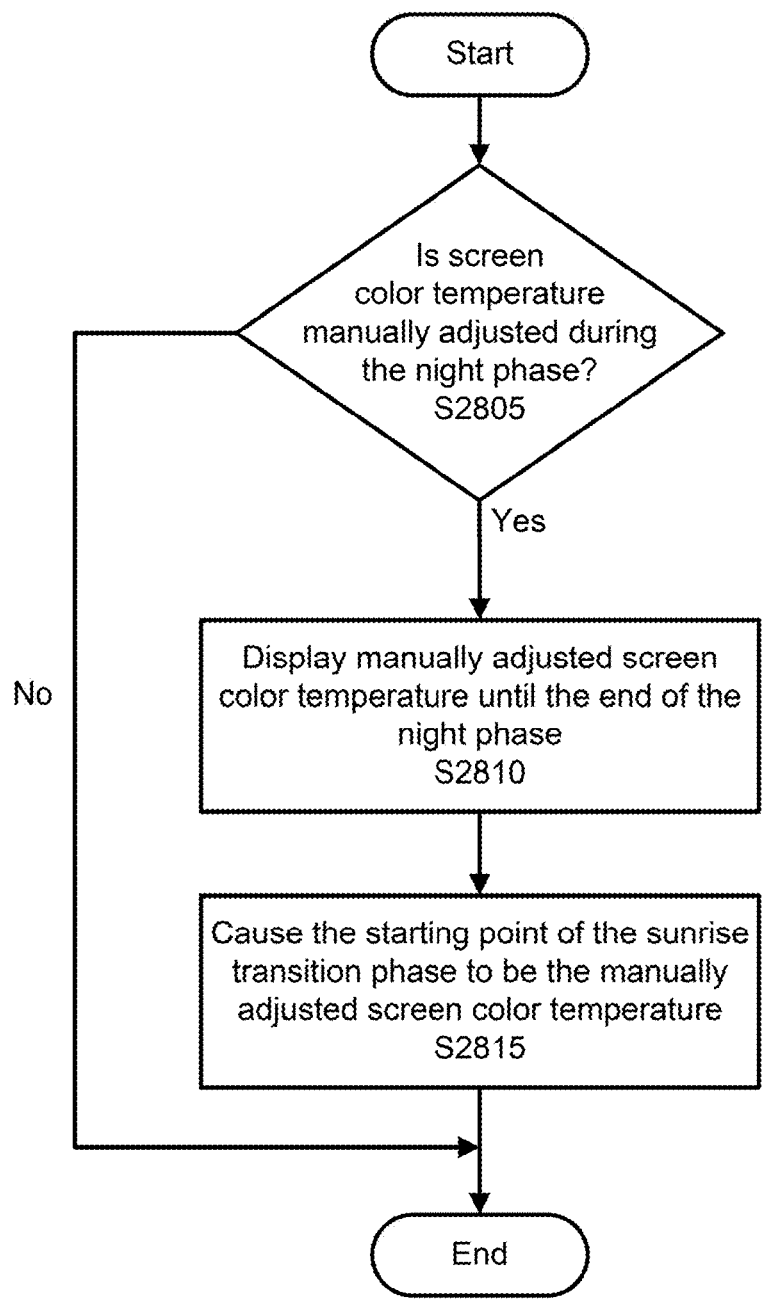
FIG. 28 is an algorithmic flow chart of a method for automated screen color temperature control during the night phase according to one or more aspects of the disclosed subject matter.

FIG. 28 is an algorithmic flow chart of a method for automated screen color temperature control during the night phase according to one or more aspects of the disclosed subject matter.

In S2805, it can be determined if the screen color temperature is manually adjusted during the night phase. If the screen color temperature is not adjusted during the night phase, the process can end. However, if the screen color temperature is manually adjusted during the night phase, the manually adjusted screen color temperature can be displayed until the end of the night phase in S2810.

In 2810, the manually adjusted screen color temperature can be displayed until the end of the night phase.

In S2815, the starting point of the sunrise transition can be the manually adjusted screen color temperature from the night phase. When the manually adjusted screen color temperature from the night phase is caused to be the starting point of the sunrise transition, the process can end.

Figure 29:
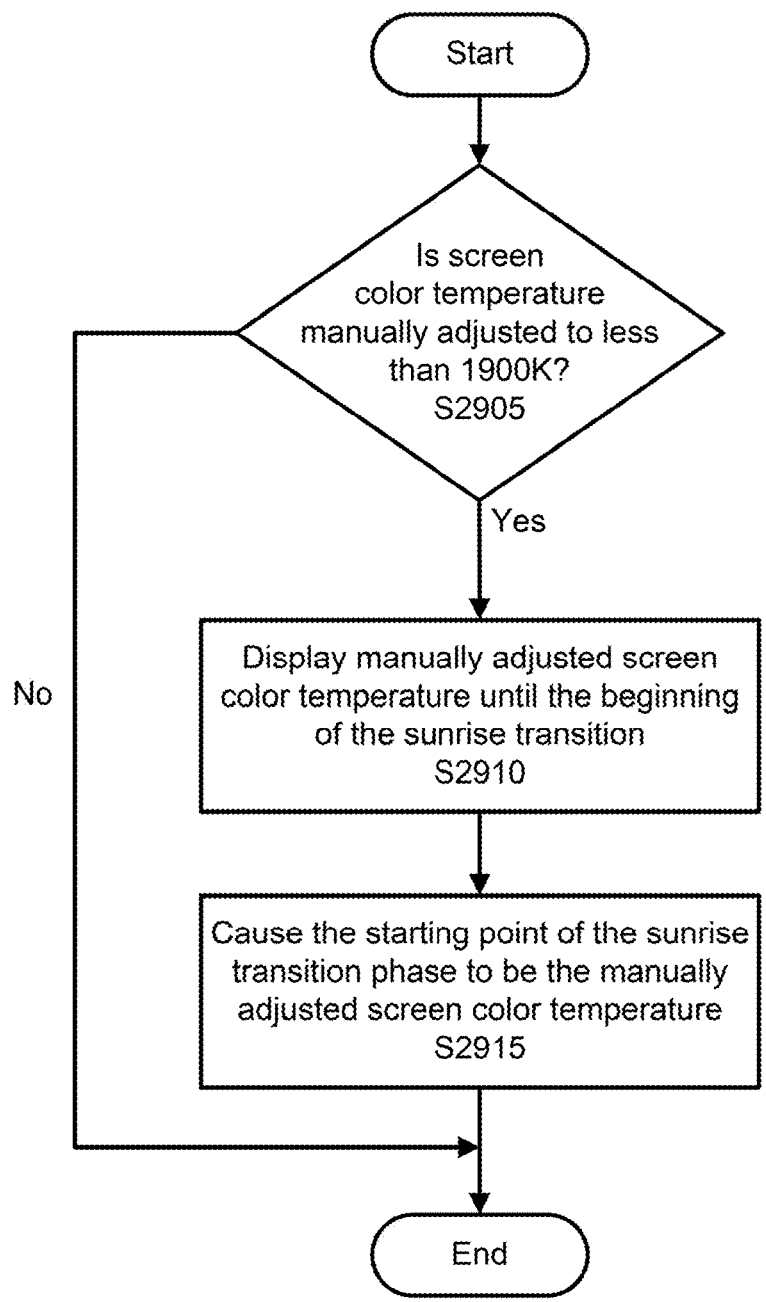
FIG. 29 is an algorithmic flow chart of a method for automated screen color temperature control when the screen color temperature is manually adjusted below 1900K according to one or more aspects of the disclosed subject matter.

FIG. 29 is an algorithmic flow chart of a method for automated screen color temperature control when the screen color temperature is manually adjusted below 1900K according to one or more aspects of the disclosed subject matter.

In S2905, it can be determined if the screen color temperature is manually adjusted below 1900K. If the screen color temperature is not manually adjusted below 1900K, then the process can end. However, if the screen color temperature is manually adjusted below 1900K, then the manually adjusted screen color temperature below 1900K can be displayed until the beginning of the next sunrise transition.

In S2910, the manually adjusted screen color temperature can be displayed until the beginning of the next sunrise transition regardless of the time of day or phase in which the screen color temperature was manually adjusted below 1900K.

In S2915, the starting point of the next sunrise transition can be the manually adjusted screen color temperature that was manually adjusted below 1900K. When the manually adjusted screen color temperature that was manually adjusted below 1900K is caused to be the starting point of the sunrise transition, the process can end.

Figure 30:
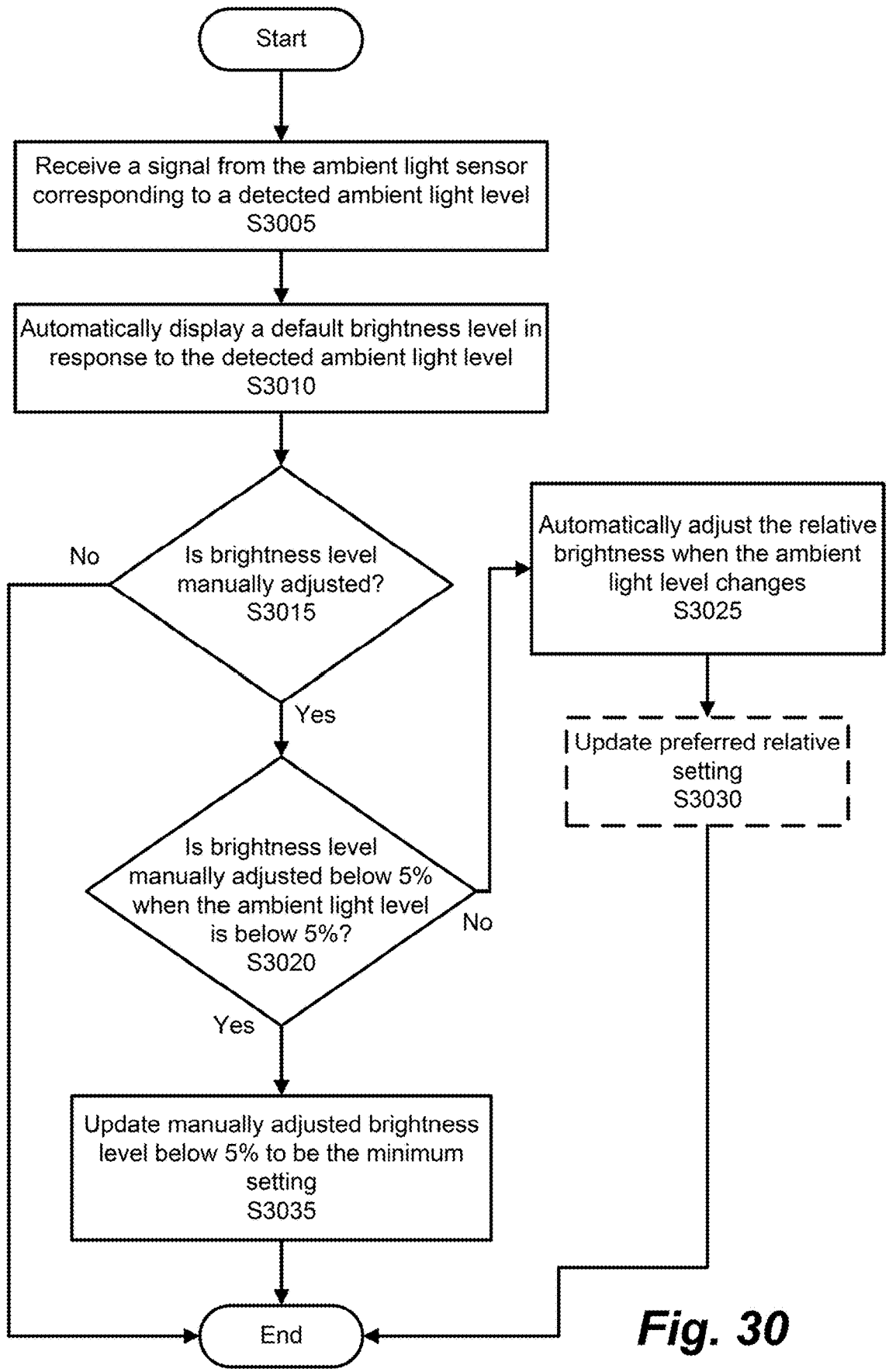
FIG. 30 is an algorithmic flow chart of a method for automatic brightness control in response to one user input according to one or more aspects of the disclosed subject matter.

FIG. 30 is an algorithmic flow chart of a method for automatic brightness control in response to one user input according to one or more aspects of the disclosed subject matter.

In S3005, a signal from the ambient light sensor corresponding to a detected ambient light level can be received. The detected ambient light level can be an amount of ambient light in the area around the electronic reading device.

In S3010, a default brightness level can be automatically displayed in response to the ambient light level. The default brightness level can be 5% above the ambient light level, for example.

In S3015, it can be determined if the brightness level is manually adjusted. Additionally, in one aspect, it could be determined if the brightness level is adjusted to be higher than the default or lower than the default. If the brightness level is not manually adjusted, the process can end. However, if the brightness level is manually adjusted, then it can be determined if the brightness level is manually adjusted below 5% when the ambient light level is also below 5% in S3020. If the brightness level is not manually adjusted below 5% while the ambient light level is also below 5% (but the brightness level is still manually adjusted in S3015), the relative brightness level (based on the manual adjustment) can be automatically adjusted when the ambient light changes in S3025.

In S3030, the preferred relative setting can be updated to be the user's preferred relative brightness level. Additionally, the updating the user's preferred relative brightness level to the preferred relative setting can be optional. For example, if the user manually decreases the brightness level, the setting may be temporary and not updated to be the user's preferred relative brightness level.

In S3020, if the brightness level is manually adjusted below 5% while the ambient light level is below 5%, then the manually adjusted brightness level below 5% can be updated to be the minimum setting in S3035. When the minimum setting is updated in S3035, the process can end.

Figure 31:
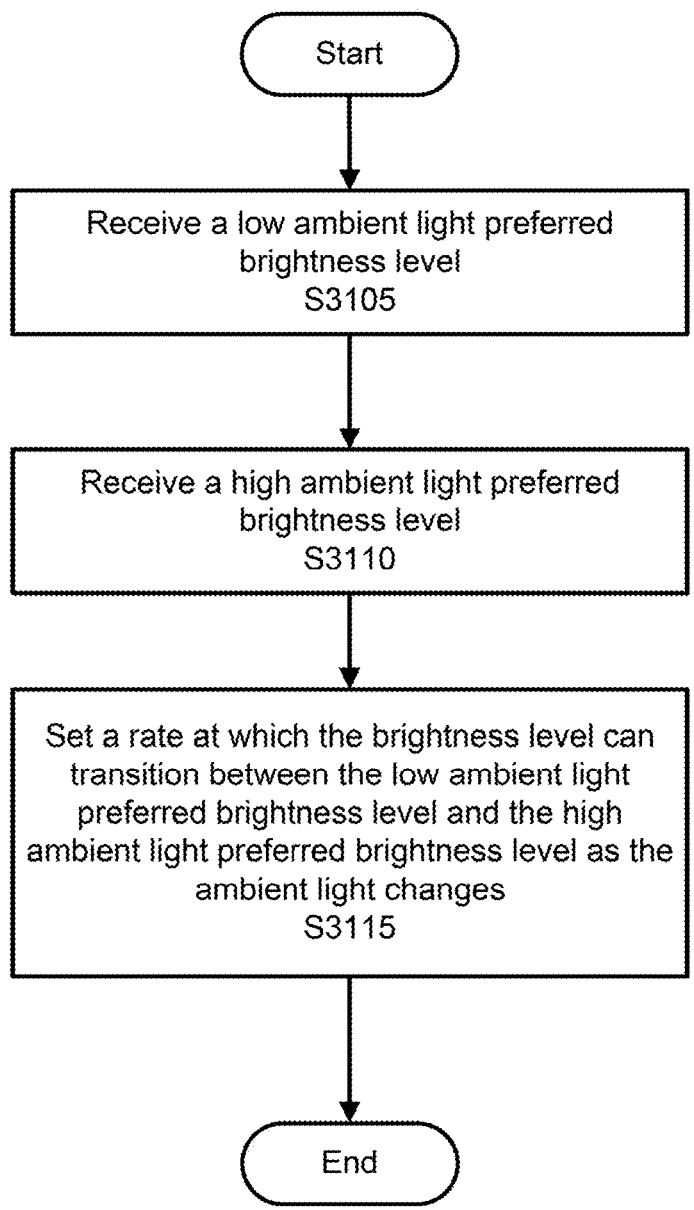
FIG. 31 is an algorithmic flow chart of a method for automatic brightness control in response to two user inputs according to one or more aspects of the disclosed subject matter.

FIG. 31 is an algorithmic flow chart of a method for automatic brightness control in response to two user inputs according to one or more aspects of the disclosed subject matter.

In S3105, a low ambient light preferred brightness level can be received. The low ambient light level can correspond to when the ambient light level is less than 50%.

In S3110, a high ambient light preferred brightness level can be received. The high ambient light level can correspond to the ambient light level being at or above 50%.

In S3115, the rate at which the brightness level transitions between the low ambient light preferred brightness level and the high ambient light preferred brightness level can be set. The transition rate can correspond to a calculation of the transition from the preferred relative brightness at low ambient light to the preferred relative brightness level at high ambient light as the ambient light level changes. When the rate at which the transition between the low ambient light preferred brightness and the high ambient light preferred brightness level can occur in response to a change in the ambient light level is set, the process can end. The preferred relative settings for high ambient light and low ambient light can be updated to be the preferred relative settings and stored for future use. Additionally, the brightness level is adjusted proportionally relative to the ambient light as the ambient light level changes when the brightness level is lower than the low ambient light preferred brightness level. Similarly, the brightness level is adjusted proportionally relative to the ambient light as the ambient light level changes when the brightness level is higher than the high ambient light preferred brightness level. In an embodiment, when the screen brightness changes proportionally when the screen brightness is lower than the low ambient light preferred brightness level, the screen brightness level may not go below 5% (unless manually adjusted below 5%, for example). As a result, the screen brightness may remain at 5% as the ambient light level changes until the screen brightness can start increasing proportionally with the ambient light level as show in FIG. 10B, for example. Similarly, the screen brightness may be capped at 100% when the screen brightness increases proportionally above the high ambient light preferred brightness level even though the ambient light level may still be increasing as seen in FIG. 10B, for example. In an embodiment, when the low ambient light preferred brightness level is set below 5%, the rate of change is calculated such that the brightness level changes based on the predetermined rate of change from the low ambient light preferred brightness level to the high ambient light preferred brightness level. As a result, the screen brightness does not have an opportunity to increase proportionally when the screen brightness is below the low ambient light preferred brightness level because the screen brightness begins increasing at the predetermined rate toward the high ambient light preferred brightness level as shown in FIG. 10C, for example. In an embodiment, each of the low ambient light and high ambient light preferred brightness levels can be updated in real time such that a new rate of change between the preferred brightness levels is calculated in response to a change (e.g., updated preferred brightness level) in either of the preferred brightness levels. In an embodiment, the calculation for the rate of change from low ambient light preferred brightness level to the high ambient light preferred brightness level may be based on calculating the shortest distance between the two points on the graph, as seen in FIGS. 10A-10C, for example. In other words, the slope of the solid line segment between the two user settings (e.g., 1005, 1010), can represent the rate of screen brightness change over the range of ambient light values between 1005 and 1010, for example.

Figure 32:
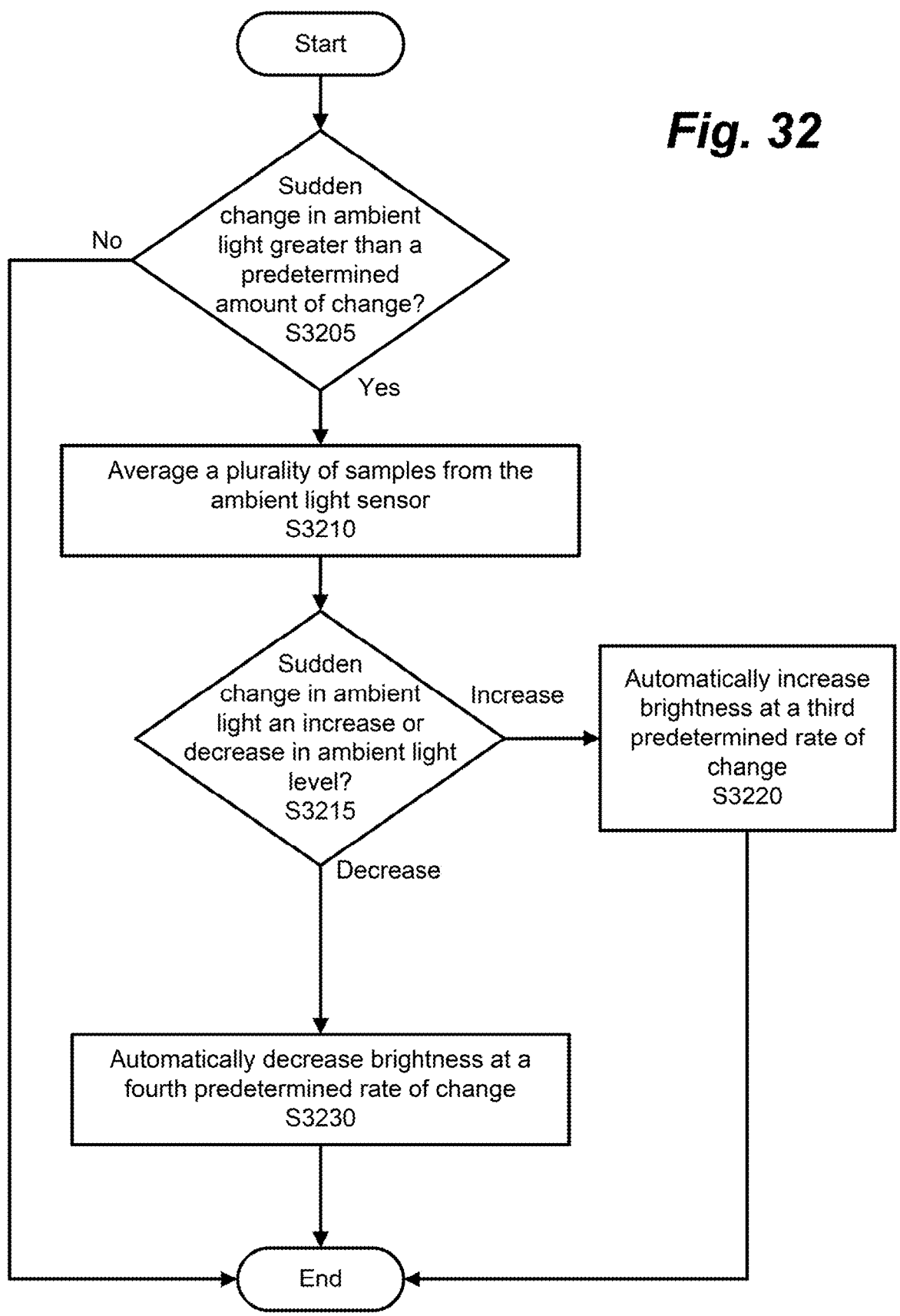
FIG. 32 is an algorithmic flow chart of a method for automatic brightness control in response to sudden changes in ambient light according to one or more aspects of the disclosed subject matter.

FIG. 32 is an algorithmic flow chart of a method for automatic brightness control in response to sudden changes in ambient light according to one or more aspects of the disclosed subject matter.

In S3205, it can be determined if a sudden change in ambient light is greater than a predetermined amount of change. If the sudden change in ambient light is not greater than a predetermined amount of change, the process can end. However, if the sudden change in ambient light is greater than the predetermined amount of change, a plurality of samples from the ambient light sensors can be averaged in S3210.

In S3210, the plurality of samples from the ambient light sensor can be averaged. Taking the average of the plurality of sample from the ambient light sensor can assist in providing a smooth brightness transition.

In S3215, it can be determined if the sudden change in ambient light greater than the predetermined amount of change is an increase or a decrease in ambient light. If the sudden change in ambient light is an increase, the brightness can be automatically adjusted at a third predetermined rate of change in S3220. The third predetermined rate of change can correspond to a 10% increase per second, for example. When the brightness is increased at the third predetermined rate of change, the process can end.

In S3215, if the sudden change in ambient light is a decrease, the brightness can be automatically decreased at a fourth predetermined rate of change. The fourth predetermined rate of change can correspond to a 10% decrease per minute, for example. When the brightness is decreased at the fourth predetermined rate of change, the process can end.

Figure 33:
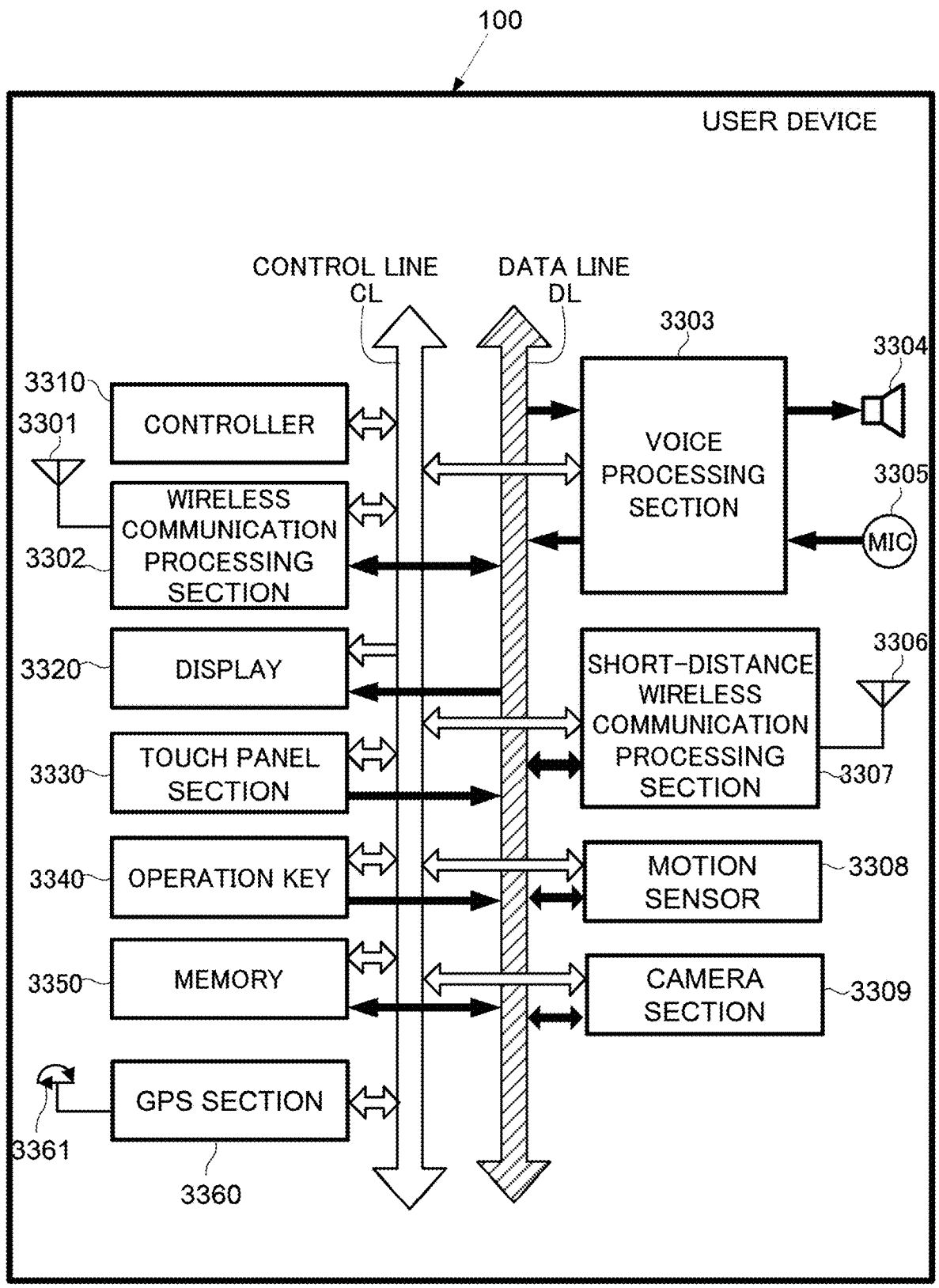
FIG. 33 is a detailed block diagram illustrating an exemplary user device according to certain aspects of the present disclosure according to one or more aspects of the disclosed subject matter.

FIG. 33 is a detailed block diagram illustrating an exemplary user device according to certain aspects of the present disclosure according to one or more aspects of the disclosed subject matter. In certain aspects, the user device may be the electronic reading device. However, the skilled artisan will appreciate that the features described herein may be adapted to be implemented on other devices (e.g., a laptop, a tablet, a server, an e-reader, a camera, a navigation device, etc.). The exemplary electronic reading device of FIG. 33 includes a controller 3310 and a wireless communication processor 3302 connected to an antenna 3301. A speaker 3304 and a microphone 3305 are connected to a voice processor 3303.

The controller 3310 is an example of a control unit and may include one or more Central Processing Units (CPUs), and may control each element in the electronic reading device to perform functions related to communication control, audio signal processing, control for the audio signal processing, still and moving image processing and control, and other kinds of signal processing. The controller 3310 may perform these functions by executing instructions stored in a memory 3350. Alternatively or in addition to the local storage of the memory 3350, the functions may be executed using instructions stored on an external device accessed on a network or on a non-transitory computer readable medium. The controller 3310 may execute instructions allowing the controller 3310 to function as a display control unit, an operation management unit, a game management unit, and the like.

The memory 3350 can include but is not limited to Read Only Memory (ROM), Random Access Memory (RAM), or a memory array including a combination of volatile and non-volatile memory units. The memory 3350 may be utilized as working memory by the controller 3310 while executing the processes and algorithms of the present disclosure. Additionally, the memory 3350 may be used for long-term storage, e.g., of image data and information related thereto. The memory 3350 may be configured to store the battle view information, operation view information and list of commands.

The electronic reading device can include a control line CL and data line DL as internal communication bus lines. Control data to/from the controller 3310 may be transmitted through the control line CL. The data line DL may be used for transmission of voice data, display data, etc.

The antenna 3301 transmits/receives electromagnetic wave signals between base stations for performing radio-based communication, such as the various forms of cellular telephone communication. The wireless communication processor 3302 controls the communication performed between the electronic reading device and other external devices via the antenna 3301. For example, the wireless communication processor 3302 may control communication between base stations for cellular phone communication.

The speaker 3304 emits an audio signal corresponding to audio data supplied from the voice processor 3303. The microphone 3305 detects surrounding audio and converts the detected audio into an audio signal. The audio signal may then be output to the voice processor 3303 for further processing. The voice processor 3303 demodulates and/or decodes the audio data read from the memory 3350 or audio data received by the wireless communication processor 3302 and/or a short-distance wireless communication processor 3307. Additionally, the voice processor 3303 may decode audio signals obtained by the microphone 3305.

The electronic reading device may also include a display 3320, a touch panel 3330, an operation key 3340, and a short-distance communication processor 3307 connected to an antenna 3306. The display 3320 may be a Liquid Crystal Display (LCD), an organic electroluminescence display panel, or another display screen technology such as an e-ink display. In addition to displaying still and moving image data, the display 3320 may display operational inputs, such as numbers or icons which may be used for control of the electronic reading device. The display 3320 may additionally display a GUI for a user to control aspects of the electronic reading device and/or other devices. Further, the display 3320 may display characters and images received by the electronic reading device and/or stored in the memory 3350 or accessed from an external device on a network. For example, the electronic reading device may access a network such as the Internet and display text and/or images transmitted from a Web server.

The touch panel 3330 may include a physical touch panel display screen and a touch panel driver. The touch panel 3330 may include one or more touch sensors for detecting an input operation on an operation surface of the touch panel display screen. The touch panel 3330 also detects a touch shape and a touch area. Used herein, the phrase "touch operation" refers to an input operation performed by touching an operation surface of the touch panel display with an instruction object, such as a finger, thumb, or stylus-type instrument. In the case where a stylus or the like is used in a touch operation, the stylus may include a conductive material at least at the tip of the stylus such that the sensors included in the touch panel 130 may detect when the stylus approaches/contacts the operation surface of the touch panel display (similar to the case in which a finger is used for the touch operation).

In certain aspects of the present disclosure, the touch panel 3330 may be disposed adjacent to the display 3320 (e.g., laminated) or may be formed integrally with the display 3320. For simplicity, the present disclosure assumes the touch panel 3330 is formed integrally with the display 3320 and therefore, examples discussed herein may describe touch operations being performed on the surface of the display 3320 rather than the touch panel 3330. However, the skilled artisan will appreciate that this is not limiting.

For simplicity, the present disclosure assumes the touch panel 3330 is a capacitance-type touch panel technology. However, it should be appreciated that aspects of the present disclosure may easily be applied to other touch panel types (e.g., resistance-type touch panels) with alternate structures. In certain aspects of the present disclosure, the touch panel 3330 may include transparent electrode touch sensors arranged in the X-Y direction on the surface of transparent sensor glass.

The touch panel driver may be included in the touch panel 3330 for control processing related to the touch panel 3330, such as scanning control. For example, the touch panel driver may scan each sensor in an electrostatic capacitance transparent electrode pattern in the X-direction and Y-direction and detect the electrostatic capacitance value of each sensor to determine when a touch operation is performed. The touch panel driver may output a coordinate and corresponding electrostatic capacitance value for each sensor. The touch panel driver may also output a sensor identifier that may be mapped to a coordinate on the touch panel display screen. Additionally, the touch panel driver and touch panel sensors may detect when an instruction object, such as a finger is within a predetermined distance from an operation surface of the touch panel display screen. That is, the instruction object does not necessarily need to directly contact the operation surface of the touch panel display screen for touch sensors to detect the instruction object and perform processing described herein. For example, in certain embodiments, the touch panel 3330 may detect a position of a user's finger around an edge of the display panel 3320 (e.g., gripping a protective case that surrounds the display/touch panel). Signals may be transmitted by the touch panel driver, e.g. in response to a detection of a touch operation, in response to a query from another element based on timed data exchange, etc.

The operation key 3340 may include one or more buttons or similar external control elements, which may generate an operation signal based on a detected input by the user. In addition to outputs from the touch panel 3330, these operation signals may be supplied to the controller 3310 for performing related processing and control. In certain aspects of the present disclosure, the processing and/or functions associated with external buttons and the like may be performed by the controller 3310 in response to an input operation on the touch panel 3330 display screen rather than the external button, key, etc. In this way, external buttons on the electronic reading device may be eliminated in lieu of performing inputs via touch operations, thereby improving water-tightness.

The antenna 3306 may transmit/receive electromagnetic wave signals to/from other external apparatuses, and the short-distance wireless communication processor 3307 may control the wireless communication performed between the other external apparatuses. Bluetooth, IEEE 802.11, and near-field communication (NFC) are non-limiting examples of wireless communication protocols that may be used for inter-device communication via the short-distance wireless communication processor 3307.

The electronic reading device may include a motion sensor 3308. The motion sensor 3308 may detect features of motion (i.e., one or more movements) of the electronic reading device. For example, the motion sensor 3308 may include an accelerometer to detect acceleration, a gyroscope to detect angular velocity, a geomagnetic sensor to detect direction, a geo-location sensor to detect location, etc., or a combination thereof to detect motion of the electronic reading device. In certain embodiments, the motion sensor 3308 may generate a detection signal that includes data representing the detected motion. For example, the motion sensor 3308 may determine a number of distinct movements in a motion (e.g., from start of the series of movements to the stop, within a predetermined time interval, etc.), a number of physical shocks on the electronic reading device (e.g., a jarring, hitting, etc., of the electronic device), a speed and/or acceleration of the motion (instantaneous and/or temporal), or other motion features. The detected motion features may be included in the generated detection signal. The detection signal may be transmitted, e.g., to the controller 3310, whereby further processing may be performed based on data included in the detection signal. The motion sensor 3308 can work in conjunction with a Global Positioning System (GPS) section 3360. The GPS section 3360 detects the present position of the electronic reading device 100. The information of the present position detected by the GPS section 3360 is transmitted to the controller 3310. An antenna 3361 is connected to the GPS section 3360 for receiving and transmitting signals to and from a GPS satellite.

The electronic reading device may include a camera section 3309, which includes a lens and shutter for capturing photographs of the surroundings around the electronic reading device. In an embodiment, the camera section 3309 captures surroundings of an opposite side of the electronic reading device from the user. The images of the captured photographs can be displayed on the display panel 3320. A memory section saves the captured photographs. The memory section may reside within the camera section 3309 or it may be part of the memory 3350. The camera section 3309 can be a separate feature attached to the electronic reading device or it can be a built-in camera feature.

According to an embodiment, a computing device includes a housing, a display screen, a multi-colored set of illumination elements provided over the display screen, a memory that stores a set of instructions, and one or more processors that use the instructions stored in the memory. The one or more processors render content from an e-book on the display screen, and detect one or more pre-determined illumination triggers. In response, the one or more processors select a color based on the detected one or more pre-determined illumination triggers. The display screen can be illuminated in the selected color using the multi-colored set of illumination elements.

Still further, in some embodiments, the one or more processors trigger illumination of the of the multi-colored set of illumination elements in at least a first color at a first instance, and illumination of the multi-colored set of illumination elements in at least a second color at a second instance.

One or more embodiments described herein provide that methods, techniques and actions performed by a computing device are performed programmatically, or as a computer-implemented method. Programmatically means through the use of code, or computer-executable instructions. A programmatically performed step may or may not be automatic.

One or more embodiments described herein may be implemented using programmatic modules or components. A programmatic module or component may include a program, a subroutine, a portion of a program, or a software or a hardware component capable of performing one or more stated tasks or functions. As used herein, a module or component can exist on a hardware component independently of other modules or components. Alternatively, a module or component can be a shared element or process of other modules, programs or machines.

Furthermore, one or more embodiments described herein may be implemented through instructions that are executable by one or more processors. These instructions may be carried on a computer-readable medium. Machines shown or described with figures below provide examples of processing resources and computer-readable mediums on which instructions for implementing embodiments of the invention can be carried and/or executed. In particular, the numerous machines shown with embodiments of the invention include processor(s) and various forms of memory for holding data and instructions. Examples of computer-readable mediums include permanent memory storage devices, such as hard drives on personal computers or servers. Other examples of computer storage mediums include portable storage units, such as CD or DVD units, flash or solid state memory (such as carried on many cell phones and consumer electronic devices) and magnetic memory. Computers, terminals, network enabled devices (e.g., mobile devices such as cell phones) are all examples of machines and devices that utilize processors, memory, and instructions stored on computer-readable mediums. Additionally, embodiments may be implemented in the form of computer-programs, or a computer usable carrier medium capable of carrying such a program.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:

1. A device, comprising:
a display screen:
an adjustable RGBW front light;
an ambient light sensor; and
circuitry configured to receive a signal corresponding to a brightness level from the ambient light sensor,
receive a signal corresponding to a current screen color temperature of the display screen; determine a transition rate which corresponds to a calculation of the rate at which a brightness level changes between a low ambient light preferred brightness level to a high ambient light preferred brightness level;
calculate a predetermined mixture of light based on the brightness level and the current screen color temperature, wherein the calculation allows the current screen color temperature to remain the same regardless of the brightness level, and
display the predetermined mixture of light onto the display screen via the adjustable RGBW front light set a transition rate at which a brightness level of the display screen transitions between the low ambient light preferred brightness level and the high ambient light preferred brightness level as the ambient light changes and determine if a brightness level has changed, and automatically adjust the predetermined mixture of light to be displayed via the adjustable RGBW front light such that the screen color temperature does not change in response to the changing brightness level; and wherein the current screen color temperature automatically changes based on the time of day.

2. The device of claim 1, wherein the predetermined mixture of light changes in response to a change in the current screen color temperature.

3. The device of claim 1, wherein the predetermined mixture of light changes in response to a change in the brightness level.

4. The device of claim 3, wherein the current screen color temperature does not change in response to a change in the brightness level.

5. The device of claim 1, wherein the current screen color temperature includes 1500K to 6400K.

6. The device of claim 5, wherein each of the current screen color temperatures has corresponding RGBW values.

7. The device of claim 5, wherein each of the current screen color temperatures has corresponding RGBW values for each brightness level, wherein the brightness level includes 0% brightness to 100% brightness, such that every current screen color temperature has RGBW values for every brightness level.

8. The device of claim 1, wherein the predetermined mixture of light is displayed in real time via the adjustable RGBW front light such that a change in brightness is not apparent to the user as the screen color temperature remains the same.

9. A method of screen color temperature control using an RGBW front light, comprising:
receiving a signal corresponding to a brightness level from an ambient light sensor disposed in an electronic reading device;
receiving a signal corresponding to a current screen color temperature being displayed on a display screen of the electronic reading device; determine a transition rate which corresponds to a calculation of the rate at which a brightness level changes between a low ambient light preferred brightness level to a high ambient light preferred brightness level;
calculating a predetermined mixture of light based on the brightness level and the current screen color temperature, wherein the calculation allows the current screen color temperature to remain the same regardless of the brightness level;
displaying the predetermined mixture of light onto the display screen of the electronic reading device via an adjustable RGBW front light set a transition rate at which a brightness level of the display screen transitions between the low ambient light preferred brightness level and the high ambient light preferred brightness level as the ambient light changes and determine if a brightness level has changed, and automatically adjust the predetermined mixture of light to be displayed via the adjustable RGBW front light such that the screen color temperature does not change in response to the changing brightness level; and wherein the current screen color temperature automatically changes based on the time of day.

10. The method of claim 9, wherein the predetermined mixture of light changes in response to a change in the current screen color temperature.

11. The method of claim 9, wherein the predetermined mixture of light changes in response to a change in the brightness level.

12. The method of claim 11, wherein the current screen color temperature does not change in response to a change in the brightness level.

13. The method of claim 9, wherein the current screen color temperature includes 1500K to 6400K.

14. The method of claim 13, wherein each of the current screen color temperatures has corresponding RGBW values.

15. The method of claim 13, wherein each of the current screen color temperatures has corresponding RGBW values for each brightness level, wherein the brightness level includes 0% brightness to 100% brightness, such that every current screen color temperature has RGBW values for every brightness level.

16. The method of claim 9, wherein the predetermined mixture of light is displayed in real time via the adjustable RGBW front light such that a change in brightness is not apparent to the user as the screen color temperature remains the same.

* * * * *